(12) United States Patent
Inoue et al.

(10) Patent No.: US 8,941,130 B2
(45) Date of Patent: Jan. 27, 2015

(54) SEMICONDUCTOR LIGHT-EMITTING DEVICE

(71) Applicant: Panasonic Corporation, Osaka (JP)

(72) Inventors: Akira Inoue, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/058,869

(22) Filed: Oct. 21, 2013

(65) Prior Publication Data

US 2014/0042468 A1 Feb. 13, 2014

Related U.S. Application Data

(63) Continuation of application No. PCT/JP2013/003565, filed on Jun. 6, 2013.

(30) Foreign Application Priority Data

Aug. 10, 2012 (JP) ................................. 2012-177945

(51) Int. Cl.
*H01L 33/60* (2010.01)
*H01L 33/16* (2010.01)

(52) U.S. Cl.
CPC .............. *H01L 33/60* (2013.01); *H01L 33/16* (2013.01)
USPC .................................. 257/88; 257/98; 257/100

(58) Field of Classification Search
CPC .......... H01L 33/60; H01L 33/16; H01L 33/62
USPC .............. 257/88, 98, 100, E33.072, E33.055; 438/22, 29, 46
See application file for complete search history.

(56) References Cited

U.S. PATENT DOCUMENTS 7,429,759 B2 * 9/2008 Isokawa ......................... 257/100
2008/0258156 A1 10/2008 Hata
(Continued)

FOREIGN PATENT DOCUMENTS

JP  2005-150624 A  9/2005
JP  2008-109098 A  4/2008
(Continued)

OTHER PUBLICATIONS

International Search Report for corresponding International Application No. PCT/JP2013/003565, dated Aug. 10, 2012.
(Continued)

*Primary Examiner* — Fernando L Toledo
*Assistant Examiner* — Adam S Bowen
(74) *Attorney, Agent, or Firm* — Renner, Otto, Boisselle & Sklar, LLP

(57) ABSTRACT

A semiconductor light emitting device includes: a semiconductor chip having a growth surface that is a nonpolar or semipolar plane, and emitting polarized light; and a reflector having a reflective surface. At least part of light in a plane $L_{90}$ is reflected off the reflective surface in a direction of a normal line to the growth surface, and an amount of light reflected off the reflective surface in the plane $L_{90}$ in the direction of the normal line is larger than that of light reflected off the reflective surface on a plane $L_{45}$ in the direction of the normal line, where the plane $L_{90}$ represents a plane including the normal line and oriented at 90° to a polarization direction of the polarized light, and the plane $L_{45}$ represents a plane including the normal line, and oriented at 45° to the polarization direction of the polarized light.

20 Claims, 34 Drawing Sheets

(56) References Cited

U.S. PATENT DOCUMENTS

| | | |
|---|---|---|
| 2008/0283492 A1 | 11/2008 | Takemoto et al. |
| 2009/0050917 A1 | 2/2009 | Nakagawa et al. |
| 2009/0279278 A1 | 11/2009 | Tsujimura et al. |
| 2011/0211348 A1 | 9/2011 | Kim |
| 2013/0126900 A1 | 5/2013 | Inoue et al. |

FOREIGN PATENT DOCUMENTS

| | | |
|---|---|---|
| JP | 2009-038293 A | 2/2009 |
| JP | 2009-88353 A | 4/2009 |
| JP | 2009-123803 A | 6/2009 |
| JP | 2010-238837 A | 10/2010 |
| JP | 2011-077188 A | 4/2011 |

OTHER PUBLICATIONS

Written Opinion for corresponding International Application No. PCT/JP2013/003565, mailed Jul. 2, 2013.
Co-pending U.S. Appl. No. 14/058,903, filed Oct. 21, 2013.
English Translation of International Search Report for corresponding International Application No. PCT/JP2013/003565, mailed Jul. 2, 2013 (previously submitted on Oct. 21, 2013).

* cited by examiner

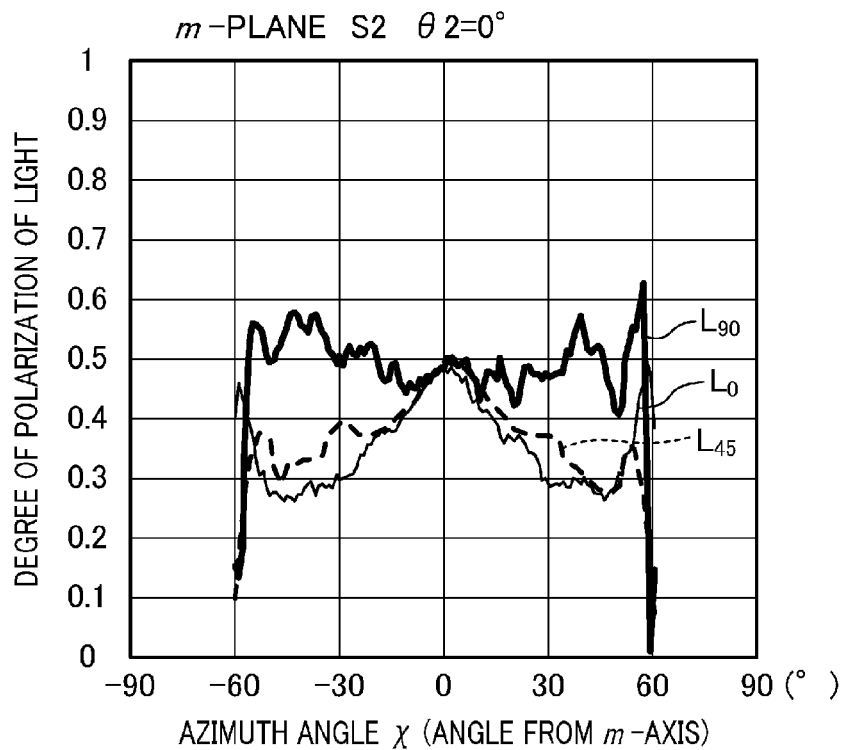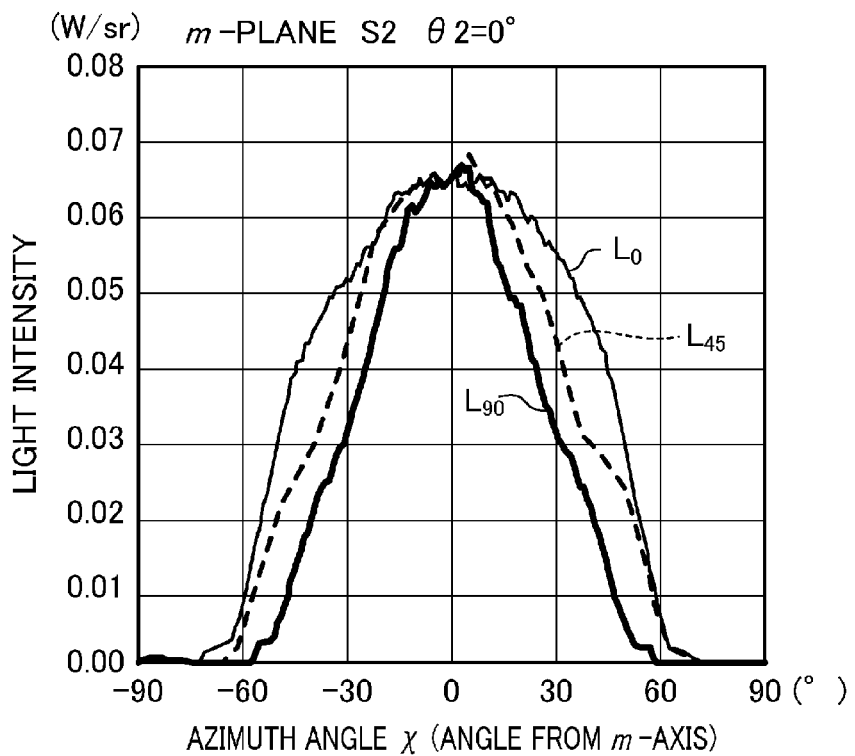

POLARIZATION DIRECTION OF LIGHT m-PLANE WITHOUT REFLECTOR m-PLANE WITHOUT REFLECTOR (20$\bar{2}$1) PLANE WITHOUT REFLECTOR (20$\bar{2}$1) PLANE WITHOUT REFLECTOR

SEMICONDUCTOR LIGHT-EMITTING DEVICE

CROSS-REFERENCE TO RELATED APPLICATIONS

This is a continuation of International Application No. PCT/JP2013/003565 filed on Jun. 6, 2013, which claims priority to Japanese Patent Application No. 2012-177945 filed on Aug. 10, 2012. The entire disclosures of these applications are incorporated by reference herein.

BACKGROUND

The present disclosure relates to semiconductor light-emitting devices each including a semiconductor light-emitting chip having a growth surface that is a nonpolar or semipolar plane, and emitting polarized light, and a reflection member having a reflective surface off which the polarized light is reflected.

Nitride semiconductors containing nitrogen (N) as a group V element have been expected as a material of a short wavelength light-emitting element because of their band gap size. Gallium nitride-based compound semiconductors, in particular, have been actively researched, and blue light-emitting diodes (LEDs), green LEDs, and blue semiconductor laser diodes that use a gallium nitride-based compound semiconductor have been also commercialized.

Gallium nitride-based compound semiconductors include a compound semiconductor obtained by substituting at least one of aluminum (Al) or indium (In) for part of gallium (Ga). Such a nitride semiconductor is represented by the general formula $Al_xGa_yIn_zN$ (where $0 \le x < 1$, $0 \le z < 1$, $0 < y \le 1$, and $x+y+z=1$). The gallium nitride-based compound semiconductors are hereinafter referred to as GaN-based semiconductors.

The replacement of Ga atoms with Al atoms in a GaN-based semiconductor allows the band gap of the GaN-based semiconductor to be wider than that of GaN, and the replacement of Ga atoms with In atoms in a GaN-based semiconductor allows the band gap of the GaN-based semiconductor to be narrower than that of GaN. Thus, not only short wavelength light, such as blue or green light, but also long wavelength light, such as orange or red light, can be emitted. From such a feature, nitride semiconductor light-emitting elements have been expected to be used for, e.g., image display devices and lighting devices.

Nitride semiconductors have a wurtzite crystal structure. In FIGS. 1A, 1B, and 1C, the plane orientations of the wurtzite crystal structure are expressed in four-index notation (hexagonal indices). In four-index notation, crystal planes and the orientations of the planes are expressed using primitive vectors expressed as $a_1$, $a_2$, $a_3$, and c. The primitive vector c extends in a [0001] direction, and an axis in this direction is referred to as a "c-axis." A plane perpendicular to the c-axis is referred to as a "c-plane" or a "(0001) plane." FIG. 1A illustrates, not only the c-plane, but also an a-plane (=(11-20) plane) and an m-plane (=(1-100) plane). FIG. 1B illustrates an r-plane (=(1-102) plane), and FIG. 1C illustrates a (11-22) plane. Herein, the symbol "-" attached to the left of one of parenthesized numbers indicating the Miller indices expediently indicates inversion of the number.

FIG. 2A illustrates a crystal structure of a GaN-based semiconductor using a ball-and-stick model. FIG. 2B is a ball-and-stick model obtained by observing atomic arrangement in the vicinity of the m-plane surface from an a-axis direction. The m-plane is perpendicular to the plane of the paper of FIG. 2B. FIG. 2C is a ball-and-stick model obtained by observing atomic arrangement of a +c-plane surface from an m-axis direction. The c-plane is perpendicular to the plane of the paper of FIG. 2C. As seen from FIGS. 2A and 2B, N atoms and Ga atoms are located on a plane parallel to the m-plane. On the other hand, as seen from FIGS. 2A and 2C, a layer in which only Ga atoms are located, and a layer in which only N atoms are located are formed on the c-plane.

Conventionally, when a semiconductor element is to be fabricated using a GaN-based semiconductor, a c-plane substrate, i.e., a substrate having a (0001) plane as its principal surface, has been used as a substrate on which a nitride semiconductor crystal is grown. In this case, spontaneous electrical polarization is induced in the nitride semiconductor along the c-axis due to the arrangements of Ga and N atoms. Thus, the "c-plane" is referred to as a "polar plane." As a result of the electrical polarization, a piezoelectric field is generated in a quantum well layer forming a portion of a light-emitting layer of a nitride semiconductor light-emitting element and made of InGaN along the c-axis. Due to the generated piezoelectric field, the distributed electrons and holes in the light-emitting layer are displaced, and the internal quantum efficiency of the light-emitting layer is decreased due to a quantum-confined Stark effect of carriers. In order to reduce the decrease in the internal quantum efficiency of the light-emitting layer, the light-emitting layer formed on the (0001) plane is designed to have a thickness equal to or less than 3 nm.

Furthermore, in recent years, consideration has been made to fabricate a light-emitting element using a substrate having an m- or a-plane called a nonpolar plane, or a -r- or (11-22) plane called a semipolar plane as its principal surface. As illustrated in FIG. 1A, m-planes of the wurtzite crystal structure are parallel to the c-axis, and are six equivalent planes orthogonal to the c-plane. For example, in FIG. 1A, a (1-100) plane perpendicular to a [1-100] direction corresponds to one of the m-planes. The other m-planes equivalent to the (1-100) plane include a (-1010) plane, a (10-10) plane, a (-1100) plane, a (01-10) plane, and a (0-110) plane.

As illustrated in FIGS. 2A and 2B, Ga and N atoms on the m-planes are present on the same atomic plane, and thus, electrical polarization is not induced in directions perpendicular to the m-planes. Therefore, when a light-emitting element is fabricated using a semiconductor layered structure having an m-plane as its growth surface, a piezoelectric field is not generated in a light-emitting layer, and the problem where the internal quantum efficiency is decreased due to the quantum-confined Stark effect of carriers can be solved. This applies also to the a-plane that is a nonpolar plane except the m-planes, and furthermore, even when, instead of the m-plane, the -r- or (11-22) plane called the semipolar plane is used as the growth surface, similar advantages can be provided.

A nitride semiconductor light-emitting element including an active layer having an m- or a-plane, or a -r- or (11-22) plane as a growth surface has polarization characteristics resulting from the structure of the valence band of the active layer.

For example, Japanese Unexamined Patent Publication No. 2008-109098 describes a light-emitting diode device including light-emitting diode chips 10 each including a light-emitting layer 12 having a principal plane 12a, and a package 20 having a chip-arrangement surface 21a on which the light-emitting diode chips 10 are arranged, and configured such that light emitted from the principal plane 12a of the light-emitting layer 12 has a plurality of different intensities depending on the in-plane azimuth angles of the light in the principal plane 12a of the light-emitting layer 12, and at least the light-emitting diode chips 10 or the package 20 reduce variations in the intensity of light exiting from the package 20 due to the differences among the in-plane azimuth angles of the light in the chip-arrangement surface 21a, in order to reduce the variations in the intensity of light exiting from the package due to the differences among the in-plane azimuth angles of the light in the chip-arrangement surface.

Japanese Unexamined Patent Publication No. 2009-38293 describes a light-emitting device configured such that, in order to prevent diffusion of polarized light, at least part of an inner surface of a mounting base on which a light-emitting element is mounted forms a specular surface.

Japanese Unexamined Patent Publication No. 2009-88353 describes a light-emitting device including a light-emitting element, and a package in order to provide a light-emitting device emitting polarized light with a high polarization ratio. The light-emitting element has a first end surface from which first polarized light is emitted, and a second end surface from which second polarized light is emitted. The package has a first inner wall surface that faces the first end surface and extends in parallel with the first end surface, and a second inner wall surface off which second polarized light is reflected toward the first inner wall surface.

SUMMARY

The conventional nitride semiconductor light-emitting device including an active layer having a nonpolar or semipolar plane as a growth surface has required more appropriate control over the luminous intensity distribution of outgoing light and the degree of polarization thereof.

It is therefore an object of the present disclosure to more appropriately control the luminous intensity distribution while maintaining the degree of polarization of light.

In order to solve the problem, a semiconductor light-emitting device according to an aspect of the present disclosure includes: a semiconductor light-emitting chip having a growth surface that is a nonpolar or semipolar plane, and emitting polarized light; and a reflection member having a reflective surface off which the polarized light is reflected. At least part of light in a plane $L_{90}$ is reflected off the reflective surface in a direction of a normal line to the growth surface of the semiconductor light-emitting chip, and an amount of light reflected off the reflective surface in the plane $L_{90}$ in the direction of the normal line to the growth surface of the semiconductor light-emitting chip is larger than an amount of light reflected off the reflective surface in a plane $L_{45}$ in the direction of the normal line to the growth surface of the semiconductor light-emitting chip, where the plane $L_{90}$ represents a plane including the normal line to the growth surface and oriented at an angle of 90° to a polarization direction of the polarized light, and the plane $L_{45}$ represents a plane including the normal line, and oriented at an angle of 45° to the polarization direction of the polarized light.

According to the semiconductor light-emitting device of the present disclosure, the luminous intensity distribution and the degree of polarization of light can be more appropriately controlled. The light distribution angle, in particular, can be controlled, and the degree of polarization of light, in particular, can be maintained.

BRIEF DESCRIPTION OF THE DRAWINGS

FIG. 32A is a graph illustrating the degree of polarization of light from the semiconductor light-emitting device including the rectangular reflector S2 in which the angle θ2 is 0°. FIG. 32B is a graph illustrating the luminous intensity distribution of the semiconductor light-emitting device including the rectangular reflector S2 in which the angle θ2 is 0°.

DETAILED DESCRIPTION

Figure 1A:
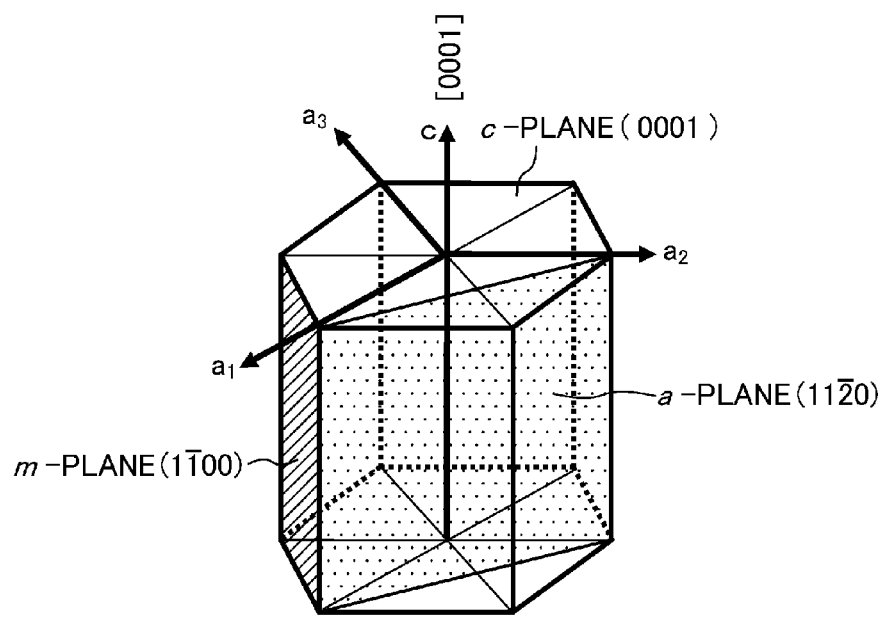
FIG. 1A is a perspective view illustrating primitive vectors $a_1$, $a_2$, $a_3$, and c, and a-, c-, and m-planes of a wurtzite crystal structure.
Figure 1B:
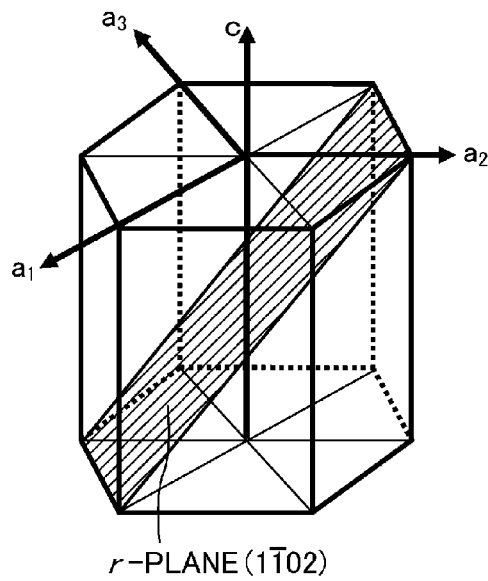
FIG. 1B is a perspective view illustrating an r-plane of the wurtzite crystal structure.
Figure 1C:
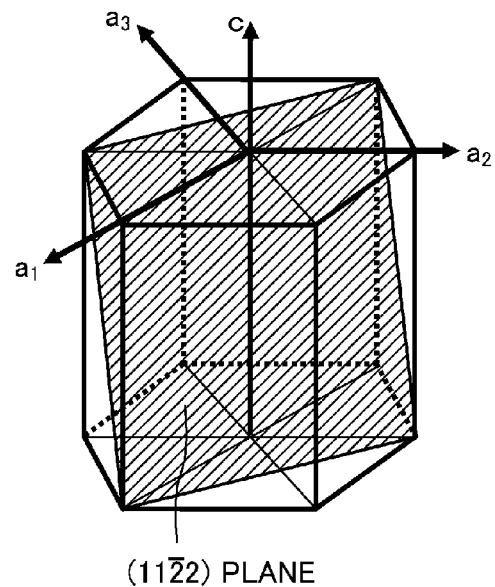
FIG. 1C is a perspective view illustrating a (11-22) plane of the wurtzite crystal structure.
Figure 2A:
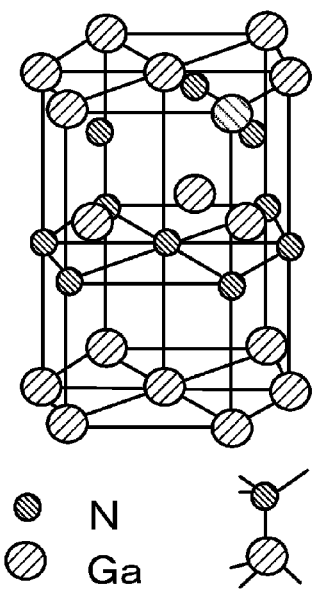
FIGS. 2A-2C illustrate a crystal structure of a GaN-based semiconductor using a ball-and-stick model.
Figure 2B:
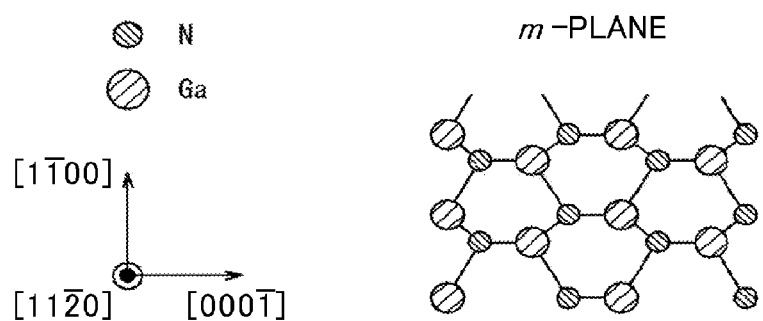
Figure 2C:
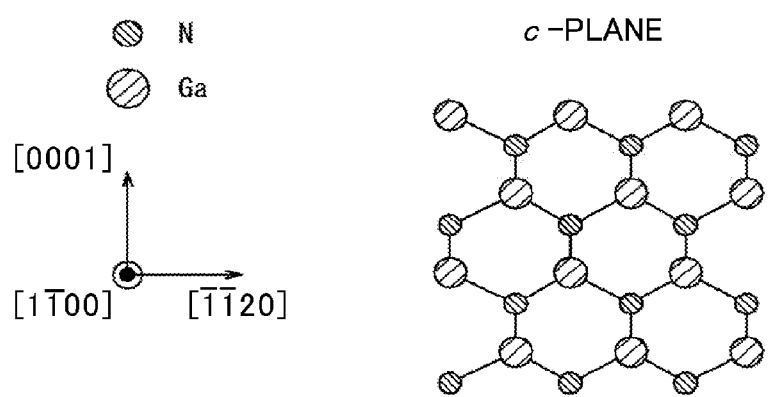

A semiconductor light-emitting device according to an embodiment of the present disclosure includes: a semiconductor light-emitting chip having a growth surface that is a nonpolar or semipolar plane, and emitting polarized light; and a reflection member having a reflective surface off which the polarized light is reflected. At least part of light in a plane $L_{90}$ is reflected off the reflective surface in a direction of a normal line to the growth surface of the semiconductor light-emitting chip, and an amount of light reflected off the reflective surface in the plane $L_{90}$ in the direction of the normal line to the growth surface of the semiconductor light-emitting chip is larger than an amount of light reflected off the reflective surface in a plane $L_{45}$ in the direction of the normal line to the growth surface of the semiconductor light-emitting chip, where the plane $L_{90}$ represents a plane including the normal line to the growth surface and oriented at an angle of 90° to a polarization direction of the polarized light, and the plane $L_{45}$ represents a plane including the normal line, and oriented at an angle of 45° to the polarization direction of the polarized light.

In an embodiment, an arithmetic average inclination angle $\Delta\theta 1z$ may be larger than an arithmetic average inclination angle $\Delta\theta 1y$, where the arithmetic average inclination angle $\Delta\theta 1y$ represents an angle between the reflective surface and the direction of the normal line to the growth surface of the semiconductor light-emitting chip when viewed in cross section taken along the plane $L_{90}$, and the arithmetic average inclination angle $\Delta\theta 1z$ represents an angle between the reflective surface and the direction of the normal line to the growth surface of the semiconductor light-emitting chip when viewed in cross section taken along the plane $L_{45}$.

In this case, the arithmetic average inclination angle $\Delta\theta 1y$ may be not less than 20° and not more than 40°.

In this case, the arithmetic average inclination angle $\Delta\theta 1y$ may be not less than 25° and not more than 40°.

In an embodiment, Ry may be higher than Rz, where Ry represents a reflectivity of a region of the reflective surface intersecting the plane $L_{90}$, and Rz represents a reflectivity of a region of the reflective surface intersecting the plane $L_{45}$.

In an embodiment, Rz_d may be higher than Ry_d, where Ry_d represents a diffuse reflectivity of a region of the reflective surface intersecting the plane $L_{90}$, and Rz_d represents a diffuse reflectivity of a region of the reflective surface intersecting the plane $L_{45}$.

The semiconductor light-emitting device according to the embodiment may further include a light-transmissive member covering the semiconductor light-emitting chip, and a region of the light-transmissive member intersecting the plane $L_{45}$ may be made of a material having a higher diffuse transmittance than a region of the light-transmissive member intersecting the plane $L_{90}$.

In an embodiment, the reflection member may have a plurality of reflective surfaces, which are arranged such that a shape formed by the reflective surfaces when viewed in plan is square, and θ2 may be either not less than 0° and not more than 10° or not less than 80° and not more than 90°, where θ2 represents an angle between the polarization direction of the polarized light and a side of the shape formed by the reflective surfaces when viewed in plan.

In an embodiment, the reflection member may have a plurality of reflective surfaces, which are arranged such that a shape formed by the reflective surfaces when viewed in plan is rectangular, and θ2 may be not less than 0° and not more than 10° or not less than 85° and not more than 90°, where θ2 represents an angle between the polarization direction of the polarized light and a long side of the shape formed by the reflective surfaces when viewed in plan.

In this case, corner portions of the shape formed by the reflective surfaces when viewed in plan may have a curved surface, and a curvature R of the curved surface is less than a length of each of sides of the semiconductor light-emitting chip.

In an embodiment, the semiconductor light-emitting chip may include at least two semiconductor light-emitting chips, and the at least two semiconductor light-emitting chips may be arranged such that directions of polarization of light from the at least two semiconductor light-emitting chips are identical.

In an embodiment, the semiconductor light-emitting chip may include at least four semiconductor light-emitting chips, the at least four semiconductor light-emitting chips may be arranged in a matrix such that directions of polarization of light from the at least four semiconductor light-emitting chips are identical, and D2 may be less than D1, where D1 represents a distance between adjacent two of the at least four semiconductor light-emitting chips arranged in a direction perpendicular to the directions of polarization of the light, and D2 represents a distance between adjacent two of the at least four semiconductor light-emitting chips arranged in a direction parallel to the directions of polarization of the light.

The semiconductor light-emitting device according to the embodiment may further include: a wavelength conversion member covering the semiconductor light-emitting chip.

In an embodiment, a linear reflectivity of the reflective surface may be higher than a diffuse reflectivity of the reflective surface.

In an embodiment, a surface roughness of the reflective surface may be not more than 100 nm.

Incidentally, a nitride semiconductor active layer having an m-plane as a growth surface emits light having a high electric field intensity principally along the a-axis. When a light-emitting element emits polarized light, it is theoretically predicted that the light emitted from the light-emitting element will exhibit the luminous intensity distribution where the intensity of the emitted light increases in a direction perpendicular to the polarization direction of the light. In other words, the light emitted from the light-emitting element exhibits an uneven radiation pattern (luminous intensity distribution). Furthermore, it is theoretically predicted that light having a high electric field intensity along a specific crystal direction of a nitride semiconductor will be emitted also from each of semipolar planes, such as -r-, (20-21), (20-2-1), (10-1-3), and (11-22) planes, and other nonpolar planes, such as a-planes, and the emitted light will exhibit the luminous intensity distribution where the intensity of the emitted light increases in a direction perpendicular to the polarization direction of the light.

The polarization direction of light from a nitride semiconductor active layer having an a-plane as a growth surface has been known to be along the m-axis. Therefore, it is predicted that the light will exhibit the luminous intensity distribution where the intensity of the emitted light increases in a direction perpendicular to the m-axis.

The polarization direction of light from a nitride semiconductor active layer having a (20-2-1) or (20-21) plane that is a semipolar plane as a growth surface has been known to correspond to the [-12-10] direction. Therefore, it is predicted that the light will exhibit the luminous intensity distribution where the intensity of the emitted light increases in a direction perpendicular to the [-12-10] direction.

When the In content of a nitride semiconductor active layer having a (10-1-3) plane that is a semipolar plane as a growth surface is high, the polarization direction of light from the nitride semiconductor active layer has been known to correspond to the [-12-10] direction, and when the In content of the nitride semiconductor active layer is low, the polarization direction of the light has been known to correspond to the [11-23] direction. Therefore, it is predicted that the light will exhibit the luminous intensity distribution where when the In content of the active layer is high, the intensity of the emitted light increases in a direction perpendicular to the [-12-10] direction, and when the In content of the active layer is low, the intensity of the emitted light increases in a direction perpendicular to the [11-23] direction.

When the In content of a nitride semiconductor active layer having a (11-22) plane that is a semipolar plane as a growth surface is high, the polarization direction of light from the nitride semiconductor active layer has been known to be along the m-axis, and when the In content of the nitride semiconductor active layer is low, the polarization direction of the light has been known to correspond to the [-1-123] direction. Therefore, it is predicted that the light will exhibit the intensity distribution where when the In content of the active layer is high, the intensity of the emitted light increases in a direction perpendicular to the m-axis, and when the In content of the active layer is low, the intensity of the emitted light increases in a direction perpendicular to the [-1-123] direction.

Light having a high electric field intensity along a specific direction is herein referred to as "polarized light." For example, light having a high electric field intensity along an X-axis is referred to as "polarized light along the X-axis," and in this case, a direction along the X-axis is referred to as a "polarization direction." The "polarized light along the X-axis" does not mean only linearly polarized light along the X-axis, and may include linearly polarized light along other axes. More specifically, the "polarized light along the X-axis" means light including a light component that transmits through a "polarizer having a polarization transmission axis along the X-axis" and has higher intensity (electric field intensity) than a light component transmitting through a "polarizer having a polarization transmission axis along another axis." Therefore, the "polarized light along the X-axis" includes incoherent light including not only linearly polarized light and elliptically polarized light along the X-axis, but also linearly polarized light and elliptically polarized light in various directions.

When the polarization transmission axis of a polarizer is rotated about the optical axis, the degree of polarization of light is defined by the following expression (A):

$$\text{Degree of Polarization} = |I\text{max} - I\text{min}|/|I\text{max} + I\text{min}| \quad (A)$$

where Imax is the highest electric field intensity of light transmitting through the polarizer, and Imin is the lowest electric field intensity thereof.

When the polarization transmission axis of the polarizer is parallel to the X-axis, the electric field intensity of "light polarized along the X-axis" and transmitting through the polarizer is Imax, and when the polarization transmission axis of the polarizer is parallel to the Y-axis, the electric field intensity of the light is Imin. The electric field intensity Imin of completely linearly polarized light is equal to 0, and thus, the degree of polarization is equal to one. By contrast, the difference between the electric field intensity Imax of completely depolarized light and the electric field intensity Imin thereof is equal to zero, and thus, the degree of polarization is equal to zero.

A nitride semiconductor light-emitting element including an active layer having an m-plane as a growth surface emits polarized light principally along the a-axis as described above. In this case, the nitride semiconductor light-emitting element emits also polarized light along the c-axis and polarized light along the m-axis. However, the intensity of each of the polarized light along the c-axis and the polarized light along the m-axis is lower than that of the polarized light along the a-axis.

Herein, an active layer having an m-plane as a growth surface is used as an example, and attention is focused on polarized light along the a-axis. However, also when a semipolar plane, such as a -r-, (20-21), (20-2-1), (10-1-3), or (11-22) plane, or another nonpolar plane, such as an a-plane, is used as the growth surface, similar statements apply to polarized light in a specific crystal direction.

Herein, "m-planes" include not only planes completely parallel to the m-planes, but also planes inclined at an angle of about ±5° or less from the m-planes. The "m-planes" herein also include step-like surfaces each including a plurality of m-plane regions parallel to the m-planes. Planes inclined slightly from the m-planes are much less affected by spontaneous electrical polarization. Furthermore, the planes inclined slightly from the m-planes microscopically have properties similar to those of step-like surfaces including many m-plane regions that are not inclined from the m-planes. In addition, in some cases, in a crystal growth technique, a semiconductor layer is more easily epitaxially grown on a substrate having a crystal orientation inclined slightly from a desired orientation than on a substrate having a crystal orientation exactly identical with the desired orientation. Therefore, it may be useful to slightly incline a crystal plane in order to improve the crystal quality of the semiconductor layer to be epitaxially grown or increase the crystal growth rate of the semiconductor layer while reducing the influence of spontaneous electrical polarization to a sufficient level.

Similar statements apply to "a-planes," "(20-21) planes," "(20-2-1) planes," "(10-1-3) planes," "-r-planes," and "(11-22) planes," and thus, the "a-planes," the "(20-21) planes," the "(20-2-1) planes," the "(10-1-3) planes," the "-r-planes," and the "(11-22) planes" herein each include not only planes completely parallel to corresponding ones of the "a-planes," the "(20-21) planes," the "(20-2-1) planes," the "(10-1-3) planes," the "-r-planes," and the "(11-22) planes," but also planes inclined at an angle of about ±5° or less from the corresponding ones of the "a-planes," the "(20-21) planes," the "(20-2-1) planes," the "(10-1-3) planes," the "-r-planes," and the "(11-22) planes."

A nitride semiconductor light-emitting device includes a semiconductor light-emitting chip made of a nitride semiconductor, and a reflector. The reflector may be referred to as a cavity. The nitride semiconductor light-emitting device is placed on a mounting substrate. The mounting substrate may be referred to as a package. A surface of the mounting substrate on which the semiconductor light-emitting chip is held is referred to as a mounting surface. The reflector has a reflective surface configured to change the direction of light emitted from the semiconductor light-emitting chip.

Conventionally, the azimuth angle dependence of the luminous intensity distribution of a semiconductor light-emitting chip emitting polarized light and the azimuth angle dependence of the degree of polarization of light from the semiconductor light-emitting chip have not been examined to an adequate degree; therefore, the influence of a reflective surface of a reflector on the luminous intensity distribution and the degree of polarization of light has not been revealed.

Japanese Unexamined Patent Publication No. 2008-109098 describes a method for placing a semiconductor light-emitting chip, and the shape of each of a mounting surface and a reflector surface, in order to reduce the asymmetry of the luminous intensity distribution. However, no consideration has been given to the degree of polarization of light.

Japanese Unexamined Patent Publication No. 2009-38293 describes a reflector having a reflective surface serving as a specular surface, in order to maintain the degree of polarization of light. However, no consideration has been given to the luminous intensity distribution.

Japanese Unexamined Patent Publication No. 2009-88353 describes a reflector structure configured to allow the polarization direction of light emitted from a second end surface of a nitride semiconductor light-emitting chip to be identical with the polarization direction of light emitted from a first end surface thereof, in order to increase the degree of polarization of light. However, no consideration has been given to the luminous intensity distribution.

<Degree of Polarization of Light From Semiconductor Light Emitting Chip Emitting Polarized Light And Luminous Intensity Distribution of Semiconductor Light Emitting Chip>

Prior to description of embodiments, the degree of polarization of light from a semiconductor light-emitting chip emitting polarized light and the luminous intensity distribution of the semiconductor light-emitting chip will be described.

First, definitions of directions of light emitted from a semiconductor light-emitting chip 100 made of a nitride semiconductor, and a method for measuring the luminous intensity distribution and the degree of polarization of the light will be described with reference to FIGS. 3A-3D. First, the direction perpendicular to an m-plane that is a growth surface of an active layer of the semiconductor light-emitting chip 100 corresponds to a Z-axis, the polarization direction of light emitted from the active layer corresponds to an X-axis, and the direction perpendicular to both the Z-axis and the X-axis corresponds to a Y-axis. The Z-axis is referred to also as the normal line direction. When the growth surface of the active layer is an m-plane, the Z-axis corresponds to the m-axis, the X-axis corresponds to the a-axis, and the Y-axis corresponds to the c-axis.

A plane L perpendicularly intersecting the active layer 106 is defined. The angle between the plane L and the polarization direction of light, i.e., the X-axis, is defined as $\phi$, and when the angle $\phi$ is a specific value $\phi 1$ (unit: degree [°]), the plane L is defined as a plane $L_{\phi 1}$. Furthermore, in the plane $L_{\phi 1}$, the angle between the Z-axis (the normal line direction) and emitted light is defined as an azimuth angle $\chi$. A plane used to measure the luminous intensity distribution is defined by the plane $L_{\phi 1}$, and the azimuth angle within which the luminous intensity distribution is measured is defined by the azimuth angle $\chi$. A cross-sectional view taken along the plane $L_{\phi 1}$ is referred to as the "cross-sectional view along the plane $L_{\phi 1}$."

Figure 3A:
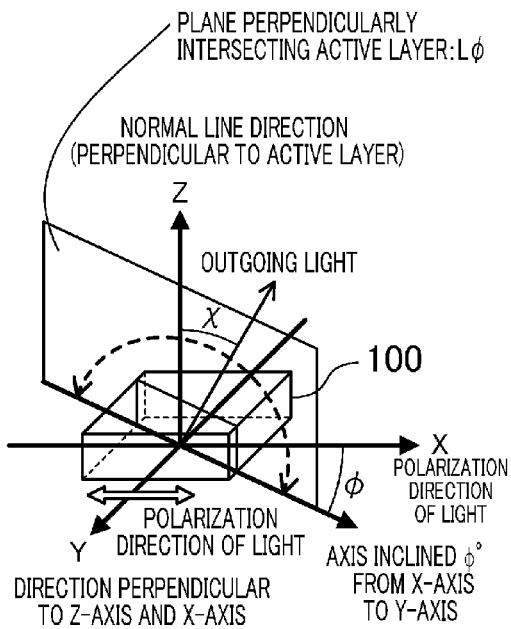
FIG. 3A is a perspective view illustrating the relationship among the polarization direction of light from a semiconductor light-emitting chip, a measurement plane L, and the azimuth angle χ of the light in connection with measurement of the degree of polarization of the light and the luminous intensity distribution.
Figure 3B:
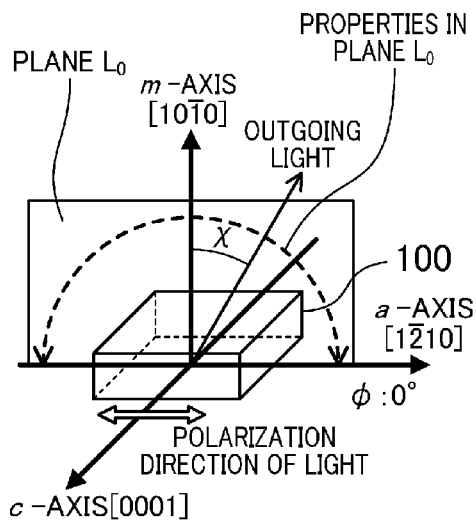
FIG. 3B is a perspective view illustrating the relationship among the polarization direction of light in a plane $L_0$, the measurement plane L, and the azimuth angle χ of the light, where the normal line to a growth surface of the semiconductor light-emitting chip is along the m-axis.
Figure 3C:
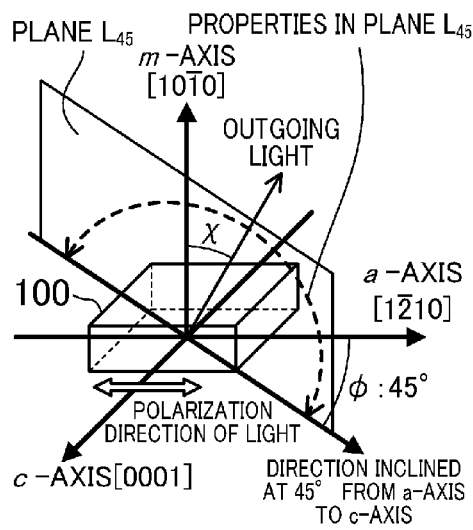
FIG. 3C is a perspective view illustrating the relationship among the polarization direction of light in a plane $L_{45}$, the measurement plane L, and the azimuth angle χ of the light, where the normal line is along the m-axis.
Figure 3D:
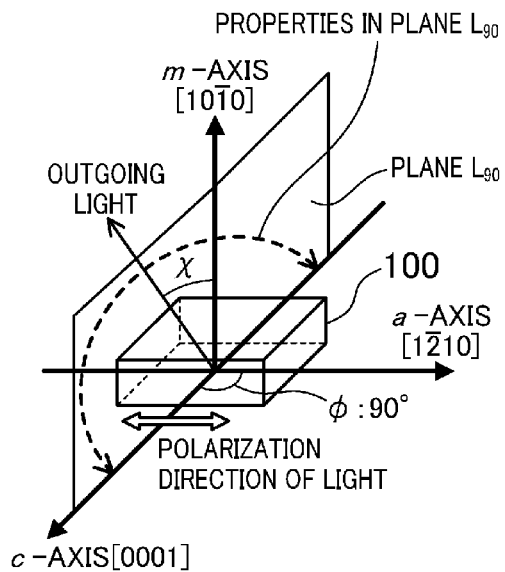
FIG. 3D is a perspective view illustrating the relationship among the polarization direction of light in a plane $L_{90}$, the measurement plane L, and the azimuth angle χ of the light, where the normal line is along the m-axis.

FIGS. 3B, 3C, and 3D illustrate specific examples in each of which the growth surface of the active layer is an m-plane.

FIG. 3B illustrates measurement axes along which the luminous intensity distribution in a plane $L_0$ and the degree of polarization of light therein are measured, where the growth surface of the active layer is an m-plane. In this case, the plane $L_0$ corresponds to the plane defined by the m-axis and the a-axis.

FIG. 3C illustrates measurement axes along which the luminous intensity distribution in a plane $L_{45}$ and the degree of polarization of light therein are measured, where the growth surface of the active layer is an m-plane. In this case, the plane $L_{45}$ includes the m-axis, and corresponds to a plane inclined at an angle of 45° from the a-axis.

FIG. 3D illustrates a measurement axis along which the luminous intensity distribution in a plane $L_{90}$ and the degree of polarization of light therein are measured when the growth surface of the active layer is an m-plane. In this case, the plane $L_{90}$ corresponds to the plane defined by the m-axis and the c-axis.

The luminous intensity distribution of the semiconductor light-emitting chip 100 including the active layer emitting polarized light and the profile indicating the degree of polarization of light emitted from the semiconductor light-emitting chip 100 vary among the measurement planes, i.e., the plane $L_0$, the plane $L_{45}$, and the plane $L_{90}$. This phenomenon will be described in detail in comparative examples described below.

The luminous intensity distribution in the plane $L_{45}$ is similar to that in the plane $L_{90}$, and when the azimuth angle $\chi$ is in the range from −80° to −10° or the range from 10° to 80°, the light intensity is much higher than when the azimuth angle $\chi$ is equal to 0°, i.e., the intensity of light emitted along the normal line direction. The term "high light intensity" is synonymous with the term "a large amount of light" herein.

When the azimuth angle $\chi$ is in the range from −80° to +80°, the intensity of light in the plane $L_{90}$ is high, and a high degree of polarization of light in the plane $L_{90}$ is maintained. When the azimuth angle $\chi$ is 0°, the degree of polarization of light in the plane $L_0$ is highest, and when the absolute value of the azimuth angle $\chi$ is greater than 80, the degree of polarization of the light gently decreases. Similarly to the degree of polarization of the light in the plane $L_0$, when the azimuth angle $\chi$ is 0°, the degree of polarization of light in the plane $L_{45}$ is highest. However, when the absolute value of the azimuth angle $\chi$ is greater than 80, the degree of polarization of light in the plane $L_{45}$ significantly decreases, and when the azimuth angle $\chi$ is in the range from −40° to 40°, the degree of polarization of the light therein is reduced to substantially one half or less of that obtained when the azimuth angle $\chi$ is equal to 0°. Furthermore, when the azimuth angle $\chi$ is −50° or less and 50° or more, the degree of polarization of light in the plane $L_{45}$ is reduced to substantially one third or less of that obtained when the azimuth angle $\chi$ is equal to 0°. The azimuth angle dependence of each of the luminous intensity distribution and the degree of polarization of light has not been known.

The present inventors arrived at the following embodiments based on new characteristics, i.e., the azimuth angle dependence of each of the luminous intensity distribution and the degree of polarization of light. Specifically, the present inventors focused attention on the following properties: the intensity of light emitted in the plane $L_{90}$ to have an azimuth angle $\chi$ within the range from −80° to 80° is high, and the degree of polarization of the light is high; and the intensity of light emitted in the plane $L_{45}$ to have an azimuth angle $\chi$ within the range from −80° to −40° or within the range from 40° to 80° is extremely high, and the degree of polarization of the light is low.

Specifically, when light emitted in the plane $L_{90}$ to have an azimuth angle $\chi$ within the range from −80° to 80° is concentrated in the normal line direction, the degree of polarization of the light in the normal line direction can be maintained. Furthermore, when light emitted in the plane $L_{45}$ to have an azimuth angle $\chi$ within the range from −80° to −40° or within the range from 40° to 80° is not concentrated in the normal line direction, the rate of reduction in the degree of polarization of the light in the normal line direction can be decreased.

First Embodiment

A semiconductor light-emitting device according to a first embodiment of the present disclosure will be described with reference to FIGS. 4A-4C.

Figure 4A:
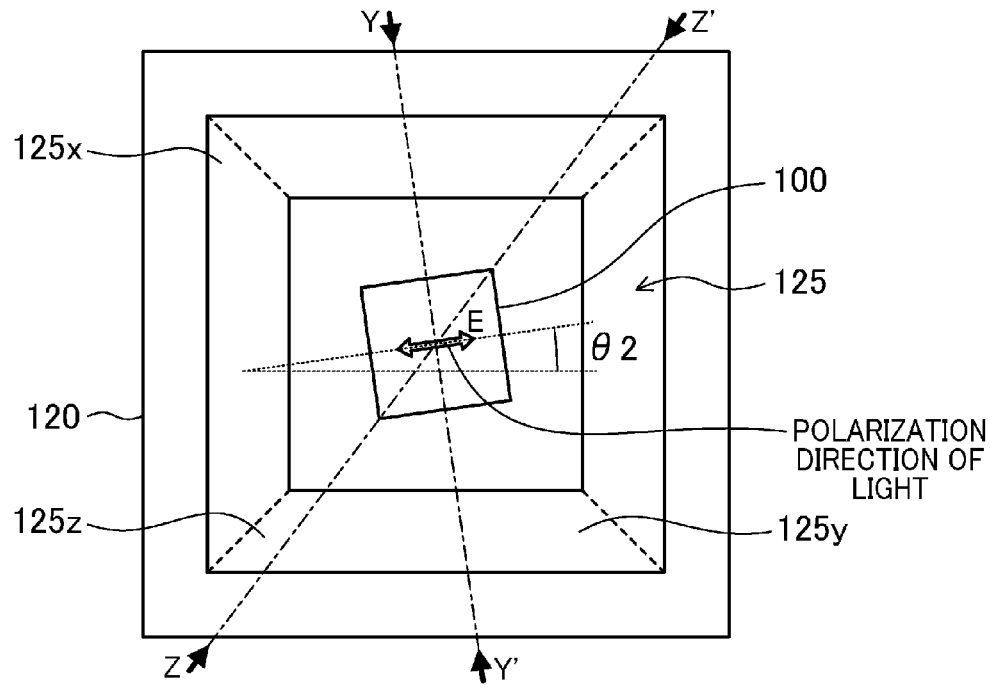
FIG. 4A is a schematic plan view illustrating a semiconductor light-emitting device according to a first embodiment.

FIG. 4A illustrates the configuration of a semiconductor light-emitting device according to the first embodiment when viewed in plan. FIG. 4B illustrates a cross-sectional configuration taken along the line Y-Y'. A cross section taken along the line Y-Y' corresponds to the plane $L_{90}$. FIG. 4C illustrates a cross-sectional configuration taken along the line Z-Z'. A cross section taken along the line Z-Z' corresponds to the plane $L_{45}$. The semiconductor light-emitting device according to this embodiment includes a mounting substrate 101, a semiconductor light-emitting chip 100 mounted on the mounting substrate 101 and emitting polarized light, a reflector 120 that is a reflection member having reflective surfaces surrounding the semiconductor light-emitting chip 100, and a light-transmissive member 121 covering the semiconductor light-emitting chip 100 and filling the interior of the reflector 120. The reflector 120 has a plurality of reflective surfaces 125 (125*x*, 125*y*, and 125*z*) off which light emitted from the semiconductor light-emitting chip 100 is reflected. The reflective surfaces 125 are arranged such that a shape formed by the reflective surfaces 125 when viewed in plan is square. The angle θ2 can be not less than 0° and not more than 10°, where θ2 represents the angle formed between a side of the square formed by the reflective surfaces 125 and the polarization direction of light from the semiconductor light-emitting chip 100.

Here, note that two of the reflective surfaces 125 of the reflector 120 intersecting the plane $L_0$ are reflective surfaces 125*x*, and two of them intersecting the plane $L_{90}$ are reflective surfaces 125*y*. Furthermore, note that two of the reflective surfaces 125 intersecting the plane $L_{45}$ are reflective surfaces 125*z*. The reflective surfaces 125*z* are identical with the reflective surfaces 125*y* or 125*x*. Furthermore, note that θ1x represents the angle between each of the reflective surfaces 125*x* and the direction of the normal line to an active layer, and θ1y represents the angle between each of the reflective surfaces 125*y* and the direction of the normal line to the active layer. Note that θ1z represents the angle between each of the reflective surfaces 125*z* and the direction of the normal line to the active layer, in particular, when viewed in cross section taken along the line Z-Z' (taken along the plane $L_{45}$). As long as the angle θ2 is not less than 0° and not more than 10°, the degree of polarization of light is kept high.

Figure 4B:
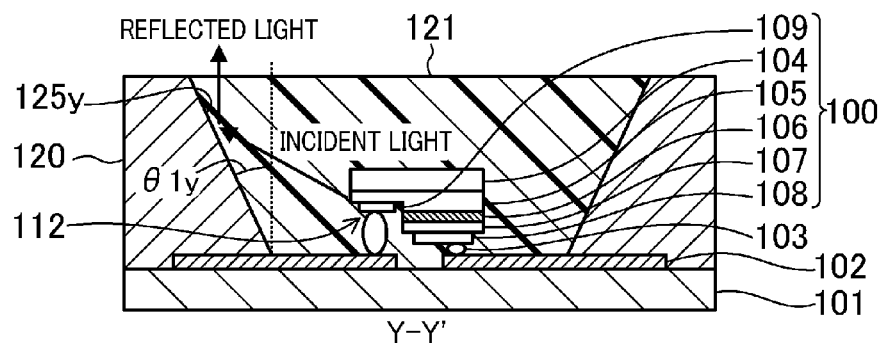
FIG. 4B is a cross-sectional view taken along the line Y-Y' in FIG. 4A.
Figure 4C:
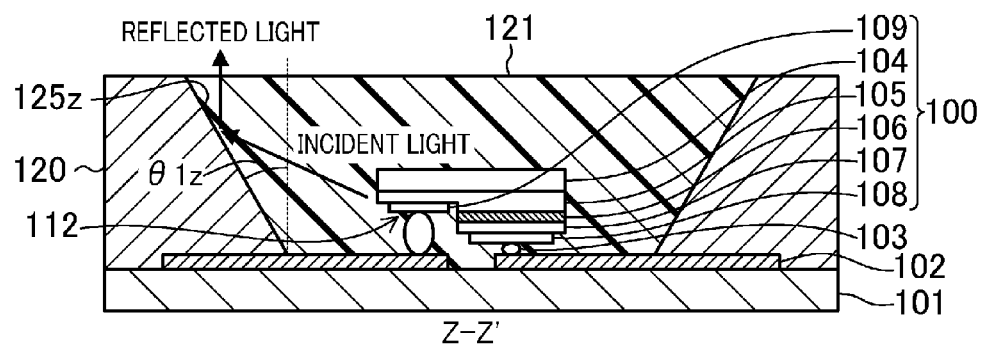
FIG. 4C is a cross-sectional view taken along the line Z-Z' in FIG. 4A.

As illustrated in FIGS. 4B and 4C, the nitride semiconductor light-emitting chip 100 includes a substrate 104 having a GaN layer having an m-plane as the principal surface and the growth surface (hereinafter referred to as the m-plane GaN layer), an n-type nitride semiconductor layer 105 formed on the principal surface of the GaN layer of the substrate 104, an active layer 106 formed on the n-type nitride semiconductor layer 105 and made of a nitride semiconductor, a p-type nitride semiconductor layer 107 formed on the active layer 106, a p-side electrode 108 formed on and in contact with the p-type nitride semiconductor layer 107, and an n-side electrode 109 formed on and in contact with an exposed region of the n-type nitride semiconductor layer 105. The active layer 106 has a nonpolar or semipolar plane as the growth surface, and emits polarized light. In this embodiment, a light-emitting diode (LED) chip can be used as the semiconductor light-emitting chip 100. Similar statements apply to the following variations and other embodiments.

The growth surface of each of the n-type nitride semiconductor layer 105, the active layer 106, and the p-type nitride semiconductor layer 107 is substantially parallel to m-planes. In other words, the layers 105, 106, and 107 are stacked along the m-axis. Another layer may be formed between the n-type nitride semiconductor layer 105 and the active layer 106. Furthermore, another layer may be formed between the active layer 106 and the p-type nitride semiconductor layer 107. Here, a GaN-based semiconductor will be described as an example nitride semiconductor. The GaN-based semiconductor includes a semiconductor represented by the general expression $Al_xIn_yGa_zN$ (where 0≤x<1, 0≤y<1, 0<z≤1, and x+y+z=1).

The semiconductor light-emitting chip 100 is mounted such that its p-side electrode 108 and its n-side electrode 109 each face a corresponding one of interconnect electrodes 102 placed on a surface of the mounting substrate 101. Specifically, the semiconductor light-emitting chip 100 is electrically connected through bumps 103 to the interconnect electrodes 102 on the mounting substrate 101, and is held on the interconnect electrodes 102 with the bumps 103 interposed therebetween. Such a structure is referred to as the flip-chip structure. One of the interconnect electrodes 102 is connected to the p-side electrode 108, and the other one thereof is connected to the n-side electrode 109. An insulative material, such as alumina (aluminum oxide), aluminum nitride (AlN), or a glass epoxy resin, a metal material containing, e.g., aluminum (Al), copper (Cu), or tungsten (W), a semiconductor material, such as silicon (Si) or germanium (Ge), or a composite of the materials can be used as the principal material forming the mounting substrate 101. Metal, such as aluminum (Al), silver (Ag), gold (Au), or copper (Cu), can be used as a material of the interconnect electrodes 102.

The substrate 104 may be made of only a GaN layer, or may include a layer except a GaN layer. The layer except the GaN layer may be an m-plane GaN substrate, an m-plane SiC substrate, an r-plane sapphire substrate, an m-plane sapphire substrate, or an a-plane sapphire substrate. Furthermore, the substrate 104 may be removed.

The n-type nitride semiconductor layer 105 is made of, e.g., n-type $Al_uGa_vIn_wN$ (where 0≤u≤1, 0≤v≤1, 0≤w≤1, and u+v+w=1). For example, silicon (Si) can be used as an n-type dopant.

The active layer 106 includes a plurality of barrier layers made of $In_YGa_{1-Y}N$ (where 0≤Y<1), and at least one well layer vertically interposed between an adjacent pair of the barrier layers and made of $In_xGa_{1-x}N$ (where 0<X≤1). The well layer included in the active layer 106 may be a single layer. Alternatively, the active layer 106 may have a multiple quantum well (MQW) structure in which well layers and barrier layers are alternately stacked. The wavelength of light emitted from the semiconductor light-emitting chip 100 depends on the In content ratio x of an $In_xGa_{1-x}N$ semiconductor that is a semiconductor composition of the well layer.

The p-type nitride semiconductor layer 107 is made of, e.g., a p-type $Al_sGa_tN$ (where 0≤s≤1, 0≤t≤1, and s+t=1) semiconductor. For example, magnesium (Mg) can be used as a p-type dopant. As the p-type dopant, instead of Mg, zinc (Zn) or beryllium (Be), for example, may be used. The Al content ratio s of the p-type nitride semiconductor layer 107 may be uniform along the thickness thereof, or may vary along the thickness thereof in a continuous or stepwise manner. The thickness of the p-type nitride semiconductor layer 107 is, e.g., about 0.05-2 μm. The Al content ratio s of a portion of the p-type nitride semiconductor layer 107 near an upper surface thereof, i.e., a portion thereof near the interface between the p-type nitride semiconductor layer 107 and the p-side electrode 108, may be zero. In other words, the portion of the p-type nitride semiconductor layer 107 near the upper surface thereof may be a GaN layer. In this case, the GaN layer may contain a high concentration of p-type impurities, and may function as a contact layer with the p-side electrode 108.

The p-side electrode 108 may cover substantially the entire surface of the p-type nitride semiconductor layer 107. The p-side electrode 108 is made of, e.g., a layered structure (Pd/Pt) in which a palladium (Pd) layer and a platinum (Pt) layer are stacked. In order to increase the reflectivity of emitted light, a layered structure (Ag/Pt) in which a silver (Ag) layer and a platinum (Pt) layer are stacked, or a layered structure (Pd/Ag/Pt) in which a Pd layer, an Ag layer, and a Pt layer are sequentially stacked may be used as the p-side electrode 108.

The n-side electrode 109 is made of, e.g., a layered structure (Ti/Pt) in which a titanium (Ti) layer and a platinum (Pt) layer are stacked. In order to increase the reflectivity of emitted light, a layered structure (Ti/Al/Pt) in which a Ti layer, an Al layer, and a Pt layer are sequentially stacked may be used.

The semiconductor light-emitting chip 100 is one of pieces into which a wafer including stacked semiconductor layers is singulated along the a- and c-axes and which are square or rectangular when viewed in plan. In this case, a c-plane of a nitride semiconductor is easily cleaved, and thus, a singulation process step can be simplified. Alternatively, the semiconductor light-emitting chip 100 may be one of pieces into which the wafer is singulated along directions inclined at an angle not less than 0° and not more than 45° from the a- and c-axes. In this case, planes that are difficult to be cleaved are exposed on the side surfaces of the semiconductor light-emitting chip 100. This exposure tends to cause the side surfaces of the semiconductor light-emitting chip 100 to be uneven. The uneven surfaces improve the light extraction efficiency at which emitted light is extracted from the uneven surfaces.

An epoxy resin or a silicone resin can be used as a material of the light-transmissive member 121. Alternatively, the light-transmissive member 121 may contain a color conversion material excited by light from the active layer 106 to generate light having a longer wavelength than the light from the active layer 106. The surface of the light-transmissive member 121 may be flat, or may have a shape different from the flat shape.

In this embodiment, the reflective surfaces 125$x$ and 125$y$ of the reflector 120 improve the symmetry of the luminous intensity distribution, and play a significant role in controlling the degree of polarization of light.

High-intensity light having a high degree of polarization enters the reflective surfaces 125$y$ intersecting the plane $L_{90}$ forming an angle of 90° relative to the polarization direction of polarized light. When the angle θ1y is one half of the azimuth angle χ, light is reflected off the reflective surfaces 125$y$ in the normal line direction. Therefore, in order to reflect emitted light having an azimuth angle χ within the range from 40° to 80° in the normal line direction, the angle θ1y can be within the range from 20° to 40°. Furthermore, in order to reflect emitted light having an azimuth angle χ within the range from 50° to 80° in the normal line direction, the angle θ1y can be within the range from 25° to 40°. Thus, high-intensity light having a high degree of polarization can be concentrated in the normal line direction, and thus, the degree of polarization of light in the normal line direction is maintained.

Low-intensity light the degree of polarization of which is not so high enters the reflective surfaces 125$x$ intersecting the plane $L_0$ parallel to the polarization direction of polarized light. Therefore, light entering the reflective surfaces 125$x$ does not need to be intentionally reflected in the normal line direction. However, even when the light is reflected in the normal line direction, the reflected light insignificantly affects the degree of polarization of light, because the intensity of the original light is low. Specifically, in order to reduce the asymmetry of the luminous intensity distribution, the angle θ1x formed by each of the reflective surfaces 125$x$ can be set substantially equal to the angle θ1y.

A major feature of the quadrangular reflector 120 is that the angle θ1z between each of regions of the reflective surfaces 125 where the reflective surfaces 125$x$ cross the reflective surfaces 125$y$, i.e., each of the reflective surfaces 125$z$ when viewed in cross section taken along the line Z-Z' (along the plane $L_{45}$), and the normal line direction is larger than each of the angle θ1x and the angle θ1y.

Figure 5:
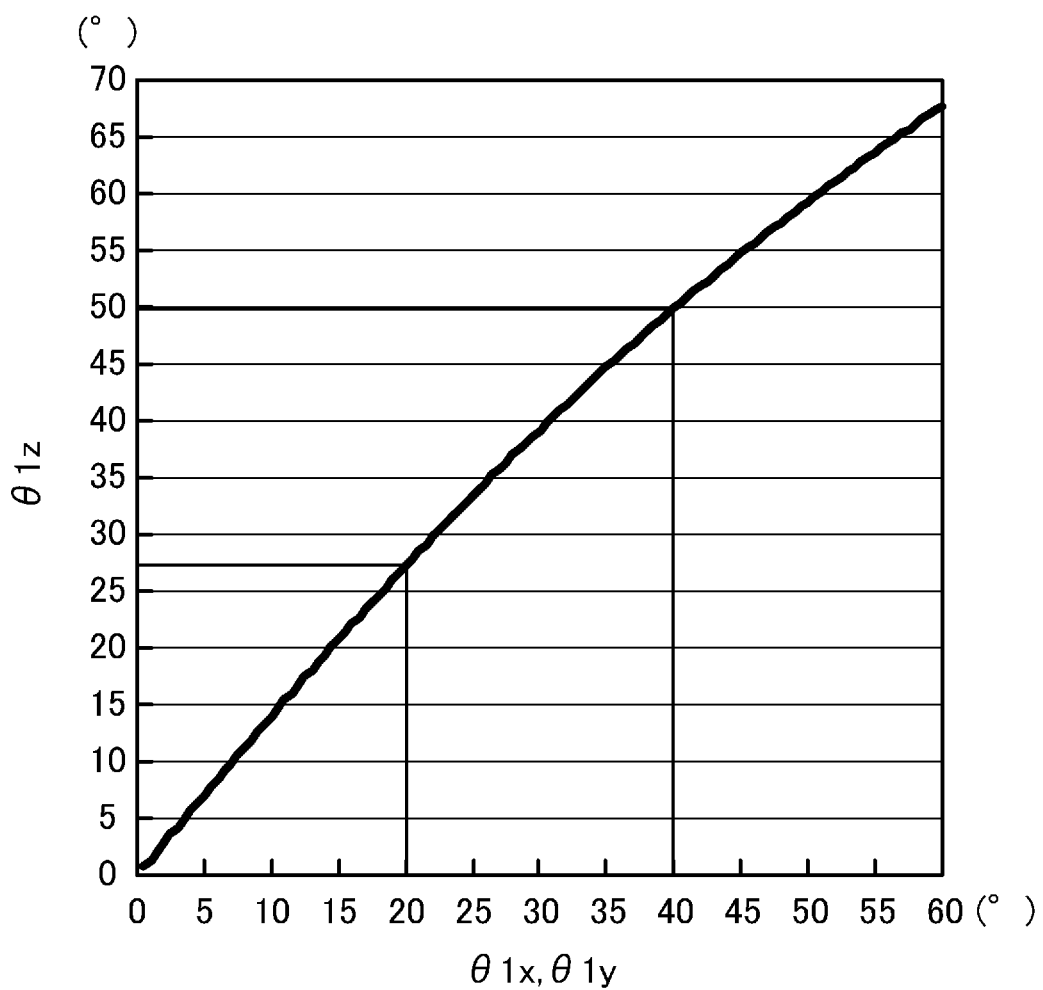
FIG. 5 is a graph illustrating the relationship between an angle θ1x or an angle θ1y from a square reflector according to the first embodiment and an angle θ1z therefrom, where the angle θ1x and the angle θ1y are equal to each other.

FIG. 5 illustrates the relationship between the angle θ1x or the angle θ1y and the angle θ1z, where the angle θ1x and the angle θ1y are equal to each other. When the angle θ1y is within the appropriate range from 20° to 40°, the angle θ1z is about 10° larger than the angle θ1y. Since, as described above, the angle θ2 is within the range from 0° to 10°, light entering the reflective surfaces 125$z$ has properties substantially equivalent to the properties of light in the plane $L_{45}$. Specifically, high-intensity light having a low degree of polarization enters the reflective surfaces 125$z$. However, since the angle θ1z is about 10° larger than the angle θ1y, light is reflected off the reflective surfaces 125$z$ to spread in directions away from the normal line direction. As such, while the quadrangular reflector 120 allows high-intensity light having a high degree of polarization to be concentrated in the normal line direction, the quadrangular reflector 120 can make it difficult to concentrate high-intensity light having a low degree of polarization in the normal line direction. Consequently, while the asymmetry of the luminous intensity distribution is reduced, the degree of polarization of light in the normal line direction can be maintained.

In this embodiment, the arithmetic average inclination angle Δθ1z can be set at an angle larger than the arithmetic average inclination angle Δθ1y, where the angle between a reflective surface and the direction of the normal line to the growth surface of the semiconductor light-emitting chip when viewed in cross section taken along the plane $L_{90}$ is defined by the arithmetic average inclination angle Δθ1y, and the angle between a reflective surface and the direction of the normal line to the growth surface of the semiconductor light-emitting chip when viewed in cross section taken along the plane $L_{45}$ is defined by the arithmetic average inclination angle Δθ1z. When the angle Δθ1z is larger than the angle Δθ1y, light is reflected off the reflective surfaces 125$z$ to spread in directions away from the normal line direction. This can make it difficult to concentrate high-intensity light having a low degree of polarization in the normal line direction, and thus, allows the degree of polarization of light to be maintained.

A material having high linear reflectivity can be used as a material of the reflective surfaces 125. For example, a metal material, such as silver (Ag) or aluminum (Al), can be used. When the surface roughness Ra of each of the reflective surfaces 125 is not more than 100 nm, the linear reflectivity can be increased. The material having high linear reflectivity herein denotes a material having a linear reflectivity that is higher than the diffuse reflectivity of the material.

FIGS. 6-11 illustrate configurations of semiconductor light-emitting devices according to variations of the first embodiment when viewed in cross section taken along the plane $L_{90}$ illustrated by the line Y-Y'.

First Variation of First Embodiment

Figure 6:
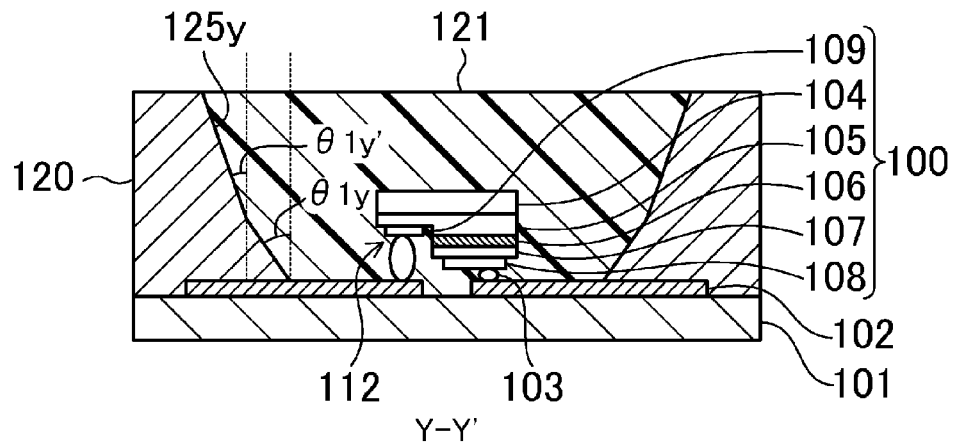
FIG. 6 is a cross-sectional view illustrating a semiconductor light-emitting device according to a first variation of the first embodiment.

FIG. 6 illustrates a semiconductor light-emitting device according to a first variation of the first embodiment. As illustrated in FIG. 6, the reflective surfaces 125 of the reflector 120 according to the first variation may be a plurality of surfaces thereof having different angles from the normal line direction when viewed in cross section taken along the plane $L_{90}$. In this variation, the reflective surfaces 125$y$, for example, each have a portion having an angle θ1y from the normal line direction and a portion having an angle θ1y' therefrom. The combination of portions of the reflective surfaces 125 having a plurality of angles from the normal line direction enables more appropriate control over an angle of light distribution. In this variation, the angles θ1y and θ1y' can be set within the range from 20° to 40°. Furthermore, the angles θ1y and θ1y' can be set within the range from 25° to 40°.

Second Variation of First Embodiment

Figure 7:
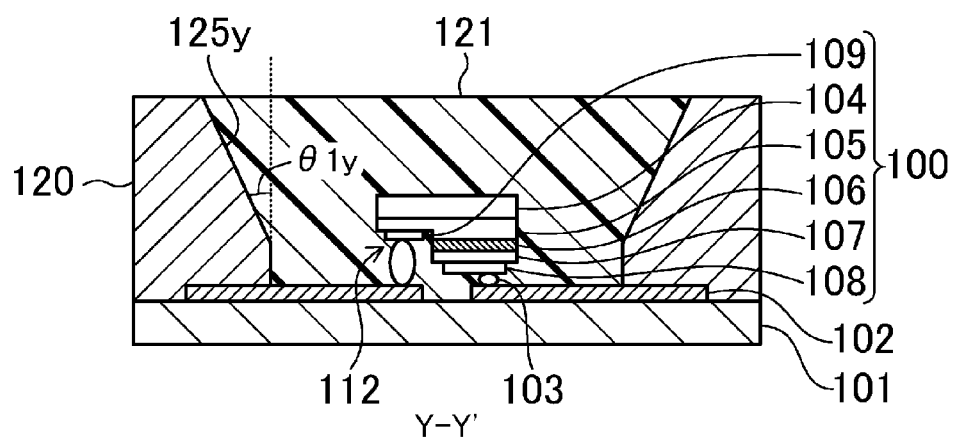
FIG. 7 is a cross-sectional view illustrating a semiconductor light-emitting device according to a second variation of the first embodiment.

FIG. 7 illustrates a semiconductor light-emitting device according to a second variation of the first embodiment. As illustrated in FIG. 7, the reflective surfaces 125 of the reflector 120 according to the second variation are formed such that the angle θ1y between a portion of each of the reflective surfaces 125 near a mounting substrate 101 and the normal line direction is greater than or equal to 0° and less than 20° when viewed in cross section taken along the plane $L_{90}$. In this variation, the angle θ1y between a portion of each of the reflective surfaces 125 near a mounting substrate 101 and the normal line direction is less than 15°. In the plane $L_{90}$, the intensity of light emitted within the range of azimuth angles χ less than −80° and the range of azimuth angles χ greater than 80° is low, and thus, the light insignificantly affects the luminous intensity distribution and the degree of polarization of light. In other words, the portion of the reflective surface 125 near the mounting substrate 101 insignificantly affects the luminous intensity distribution and the degree of polarization of light. Therefore, even when portions of reflective surfaces 125 having an angle θ1y greater than or equal to 0° and less than 20° are located near the mounting substrate 101, the degree of polarization of light in the normal line direction can be maintained.

Third Variation of First Embodiment

Figure 8:
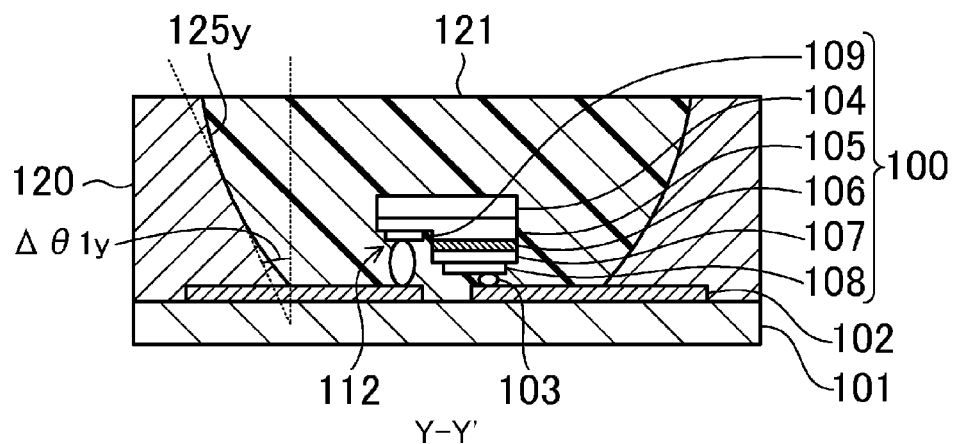
FIG. 8 is a cross-sectional view illustrating a semiconductor light-emitting device according to a third variation of the first embodiment.

FIG. 8 illustrates a semiconductor light-emitting device according to a third variation of the first embodiment. As illustrated in FIG. 8, reflective surfaces 125 of a reflector 120 according to the third variation may be curved such that the angle between each of the reflective surfaces 125 and the normal line direction varies when viewed in cross section taken along the plane $L_{90}$.

In this variation, the angle Δθ1y can be set within the range from 20° to 40°, where Δθ1y represents the arithmetic average inclination angle Δθ1y of each of the reflective surfaces 125 relative to the direction of the normal line to the growth surface of a semiconductor light-emitting chip 100. Furthermore, the angle Δθ1y can be set within the range from 25° to 40°. Here, while the definition of the arithmetic average inclination angle Δθ1y herein is similar to that defined in Japanese Industrial Standard (JIS) B0601-1994, the reference direction of the angle herein is different from that of the angle defined in JIS B0601-1994. In other words, while the arithmetic average inclination angle RΔa defined in JIS is an angle relative to a horizontal direction, the arithmetic average inclination angle Δθ1y herein is an angle relative to the normal line direction. Specifically, the arithmetic average inclination angle Δθ1y herein is given by the following [expression 1]:

$$\Delta\theta 1y = \frac{1}{n-1}\sum_{i=1}^{n-1}\left\{\tan^{-1}\left|\left(\frac{\Delta Y}{\Delta D_i}\right)\right|\right\} = \frac{1}{n-1}\sum_{i=1}^{n-1}\left\{90° - \tan^{-1}\left|\left(\frac{\Delta D_i}{\Delta Y}\right)\right|\right\} = 90° - R\Delta a$$

[Expression 1]

where $\Delta D_i$ represents a deviation from the normal line direction when the curved surface is sectioned at regular intervals ΔY in a lateral direction (a direction perpendicular to the normal line direction).

In order to actually measure the arithmetic average inclination angle Δθ1y, the arithmetic average inclination angle RΔa of a reflective surface 125 is measured using a laser microscope, and the measured value is subtracted from 90° to obtain the arithmetic average inclination angle Δθ1y herein. Specifically, even when a region of the reflective surface 125 has an angle θ1 that is not within the range from 20° to 40° relative to the normal line direction, the effect of reducing the degree of polarization of light herein can be obtained as long as regions of the reflective surface 125 have an average angle within the range from 20° to 40° relative to the normal line direction.

As such, each of reflective surfaces 125y does not need to be linear when viewed in cross section taken along the plane $L_{90}$. A plurality of lines may be combined together to form the reflective surface 125y, or the reflective surface 125y may be curved. Alternatively, a line and a curve may be combined together. Furthermore, a region of the reflective surfaces 125y having an angle Δθ1y greater than or equal to 0° and less than 20° may be located near the mounting substrate 101.

Fourth Variation of First Embodiment

Figure 9:
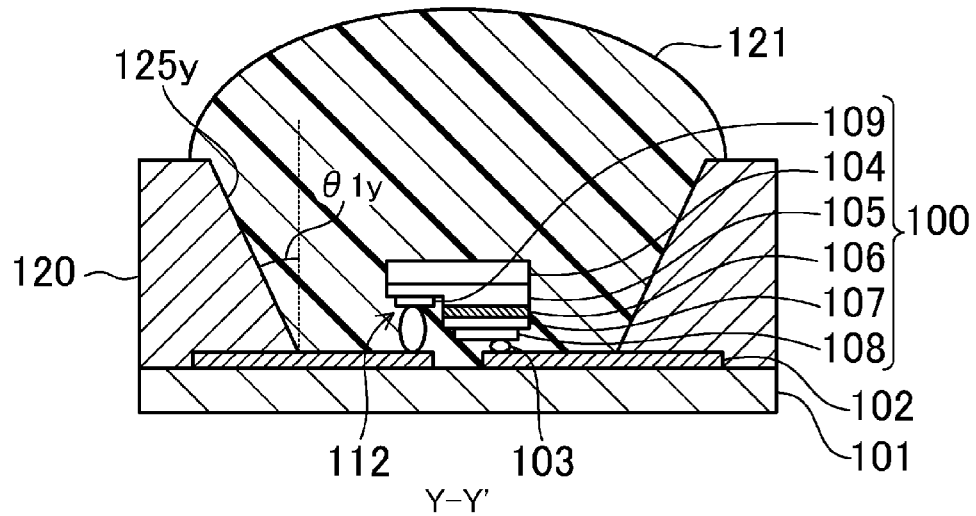
FIG. 9 is a cross-sectional view illustrating a semiconductor light-emitting device according to a fourth variation of the first embodiment.

FIG. 9 illustrates a semiconductor light-emitting device according to a fourth variation of the first embodiment. As illustrated in FIG. 9, the surface of a light-transmissive member 121 according to the fourth variation is not flat, but is convex. In this variation, the luminous intensity distribution of light having a degree of polarization maintained by reflective surfaces 125y can be controlled by the surface shape of the light-transmissive member 121.

For example, when the surface of the light-transmissive member 121 is convex, this can further reduce the light distribution angle. In contrast, although not shown, when the surface of the light-transmissive member 121 is concave, this can increase the light distribution angle.

Fifth Variation of First Embodiment

Figure 10:
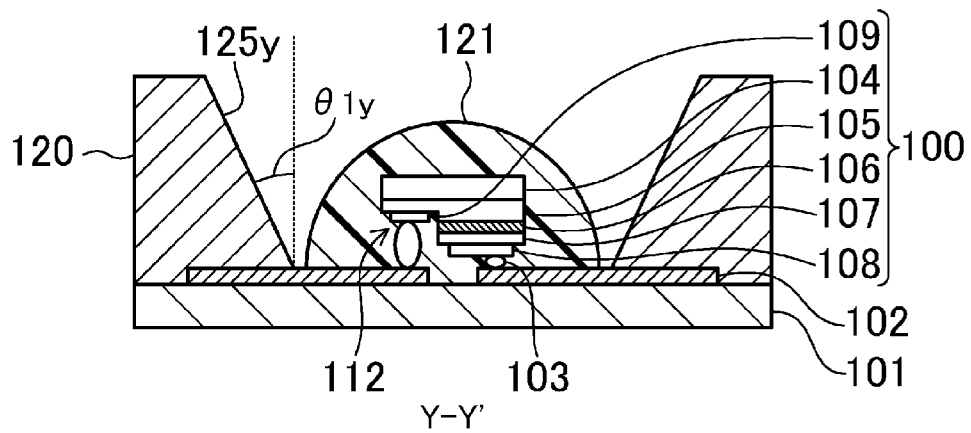
FIG. 10 is a cross-sectional view illustrating a semiconductor light-emitting device according to a fifth variation of the first embodiment.

FIG. 10 illustrates a semiconductor light-emitting device according to a fifth variation of the first embodiment. As illustrated in FIG. 10, in the fifth variation, a light-transmissive member 121 on a mounting substrate 101 does not cover reflective surfaces 125 of a reflector 120, but covers a semiconductor light-emitting chip 100. This configuration enables the formation of the reflector 120 after the formation of the light-transmissive member 121.

For example, when the surface of the light-transmissive member 121 is convex, this can reduce the light distribution angle similarly to the fourth variation. In contrast, although not shown, when the surface of the light-transmissive member 121 is concave, this can increase the light distribution angle.

Sixth Variation of First Embodiment

Figure 11:
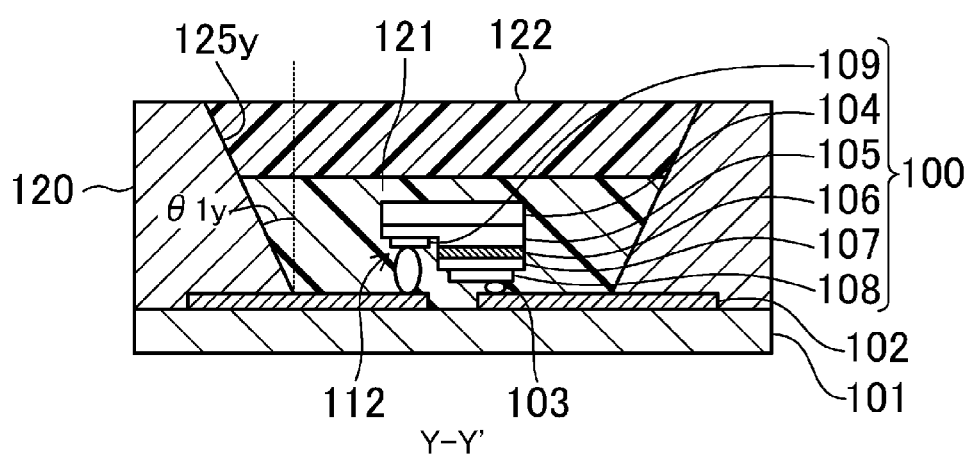
FIG. 11 is a cross-sectional view illustrating a semiconductor light-emitting device according to a sixth variation of the first embodiment.

FIG. 11 illustrates a semiconductor light-emitting device according to a sixth variation of the first embodiment. As illustrated in FIG. 11, in the sixth variation, a wavelength conversion member 122 is further formed on a light-transmissive member 121. The wavelength conversion member 122 converts the wavelength of at least one part of light emitted from a semiconductor light-emitting chip 100. When the wavelength of a part of the emitted light is converted, the polarization characteristics of a part of the emitted light having a wavelength that is not converted is maintained. The wavelength conversion member 122 can be made of a resin material or glass containing phosphors converting the light wavelength. Alternatively, it may be made of a sintered object having phosphors converting the light wavelength as the main ingredient.

Seventh Variation of First Embodiment

Figure 12:
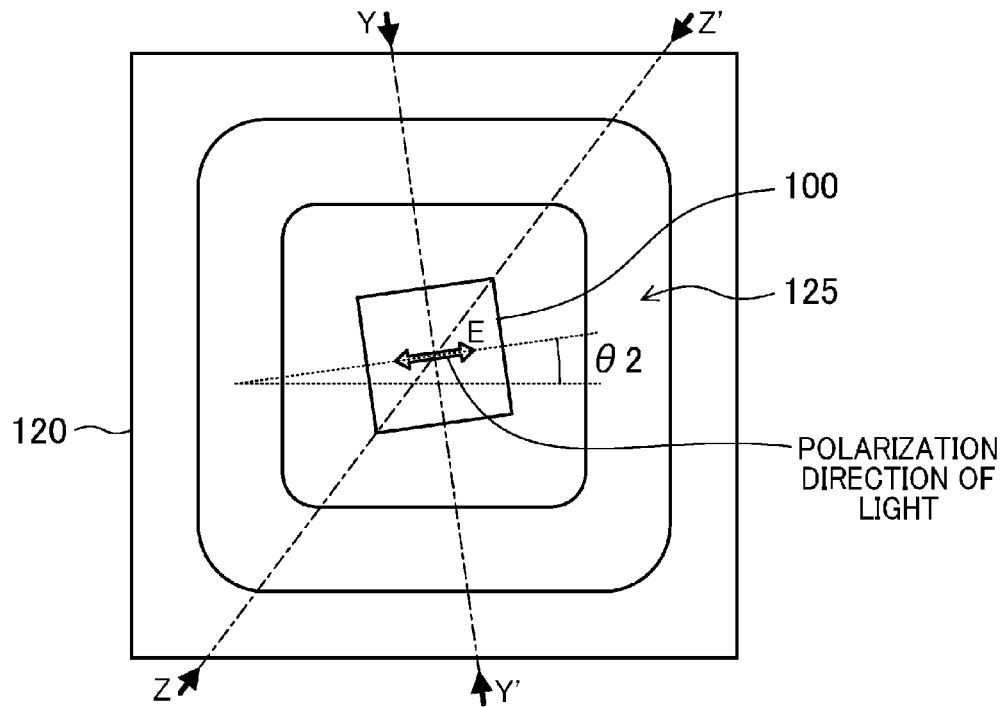
FIG. 12 is a schematic plan view illustrating a semiconductor light-emitting device according to a seventh variation of the first embodiment.

FIG. 12 illustrates the configuration of a semiconductor light-emitting device according to a seventh variation of the first embodiment when viewed in plan. As illustrated in FIG. 12, a reflector 120 of the semiconductor light-emitting device according to the seventh variation has a reflective surface 125 having corner portions each with a curved surface. The curvature R of the curved surface can be less than the length of each of sides of the semiconductor light-emitting chip 100.

Eighth Variation of First Embodiment

Figure 13:
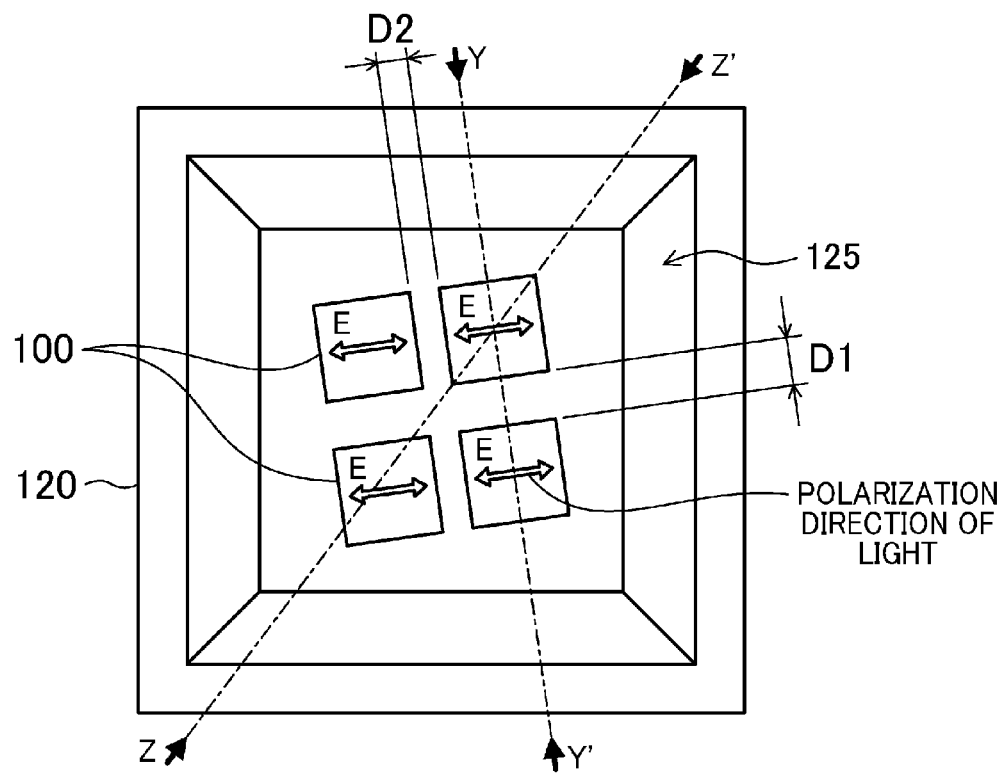
FIG. 13 is a schematic plan view illustrating a semiconductor light-emitting device according to an eighth variation of the first embodiment.

FIG. 13 illustrates the configuration of a semiconductor light-emitting device according to an eighth variation of the first embodiment when viewed in plan. As illustrated in FIG. 13, the semiconductor light-emitting device according to the eighth variation includes a plurality of semiconductor light-emitting chips 100, four semiconductor light-emitting chips 100 here, arranged on a mounting substrate 101 such that the polarization directions of light from the semiconductor light-emitting chips 100 are identical. The distance D2 can be less than the distance D1, where D1 represents the distance between two of the semiconductor light-emitting chips 100 adjacent to each other in a direction perpendicular to the polarization direction of the light (along the c-axis when the growth surface of an active layer is an m-plane), and D2 represents the distance between two of the semiconductor light-emitting chips 100 adjacent to each other in a direction identical with the polarization direction of the light (along the a-axis when the growth surface of the active layer is an m-plane). The reason for this is that a comparison between the luminous intensity distribution in the direction perpendicular to the polarization direction of the light (the luminous intensity distribution in the plane $L_{90}$) and the luminous intensity distribution in the direction identical with the polarization direction of the light (the luminous intensity distribution in the plane $L_0$) shows that in the luminous intensity distribution in the direction perpendicular to the polarization direction of the light (the luminous intensity distribution in the plane $L_{90}$), even when the absolute value of the azimuth angle χ is great, the light intensity is high. Specifically, when the distance D2 is less than the distance D1, this can prevent light beams emitted from the adjacent semiconductor light-emitting chips 100 from interfering with each other.

Ninth Variation of First Embodiment

Figure 14:
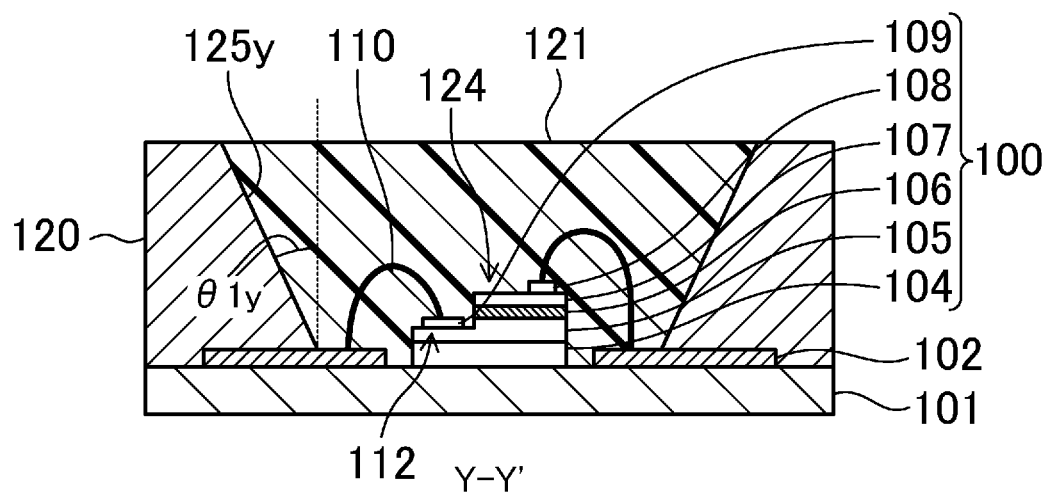
FIG. 14 is a cross-sectional view illustrating a semiconductor light-emitting device according to a ninth variation of the first embodiment.

FIG. 14 illustrates the cross-sectional configuration of a semiconductor light-emitting device according to a ninth variation of the first embodiment. As illustrated in FIG. 14, a semiconductor light-emitting chip 100 according to the ninth variation is mounted on a mounting substrate 101 by wire bonding. Specifically, the semiconductor light-emitting chip 100 is held with a substrate 104 facing a mounting surface of the mounting substrate 101. A p-side electrode 108 and an n-side electrode 109 are each electrically connected to a corresponding one of interconnect electrodes 102 on the mounting substrate 101 through a corresponding one of wires 110 made of gold (Au) or aluminum (Al). A p-type nitride semiconductor layer 107 has a light extraction surface 124. The substrate 104 may be conductive, or may be nonconductive. The substrate 104 may be, for example, an insulative substrate, such as a sapphire substrate.

Tenth Variation of First Embodiment

Figure 15:
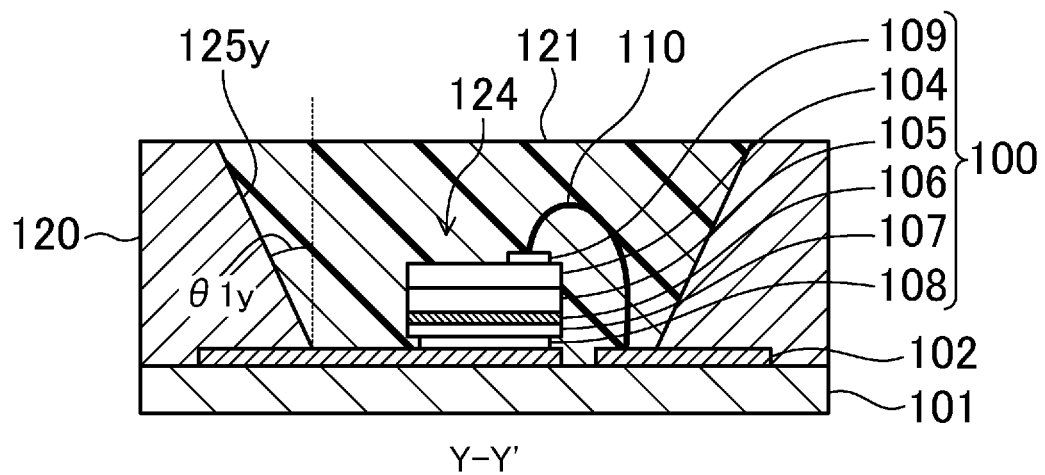
FIG. 15 is a cross-sectional view illustrating a semiconductor light-emitting device according to a tenth variation of the first embodiment.

FIG. 15 illustrates the cross-sectional configuration of a semiconductor light-emitting device according to a tenth variation of the first embodiment. As illustrated in FIG. 15, a semiconductor light-emitting chip 100 according to the tenth variation is mounted on a mounting substrate 101 by wire bonding. Specifically, the semiconductor light-emitting chip 100 is held with a p-side electrode 108 facing a mounting surface of the mounting substrate 101. The p-side electrode 108 is electrically connected to a corresponding one of interconnect electrodes 102 on the mounting substrate 101 with solder of, e.g., gold-tin (AuSn). An n-side electrode 109 is electrically connected to a corresponding one of the interconnect electrodes 102 on the mounting substrate 101 through a wire 110 made of gold (Au). A substrate 104 has a light extraction surface 124. In this case, the substrate 104 is conductive.

As such, processes for connecting each of the p-side electrode 108 and the n-side electrode 109 and a corresponding one of the interconnect electrodes 102 on the mounting substrate 101 together vary between flip-chip bonding and wire bonding. However, other configurations of the semiconductor light-emitting chip 100 mounted by wire bonding are substantially similar to those of the semiconductor light-emitting chip 100 mounted by flip-chip bonding, and operational advantages of a semiconductor light-emitting device including the semiconductor light-emitting chip 100 mounted by wire bonding are also similar to those of the semiconductor light-emitting device including the semiconductor light-emitting chip 100 mounted by flip-chip bonding according to the first embodiment.

When an active layer 106 emits polarized light, the first embodiment and its variations allow the polarization characteristics to be maintained. Therefore, also when the active layer 106 has a growth surface that is a nonpolar plane, such as an m-plane or an a-plane, or a semipolar plane, such as -r-plane, a (11-22) plane, or a (20-2-1) plane, this embodiment and its variations can improve the luminous intensity distribution, and allows the degree of polarization of light to be maintained.

Also in each of the ninth and tenth variations of the first embodiment, a reflector 120 having a cross-sectional shape illustrated in any one of FIGS. 6-8 can be used.

A light-transmissive member 121 having a surface with the shape illustrated in any one of FIGS. 9 and 10 can be combined with each of the ninth and tenth variations.

The wavelength conversion member 122 illustrated in FIG. 11 can be combined with each of the ninth and tenth variations.

(Fabrication Method)

A method for fabricating a semiconductor light-emitting device according to the first embodiment will be described hereinafter with reference to FIGS. 4A-4C.

First, an n-type nitride semiconductor layer 105 is epitaxially grown on the principal surface of a substrate 104 having an m-plane as its principal surface and made of n-type GaN by metal organic chemical vapor deposition (MOCVD) or any other method. Specifically, for example, silicon (Si) is used as an n-type dopant, trimethylgallium (TMG (Ga(CH$_3$)$_3$)) being a gallium (Ga) source, and ammonia (NH$_3$) being a nitrogen (N) source are supplied to the substrate 104, and the about 1-3-μm-thick n-type nitride semiconductor layer 105 made of GaN is formed at a growth temperature of about 900-1100° C.

In this stage, the substrate 104 is a substrate at the wafer level, and a plurality of light-emitting structures forming semiconductor light-emitting devices can be fabricated at once.

Next, an active layer 106 made of a nitride semiconductor is grown on the n-type nitride semiconductor layer 105. The active layer 106 has an InGaN/GaN multiple quantum well (MQW) structure in which, for example, 3-15-nm-thick well layers made of $In_{1-x}Ga_xN$ and 6-30-nm-thick barrier layers made of GaN are alternately stacked. When the well layers made of $In_{1-x}Ga_xN$ are formed, the growth temperature may be decreased to a temperature of about 700-800° C. to ensure incorporation of indium (In) into the well layers being grown. The wavelength of emitted light is selected based on the intended use of the semiconductor light-emitting device, and the In content ratio x is determined based on the wavelength. For example, when the wavelength is 450 nm (blue light wavelength), the In content ratio x can be 0.25-0.27. When the wavelength is 520 nm (green light wavelength), the In content ratio x can be 0.40-0.42. When the wavelength is 630 nm (red light wavelength), the In content ratio x can be 0.56-0.58.

Next, a p-type nitride semiconductor layer 107 is epitaxially grown on the active layer 106. Specifically, for example, $Cp_2Mg$ (bis(cyclopentadienyl)magnesium) is used as p-type impurities, TMG and $NH_3$ are supplied, as materials, to the substrate 104, and the about 50-500-nm-thick p-type nitride semiconductor layer 107 made of p-type GaN is formed on the active layer 106 at a growth temperature of about 900-1100° C. The p-type nitride semiconductor layer 107 may contain an about 15-30-nm-thick p-type AlGaN layer. The formation of the p-type AlGaN layer can reduce the overflow of electrons that are carriers. An undoped GaN layer may be formed between the active layer 106 and the p-type nitride semiconductor layer 107.

Next, in order to activate Mg with which the p-type nitride semiconductor layer 107 is doped, the p-type nitride semiconductor layer 107 is thermally treated at a temperature of about 800-900° C. for about 20 minutes.

Next, a semiconductor layered structure including the substrate 104, the n-type nitride semiconductor layer 105, the active layer 106, and the p-type nitride semiconductor layer 107 is partially etched by lithography and dry etching using a chlorine ($Cl_2$) gas. Thus, a recess 112 is formed by removing a portion of the p-type nitride semiconductor layer 107, a portion of the active layer 106, and a portion of the n-type nitride semiconductor layer 105 to expose a region of the n-type nitride semiconductor layer 105.

Next, an n-side electrode 109 is selectively formed on and in contact with the exposed region of the n-type nitride semiconductor layer 105. Here, for example, a multilayer film (Ti/Pt layer) of titanium (Ti) and platinum (Pt) is formed as the n-side electrode 109.

Next, a p-side electrode 108 is selectively formed on and in contact with the p-type nitride semiconductor layer 107. For example, a multilayer film (Pd/Pt layer) of palladium (Pd) and platinum (Pt) is formed as the p-side electrode 108. Thereafter, heat treatment is performed to alloy an interface region between the Ti/Pt layer and the n-type nitride semiconductor layer 105 and an interface region between the Pd/Pt layer and the p-type nitride semiconductor layer 107. The order in which the n-side electrode 109 and the p-side electrode 108 are formed is not particularly limited.

Next, a (back) surface of the substrate 104 opposite to the n-type nitride semiconductor layer 105 is polished to reduce the thickness of the substrate 104 by a predetermined amount.

The wafer-level substrate 104 is singulated into individual semiconductor light-emitting chips 100 corresponding to a plurality of semiconductor light-emitting devices fabricated as above. Examples of this singulation process include various processes, such as laser dicing and cleavage. The individual semiconductor light-emitting chips 100 into which the substrate 104 has been singulated are mounted on a mounting surface of a mounting substrate 101.

Examples of a method for forming a reflector 120 include a method in which a recess is formed in the mounting substrate 101 itself, and a method in which a separately fabricated reflector 120 is bonded to the mounting substrate 101.

Processes of the method in which a recess is formed in the mounting substrate 101 itself vary depending on the principal material of the mounting substrate 101. When the principal material of the mounting substrate 101 is a metal material containing, e.g., aluminum (Al), silver (Ag), copper (Cu), or tungsten (W), the recess can be formed by pressing with dies. When the principal material of the mounting substrate 101 is a sintered material, such as alumina (aluminum oxide) or aluminum nitride (AlN), the previous formation of protrusions/recesses on the inner surfaces of dies enables the formation of a predetermined recess after sintering. When the principal material of the mounting substrate 101 is a semiconductor material, such as silicon (Si) or germanium (Ge), or a composite of the materials, a predetermined recess can be formed by etching after the formation of a mask.

When a reflector 120 is bonded to the mounting substrate 101, the semiconductor light-emitting chip 100 may be mounted on the mounting substrate 101 before the reflector 120 is bonded to the mounting substrate 101. Alternatively, after the reflector 120 has been bonded to the mounting substrate 101, the semiconductor light-emitting chip 100 may be mounted on the mounting substrate 101. When a reflector 120 is bonded to the mounting substrate 101, the principal material of the reflector 120 can be different from the principal material of the mounting substrate 101. For example, when the reflector 120 is made of a metal material containing, e.g., aluminum (Al), silver (Ag), copper (Cu), or tungsten (W), the reflector 120 can be manufactured by pressing with dies. When the reflector 120 is made of a resin material or a plastic material, the reflector 120 can be manufactured by, e.g., injection molding or machining In this case, a metal material containing, e.g., aluminum (Al), silver (Ag), copper (Cu), or tungsten (W), an insulative material, such as alumina (aluminum oxide) or aluminum nitride (AlN), a semiconductor material, such as silicon (Si) or germanium (Ge), or a composite of the materials can be used as the principal material of the mounting substrate 101.

In order to increase the reflectivity of the reflector 120, Al or Ag, for example, may be deposited on the reflective surface 125 by vapor deposition or plating. Alternatively, a high-reflectivity resin material containing titanium dioxide ($TiO_2$) particles may be deposited on the reflective surface 125.

A metal film for forming interconnect electrodes is formed on the surface of the mounting substrate 101 through a film formation process, such as sputtering or plating. Thereafter, a desired resist pattern is formed on the formed metal film by, e.g., lithography. Thereafter, the resist pattern is transferred to the metal film by dry etching or wet etching to form interconnect electrodes 102 each having a desired electrode shape.

Next, a plurality of bumps 103 are formed on predetermined portions of the interconnect electrodes 102. Gold (Au) is preferably used as a constituent material of the bumps 103. The bumps 103 each having a diameter of about 40-80 μm can be formed with a bump bonder. The bumps 103 can be formed by Au plating instead of with a bump bonder. Subsequently, the interconnect electrodes 102 on which the plurality of bumps 103 are formed and the electrodes of the semiconductor light-emitting chip 100 are electrically connected together by, e.g., ultrasonic welding.

As such, the semiconductor light-emitting device according to the first embodiment can be obtained.

Second Embodiment

Figure 16A:
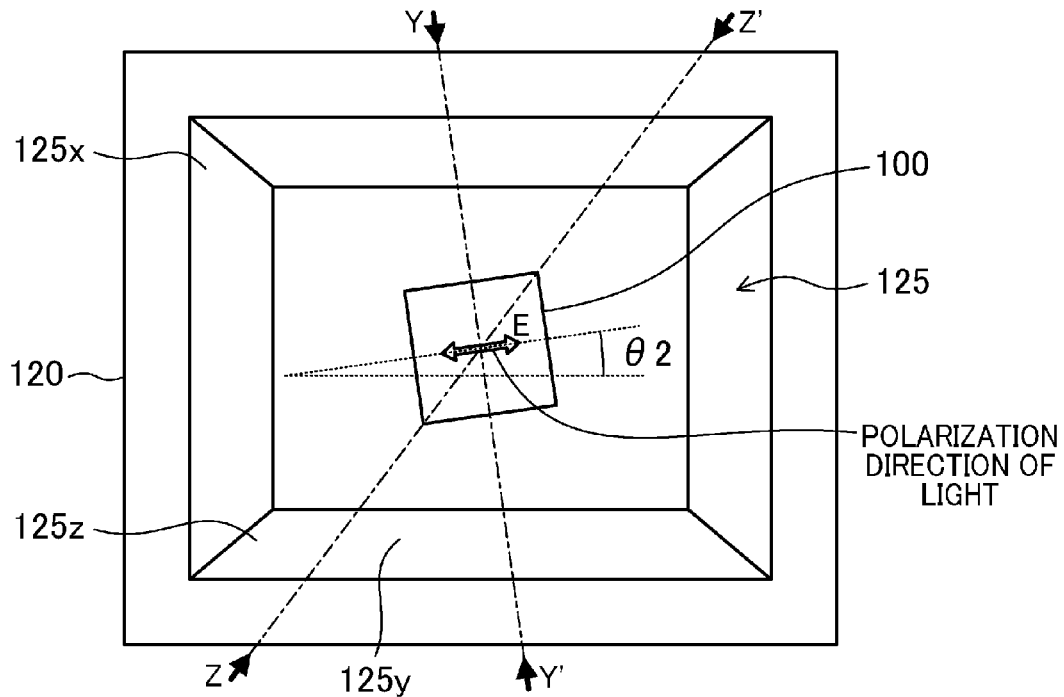
FIG. 16A is a schematic plan view illustrating a semiconductor light-emitting device according to a second embodiment.
Figure 16B:
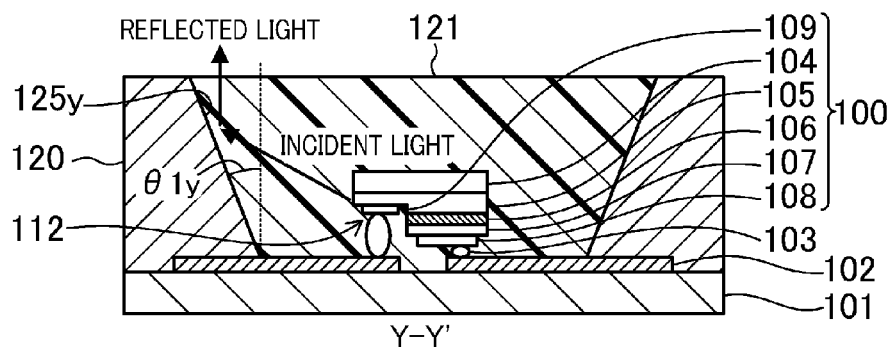
FIG. 16B is a cross-sectional view taken along the line Y-Y' in FIG. 16A.
Figure 16C:
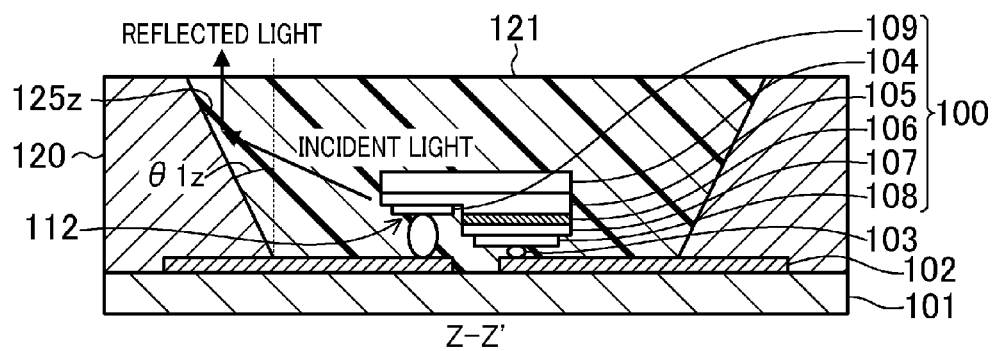
FIG. 16C is a cross-sectional view taken along the line Z-Z' in FIG. 16A.

A semiconductor light-emitting device according to a second embodiment of the present disclosure will be described hereinafter with reference to FIGS. 16A-16C. In FIGS. 16A-16C, the same characters as those in FIG. 4A-4C are used to represent equivalent components, and thus, description thereof is omitted. Here, the difference between the first and second embodiments will be described.

FIG. 16A illustrates the configuration of the semiconductor light-emitting device according to the second embodiment when viewed in plan. FIG. 16B illustrates the cross-sectional configuration taken along the line Y-Y'. The cross section taken along the line Y-Y' corresponds to the plane $L_{90}$. FIG. 16C illustrates the cross-sectional configuration taken along the line Z-Z'. The cross section taken along the line Z-Z' corresponds to the plane $L_{45}$. A plurality of reflective surfaces 125 of a reflector 120 are arranged such that a shape formed by the reflective surfaces 125 when viewed in plan is rectangular. The angle θ2 can be set at an angle not less than 0° and not more than 10°, where θ2 represents the angle between a long side of the rectangular shape formed by the reflective surfaces 125 and the polarization direction of light from a semiconductor light-emitting chip 100. Alternatively, the angle θ2 can be set at an angle not less than 85° and not more than 90°.

First Variation of Second Embodiment

Figure 17:
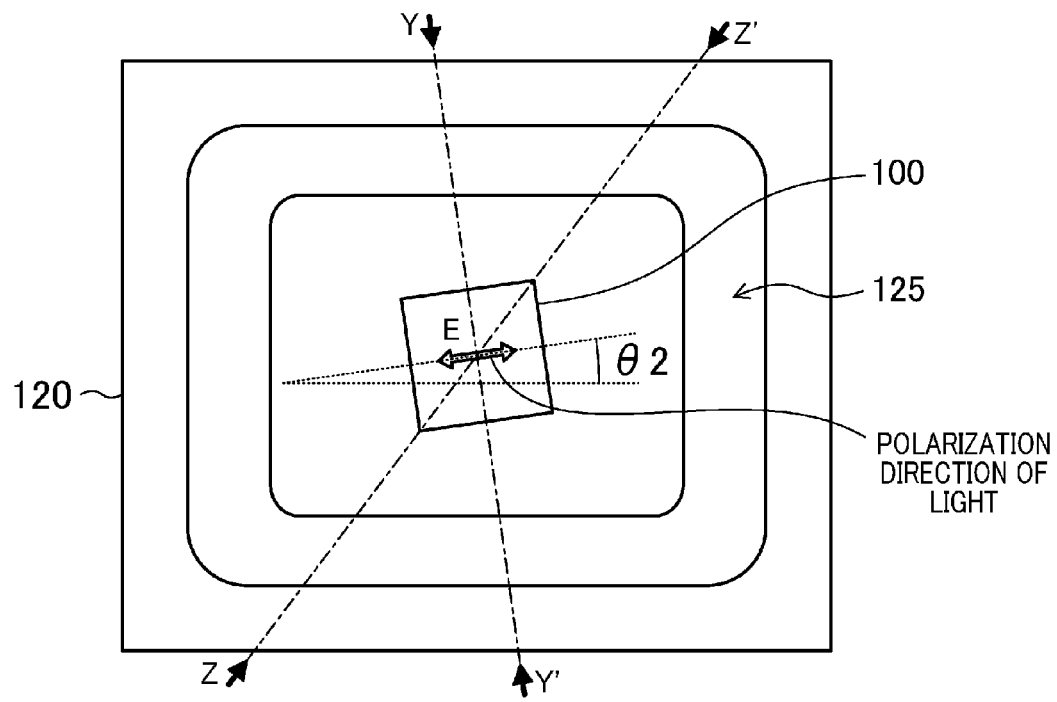
FIG. 17 is a schematic plan view illustrating a semiconductor light-emitting device according to a first variation of the second embodiment.

FIG. 17 illustrates the configuration of a semiconductor light-emitting device according to a first variation of the second embodiment when viewed in plan. As illustrated in FIG. 17, a reflector 120 of the semiconductor light-emitting device according to the first variation has a reflective surface 125 having corner portions each with a curved surface. The curvature R of the curved surface can be less than the length of each of sides of the semiconductor light-emitting chip 100.

Second Variation of Second Embodiment

Figure 18:
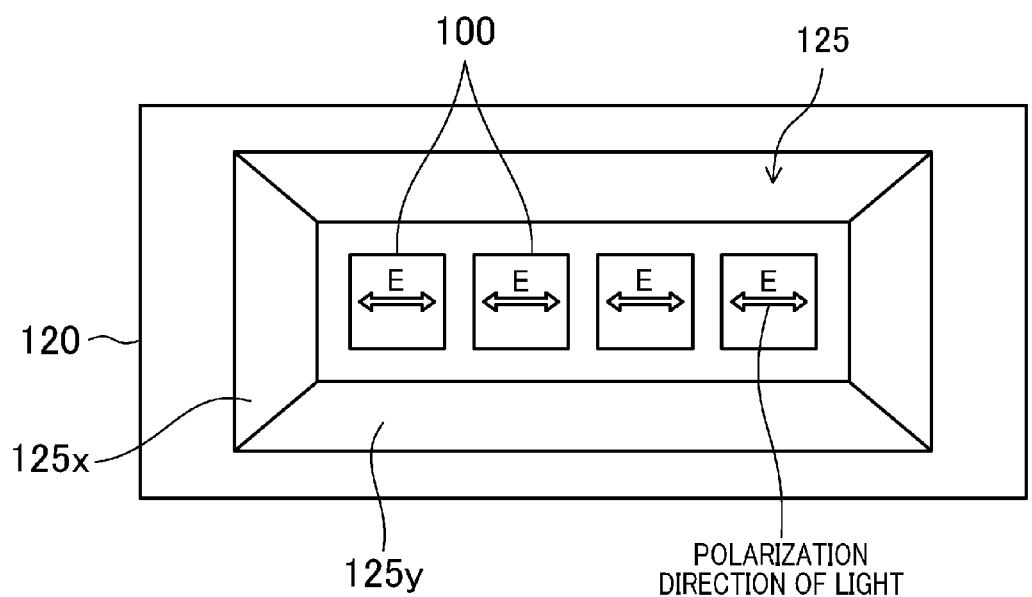
FIG. 18 is a schematic plan view illustrating a semiconductor light-emitting device according to a second variation of the second embodiment.

FIG. 18 illustrates the configuration of a semiconductor light-emitting device according to a second variation of the second embodiment when viewed in plan. As illustrated in FIG. 18, the semiconductor light-emitting device according to the second variation includes a plurality of semiconductor light-emitting chips 100, four semiconductor light-emitting chips 100 here, arranged on a mounting substrate 101 such that the polarization directions of light from the semiconductor light-emitting chips 100 are all along the long sides of the rectangular shape formed by the reflective surfaces 125 of a reflector 120. The angle θ2 can be not less than 0° and not more than 10°, where θ2 represents the angle between each of the long sides of the rectangular shape formed by the reflective surfaces 125 of the reflector 120 when viewed in plan and the polarization direction of the light from each of the semiconductor light-emitting chips 100. When, as such, the angle θ2 is set at an angle not less than 0° and not more than 10°, the degree of polarization of the light can be higher than when the angle θ2 is set at an angle not less than 85° and not more than 90°. A comparison between the luminous intensity distribution in the direction perpendicular to the polarization direction of the light (the luminous intensity distribution in the plane $L_{90}$) and the luminous intensity distribution in the direction identical with the polarization direction of the light (the luminous intensity distribution in the plane $L_0$) shows that in the luminous intensity distribution in the direction identical with the polarization direction of the light, the light distribution angle is less than that in the luminous intensity distribution in the direction perpendicular to the polarization direction of the light, and thus, even when the distance between each adjacent pair of the semiconductor light-emitting chips 100 is reduced, the interference between light beams emitted from the adjacent pair of the semiconductor light-emitting chips 100 can be reduced. The properties will be described in detail in a third example described below.

Third Variation of Second Embodiment

Figure 19:
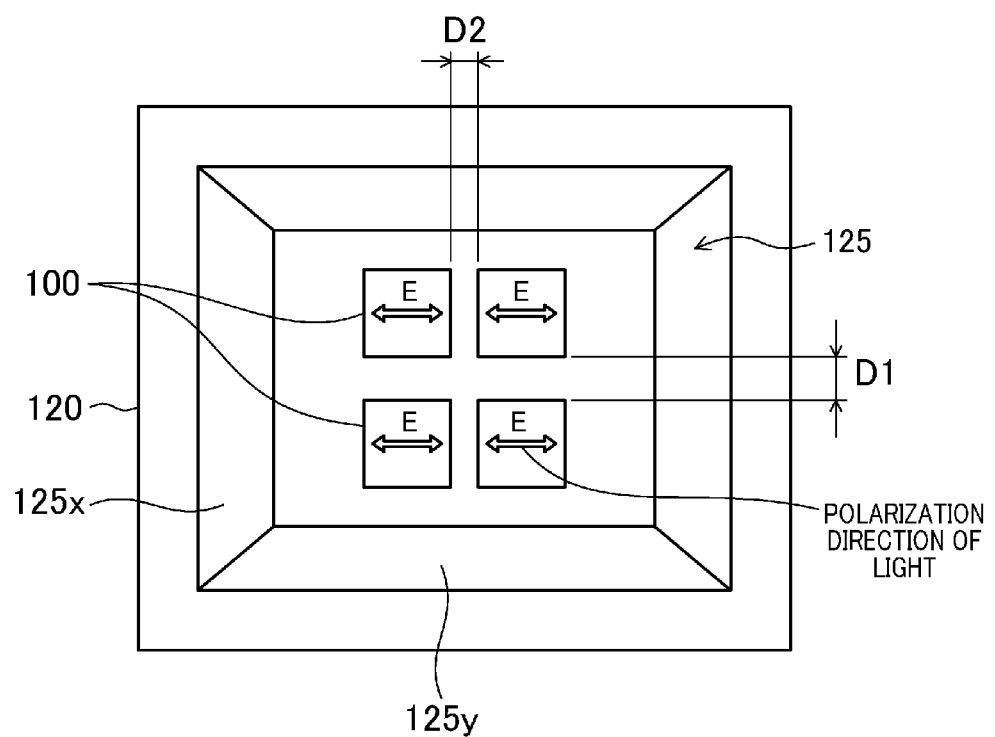
FIG. 19 is a schematic plan view illustrating a semiconductor light-emitting device according to a third variation of the second embodiment.

FIG. 19 illustrates the configuration of a semiconductor light-emitting device according to a third variation of the second embodiment when viewed in plan. As illustrated in FIG. 19, the semiconductor light-emitting device according to the third variation includes a plurality of semiconductor light-emitting chips 100, four semiconductor light-emitting chips 100 here, arranged on a mounting substrate 101 in a matrix such that the directions of polarization of light from the semiconductor light-emitting chips 100 are identical. The distance D2 can be less than the distance D1, where D1 represents the distance between two of the semiconductor light-emitting chips 100 adjacent to each other in a direction perpendicular to the polarization direction of the light, i.e., along the c-axis when the growth surface of an active layer is an m-plane, and D2 represents the distance between two of the semiconductor light-emitting chips 100 adjacent to each other in a direction identical with the polarization direction of the light, i.e., along the a-axis when the growth surface of the active layer is an m-plane. The reason for this is that a comparison between the luminous intensity distribution in the direction perpendicular to the polarization direction of the light (the luminous intensity distribution in the plane $L_{90}$) and the luminous intensity distribution in the direction identical with the polarization direction of the light (the luminous intensity distribution in the plane $L_0$) shows that in the luminous intensity distribution in the direction perpendicular to the polarization direction of the light (the luminous intensity distribution in the plane $L_{90}$), even when the absolute value of the azimuth angle χ is great, the light intensity is high. Specifically, when the distance D2 is less than the distance D1, this can prevent light beams emitted from the adjacent semiconductor light-emitting chips 100 from interfering with each other.

The second embodiment and its variations can be combined with the first embodiment except for the shape formed by the reflective surfaces 125 of the reflector 120 when viewed in plan. Specifically, each of the reflective surfaces 125y of this embodiment does not need to be linear when viewed in cross section taken along the plane $L_{90}$. A plurality of lines may be combined together to form the reflective surface 125y, or the reflective surface 125y may be curved. Alternatively, a line and a curve may be combined together. In this case, the reflective surface 125y can be determined to have a portion forming an angle Δθ1y not less than 20° and not more than 40°, where the angle between the reflective surface 125y and the direction of the normal line to the growth surface of each of the semiconductor light-emitting chips 100 is defined by the arithmetic average inclination angle Δθ1y. Furthermore, also when a portion of the reflective surface 125y having an angle Δθ1y greater than or equal to 0° and less than 20° is located near the mounting substrate 101, the degree of polarization of light in the normal line direction tends to be maintained.

A light-transmissive member 121 having a surface with the shape illustrated in any one of FIGS. 9 and 10 can be combined with each of this embodiment and its variations.

The wavelength conversion member 122 illustrated in FIG. 11 can be combined with each of this embodiment and its variations.

As illustrated in FIGS. 14 and 15, the semiconductor light-emitting chip 100 may be a wire-bonded chip.

Furthermore, when an active layer 106 emits polarized light, this embodiment and its variations allow the degree of polarization of light to be maintained. Therefore, also when the active layer 106 has a growth surface that is a nonpolar plane, such as an m-plane or an a-plane, or a semipolar plane, such as -r-plane, a (11-22) plane, or a (20-2-1) plane, this embodiment and its variations can improve the luminous intensity distribution, and allow the degree of polarization of light to be maintained.

Third Embodiment

Figure 20A:
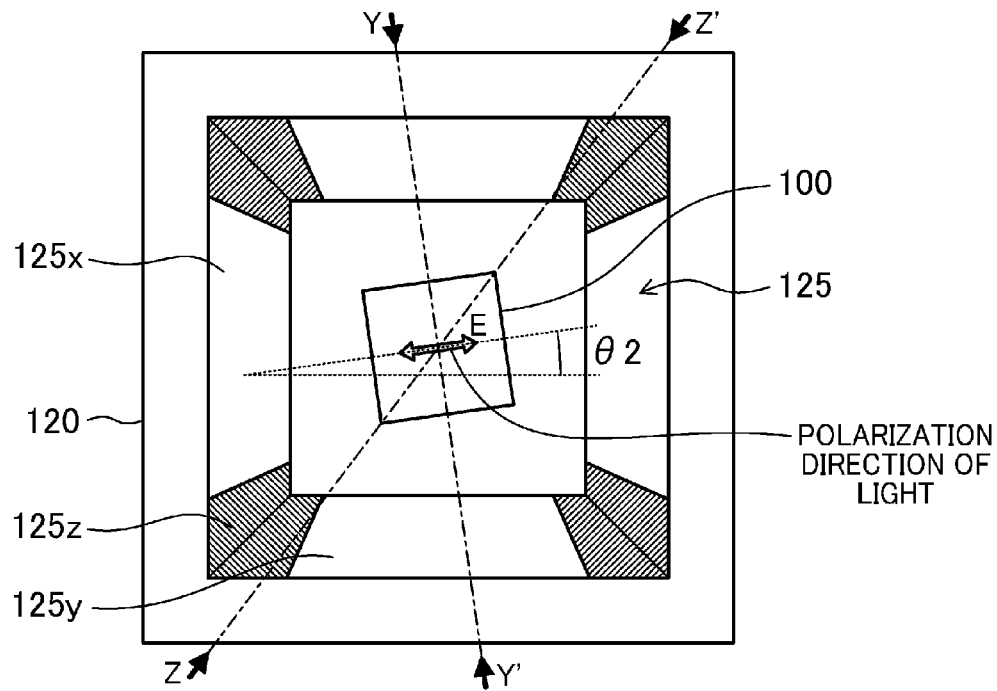
FIG. 20A is a schematic plan view illustrating a semiconductor light-emitting device according to a third embodiment.
Figure 20B:
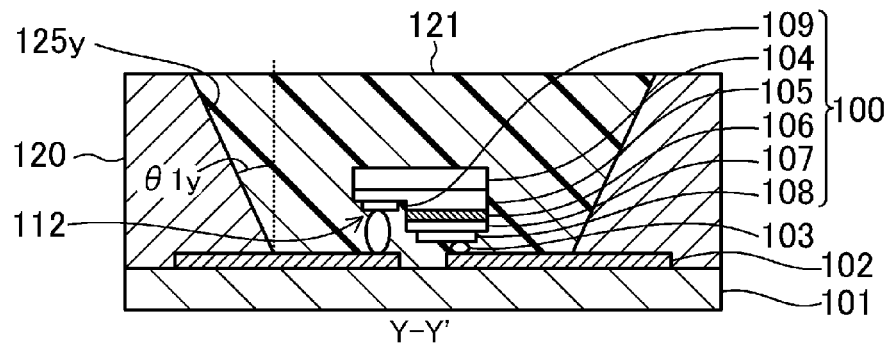
FIG. 20B is a cross-sectional view taken along the line Y-Y' in FIG. 20A.
Figure 20C:
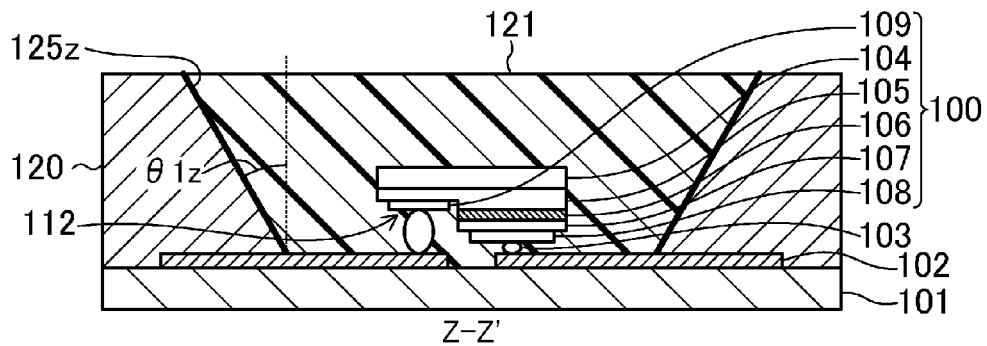
FIG. 20C is a cross-sectional view taken along the line Z-Z' in FIG. 20A.

A semiconductor light-emitting device according to a third embodiment of the present disclosure will be described hereinafter with reference to FIGS. 20A-20C. In FIGS. 20A-20C, the same characters as those in FIG. 4A-4C are used to represent equivalent components, and thus, description thereof is omitted. Here, the difference between the first and third embodiments will be described.

FIG. 20A illustrates the configuration of the semiconductor light-emitting device according to the third embodiment when viewed in plan. FIG. 20B illustrates a cross-sectional configuration taken along the line Y-Y'. A cross section taken along the line Y-Y' corresponds to the plane $L_{90}$. FIG. 20C illustrates a cross-sectional configuration taken along the line Z-Z'. A cross section taken along the line Z-Z' corresponds to the plane $L_{45}$. A plurality of reflective surfaces 125 of a reflector 120 are arranged such that a shape formed by the reflective surfaces 125 when viewed in plan is quadrangular. The angle θ2 can be not less than 0° and not more than 10°, where θ2 represents the angle between a side of the quadrangle formed by the reflective surfaces 125 when viewed in plan and the polarization direction of light from the semiconductor light-emitting chip 100.

A feature of the third embodiment is that the reflectivity Rz is less than the reflectivity Ry, where Rz represents the reflectivity of a portion of a reflective surface 125z intersecting the plane $L_{45}$, and Ry represents the reflectivity of a portion of a reflective surface 125y intersecting the plane $L_{90}$. The reflectivity Rz may be less than or equal to one half of the reflectivity Ry.

Such a configuration allows the angle θ1z to be greater than the angle θ1y as described in the first embodiment, and makes it difficult to concentrate light in the plane $L_{45}$, which may decrease the degree of polarization of light from the semiconductor light-emitting device, in the normal line direction. Thus, the degree of polarization of the light is maintained.

The portion of the reflective surface 125z having such reflectivity as described above can be easily formed by coating the portion of the reflective surface 125z with a material having low reflectivity. For example, black carbon disposed on the reflective surface 125z allows the reflectivity of the portion of the reflective surface 125z to be significantly low. Alternatively, a black resin material may be disposed on the reflective surface 125z.

This embodiment can be combined with the first or second embodiment. Specifically, each of the reflective surfaces 125y does not need to be linear when viewed in cross section taken along the plane $L_{90}$. A plurality of lines may be combined together to form the reflective surface 125y, or the reflective surface 125y may be curved. Alternatively, a line and a curve may be combined together. In this case, the reflective surface 125y can be determined to have a portion forming an angle Δθ1y not less than 20° and not more than 40°, where the angle between the reflective surface 125y and the direction of the normal line to the growth surface of each of the semiconductor light-emitting chips 100 is defined by the arithmetic average inclination angle Δθ1y. Furthermore, also when a portion of the reflective surface 125y having an angle Δθ1y greater than or equal to 0° and less than 20° is located near the mounting substrate 101, the degree of polarization of light in the normal line direction tends to be maintained.

Also in this embodiment, a light-transmissive member 121 having a surface with the shape illustrated in any one of FIGS. 9 and 10 can be used.

Furthermore, the wavelength conversion member 122 illustrated in FIG. 11 can be used.

As illustrated in FIG. 12, corner portions of the quadrangle formed by the reflective surfaces 125 of the reflector 120 when viewed in plan may be curved.

The feature of the third embodiment can be used in such a semiconductor light-emitting device including a plurality of semiconductor light-emitting chips 100 as illustrated in FIGS. 13, 18, and 19.

As illustrated in FIGS. 14 and 15, the semiconductor light-emitting chip 100 may be a wire-bonded chip.

As illustrated in FIG. 16, the shape of the reflector 120 when viewed in plan may be rectangular.

Furthermore, when an active layer 106 emits polarized light, this embodiment and its variations allow the degree of polarization of light to be maintained. Therefore, also when the active layer 106 has a growth surface that is a nonpolar plane, such as an m-plane or an a-plane, or a semipolar plane, such as -r-plane, a (11-22) plane, or a (20-2-1) plane, this embodiment and its variations can improve the luminous intensity distribution, and allow the degree of polarization of light to be maintained.

Fourth Embodiment

Figure 21A:
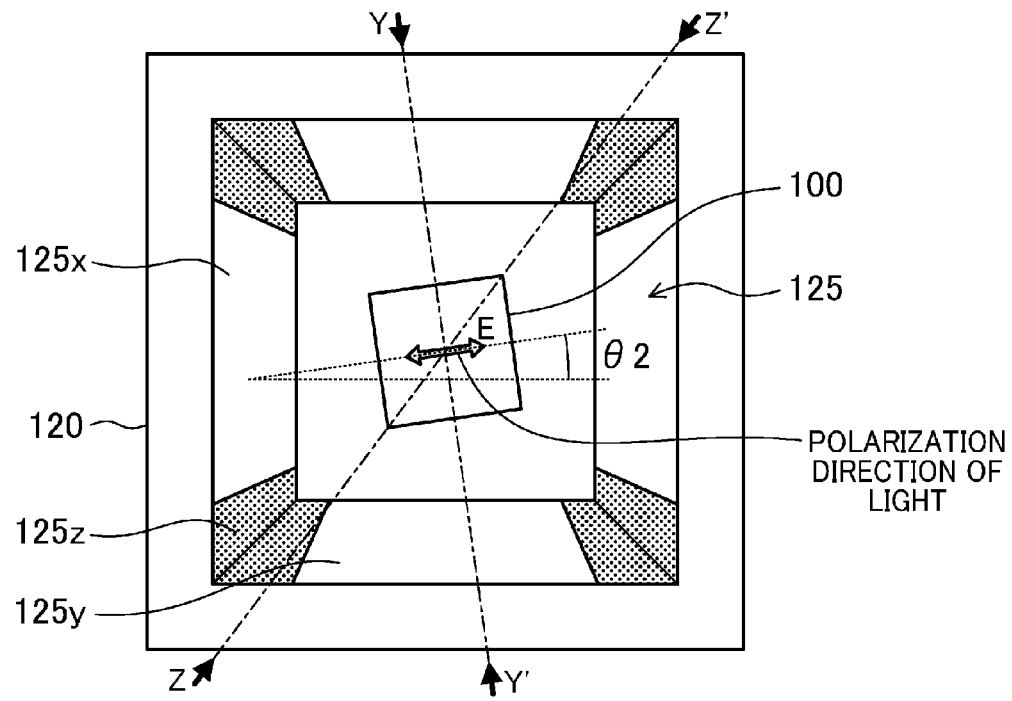
FIG. 21A is a schematic plan view illustrating a semiconductor light-emitting device according to a fourth embodiment.
Figure 21B:
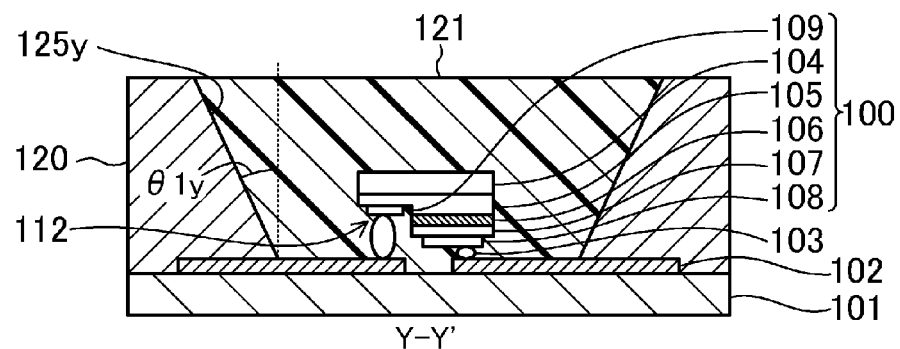
FIG. 21B is a cross-sectional view taken along the line Y-Y' in FIG. 21A.
Figure 21C:
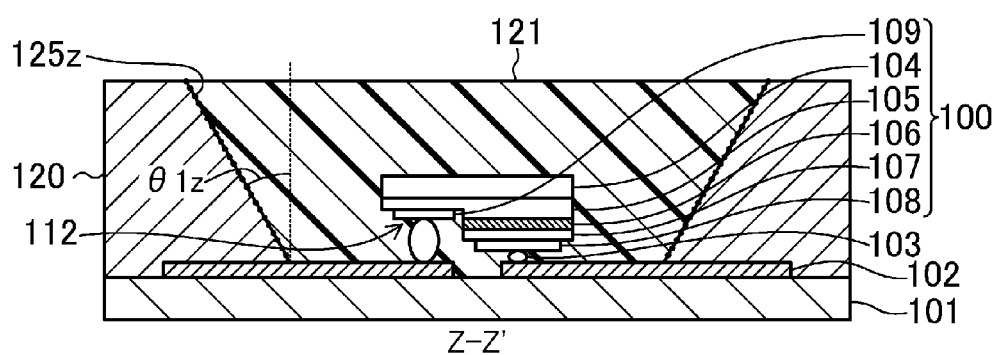
FIG. 21C is a cross-sectional view taken along the line Z-Z' in FIG. 21A.

A semiconductor light-emitting device according to a fourth embodiment of the present disclosure will be described hereinafter with reference to FIGS. 21A-21C. In FIGS. 21A-21C, the same characters as those in FIG. 4A-4C are used to represent equivalent components, and thus, description thereof is omitted. Here, the difference between the first and fourth embodiments will be described.

FIG. 21A illustrates the configuration of the semiconductor light-emitting device according to the fourth embodiment when viewed in plan. FIG. 21B illustrates a cross-sectional configuration taken along the line Y-Y'. A cross section taken along the line Y-Y' corresponds to the plane $L_{90}$. FIG. 21C illustrates a cross-sectional configuration taken along the line Z-Z'. A cross section taken along the line Z-Z' corresponds to the plane $L_{45}$. A plurality of reflective surfaces 125 of a reflector 120 are arranged such that a shape formed by the reflective surfaces 125 when viewed in plan is quadrangular. The angle θ2 can be not less than 0° and not more than 10°, where θ2 represents the angle between a side of the quadrangle formed by the reflective surfaces 125 when viewed in plan and the polarization direction of light from the semiconductor light-emitting chip 100.

A feature of the fourth embodiment is that the diffuse reflectivity Rz_d is greater than the diffuse reflectivity Ry_d, where Rz_d represents the diffuse reflectivity of a portion of a reflective surface 125z intersecting the plane $L_{45}$, and Ry_d represents the diffuse reflectivity of a reflective surface 125y.

Such a configuration allows the angle θ1z to be greater than the angle θ1y as described in the first embodiment, and makes it difficult to concentrate light in the plane $L_{45}$, which may decrease the degree of polarization of light from the semiconductor light-emitting device, in the normal line direction. Thus, the degree of polarization of the light is maintained.

For example, zinc oxide (ZnO), silicon dioxide ($SiO_2$), or titanium dioxide ($TiO_2$) can be used as a material of the portion of the reflective surface 125z. Adhesion of fine particles made of such a material to the portion of the reflective surface 125z can increase the diffuse reflectivity of the portion of the reflective surface 125z. Specifically, the portion of the reflective surface 125z may be coated with an adhesive or a resin material containing fine particles of, e.g., ZnO, $SiO_2$, or $TiO_2$.

The same material as that of the reflective surface 125y may be used as a material of the portion of the reflective surface 125z. In this case, silver (Ag) or aluminum (Al), for example, can be used. When Ag or Al, for example, is used, the surface roughness Ra_z of the portion of the reflective surface 125z is determined to be greater than the surface roughness Ra_y of the reflective surface 125y. Specifically, a surface roughness Ra_z greater than 100 nm can increase the diffuse reflectivity of the portion of the reflective surface 125z. Specifically, the diffuse reflectivity of the portion of the reflective surface 125z may be increased by sandblasting only the portion of the reflective surface 125z to form an uneven surface. Alternatively, when the linear reflectivity of the reflective surface 125y is increased by allowing the reflective surface 125y to be a specular surface, the reflectivity Rz_d can be greater than the reflectivity Ry_d.

This embodiment can be combined with the first or second embodiment. Specifically, each of the reflective surfaces 125y does not need to be linear when viewed in cross section taken along the plane $L_{90}$. For example, a plurality of lines may be combined together to form the reflective surface 125y, or the reflective surface 125y may be curved. Alternatively, a line and a curve may be combined together. In this case, the reflective surface 125y can be determined to have a portion forming an angle Δθ1y not less than 20° and not more than 40°, where the angle between the reflective surface 125y and the direction of the normal line to the growth surface of each of the semiconductor light-emitting chips 100 is defined by the arithmetic average inclination angle Δθ1y. Furthermore, also when a portion of the reflective surface 125y having an angle Δθ1y greater than or equal to 0° and less than 20° is located near the mounting substrate 101, the degree of polarization of light in the normal line direction tends to be maintained.

Also in this embodiment, a light-transmissive member 121 having a surface with the shape illustrated in any one of FIGS. 9 and 10 can be used.

Furthermore, the wavelength conversion member 122 illustrated in FIG. 11 can be used.

As illustrated in FIG. 12, corner portions of the quadrangle formed by the reflective surfaces 125 of the reflector 120 when viewed in plan may be curved.

The feature of the fourth embodiment can be used in such a semiconductor light-emitting device including a plurality of semiconductor light-emitting chips 100 as illustrated in FIGS. 13, 18, and 19.

As illustrated in FIGS. 14 and 15, the semiconductor light-emitting chip 100 may be a wire-bonded chip.

As illustrated in FIG. 16, the shape of the reflector 120 when viewed in plan may be rectangular.

Furthermore, when an active layer 106 emits polarized light, this embodiment allows the degree of polarization of light to be maintained. Therefore, also when the active layer 106 has a growth surface that is a nonpolar plane, such as an m-plane or an a-plane, or a semipolar plane, such as -r-plane, a (11-22) plane, or a (20-2-1) plane, this embodiment can improve the luminous intensity distribution, and allows the degree of polarization of light to be maintained.

Fifth Embodiment

Figure 22A:
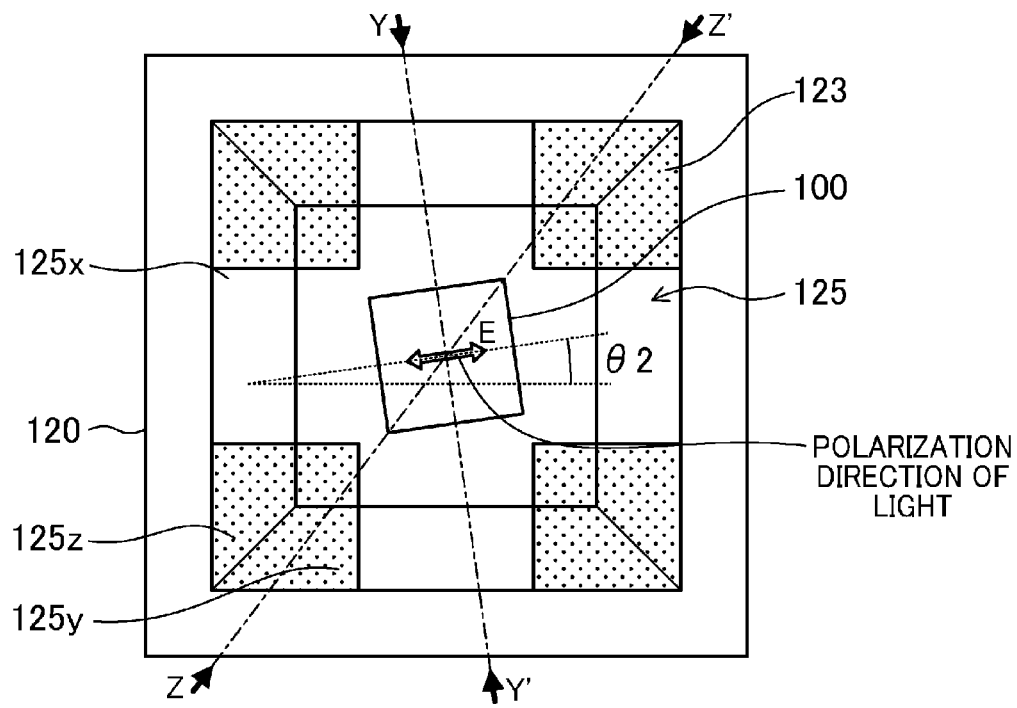
FIG. 22A is a schematic plan view illustrating a semiconductor light-emitting device according to a fifth embodiment.
Figure 22B:
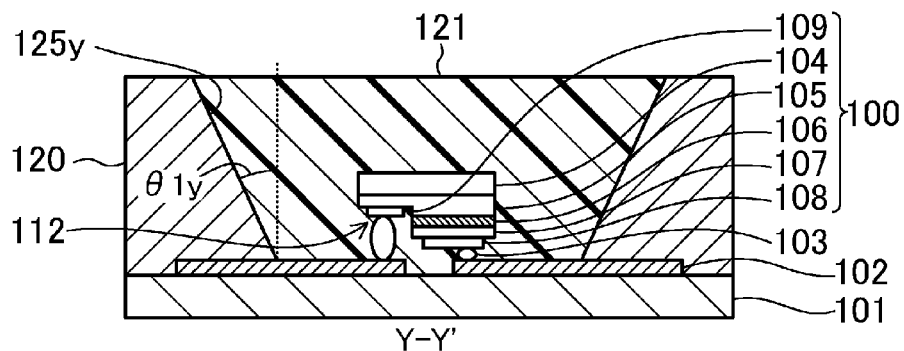
FIG. 22B is a cross-sectional view taken along the line Y-Y' in FIG. 22A.
Figure 22C:
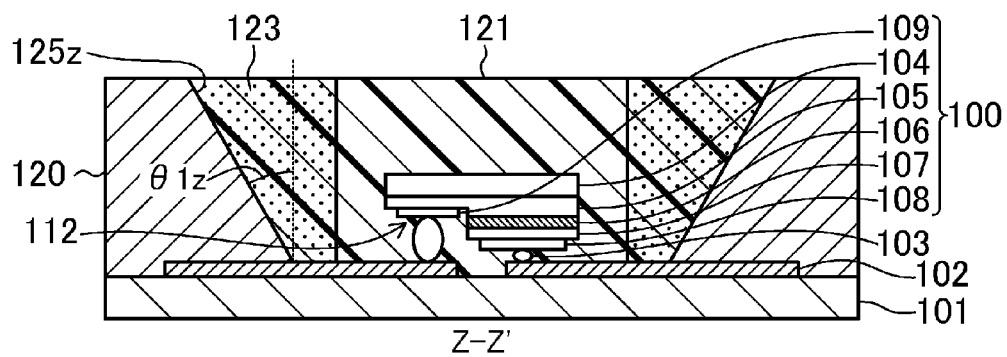
FIG. 22C is a cross-sectional view taken along the line Z-Z' in FIG. 22A.

A semiconductor light-emitting device according to a fifth embodiment of the present disclosure will be described hereinafter with reference to FIGS. 22A-22C. In FIGS. 22A-22C, the same characters as those in FIG. 4A-4C are used to represent equivalent components, and thus, description thereof is omitted. Here, the difference between the first and fifth embodiments will be described.

FIG. 22A illustrates the configuration of the semiconductor light-emitting device according to the fifth embodiment when viewed in plan. FIG. 22B illustrates a cross-sectional configuration taken along the line Y-Y'. A cross section taken along the line Y-Y' corresponds to the plane $L_{90}$. FIG. 22C illustrates a cross-sectional configuration taken along the line Z-Z'. A cross section taken along the line Z-Z' corresponds to the plane $L_{45}$. A plurality of reflective surfaces 125 of a reflector 120 are arranged such that a shape formed by the reflective surfaces 125 when viewed in plan is quadrangular. The angle θ2 can be not less than 0° and not more than 10°, where θ2 represents the angle between a side of the quadrangle formed by the reflective surfaces 125 when viewed in plan and the polarization direction of light from the semiconductor light-emitting chip 100.

A feature of the fifth embodiment is that instead of a light-transmissive member 121, diffusion-material-containing members 123 are selectively disposed on regions of the reflective surfaces 125 intersecting the plane $L_{45}$, i.e., regions of the reflective surfaces 125 including corner portions of the quadrangle formed by the reflective surfaces 125 when viewed in plan. The diffusion-material-containing members 123 are made of a material that more easily diffuse light transmitted through the material than the light-transmissive member 121. In other words, the diffusion-material-containing members 123 have a higher diffuse transmittance than the light-transmissive member 121. Specifically, a transparent resin material containing fine particles of, e.g., ZnO, $SiO_2$, or $TiO_2$ can be used.

Such a configuration allows the angle θ1z to be greater than the angle θ1y, and makes it difficult to concentrate light in the plane $L_{45}$, which may decrease the degree of polarization of light from the semiconductor light-emitting device, in the normal line direction. Thus, the degree of polarization of the light is maintained.

This embodiment can be combined with the first or second embodiment. Specifically, each of the reflective surfaces 125y does not need to be linear when viewed in cross section taken along the plane $L_{90}$. For example, a plurality of lines may be combined together to form the reflective surface 125y, or the reflective surface 125y may be curved. Alternatively, a line and a curve may be combined together. In this case, the reflective surface 125y can be determined to have a portion forming an angle Δθ1y not less than 20° and not more than 40°, where the angle between the reflective surface 125y and the direction of the normal line to the growth surface of each of the semiconductor light-emitting chips 100 is defined by the arithmetic average inclination angle Δθ1y. Furthermore, also when a portion of the reflective surface 125y having an angle Δθ1y greater than or equal to 0° and less than 20° is located near the mounting substrate 101, the degree of polarization of light in the normal line direction tends to be maintained.

Also in this embodiment, a light-transmissive member 121 having a surface with the shape illustrated in any one of FIGS. 9 and 10 can be used.

Furthermore, the wavelength conversion member 122 illustrated in FIG. 11 can be used.

As illustrated in FIG. 12, corner portions of the quadrangle formed by the reflective surfaces 125 of the reflector 120 when viewed in plan may be curved.

The feature of the fifth embodiment can be used in such a semiconductor light-emitting device including a plurality of semiconductor light-emitting chips 100 as illustrated in FIGS. 13, 18, and 19.

As illustrated in FIGS. 14 and 15, the semiconductor light-emitting chip 100 may be a wire-bonded chip.

As illustrated in FIG. 16, the shape of the reflector 120 when viewed in plan may be rectangular.

Furthermore, when an active layer 106 emits polarized light, this embodiment allows the degree of polarization of light to be maintained. Therefore, also when the active layer 106 has a growth surface that is a nonpolar plane, such as an m-plane or an a-plane, or a semipolar plane, such as -r-plane, a (11-22) plane, or a (20-2-1) plane, this embodiment can improve the luminous intensity distribution, and allows the degree of polarization of light to be maintained.

EXAMPLES

First Example

Figure 23:
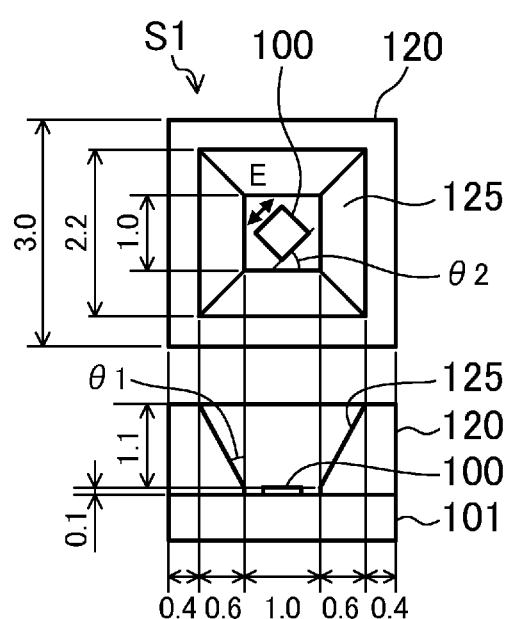
FIG. 23 provides a plan view and a cross-sectional view illustrating a semiconductor light-emitting device including a square reflector S1 according to a first example.

A semiconductor light-emitting device according to a first example will be described hereinafter with reference to FIG. 23. The dimensions in FIG. 23 are expressed in units of millimeters (mm). The same characters as those in the first embodiment are used to represent equivalent components. These characters and units are similar to those in other examples.

First, a method for fabricating a semiconductor light-emitting chip 100 forming a portion of the semiconductor light-emitting device according to the first example and including an active layer having a growth surface that is an m-plane will be schematically described.

First, a 2-μm-thick n-type nitride semiconductor layer made of n-type GaN, an active layer having a three-period quantum well structure including a quantum well layer made of InGaN and a barrier layer made of GaN, and a 0.5-μm-thick p-type nitride semiconductor layer made of p-type GaN were formed on a wafer-level n-type GaN substrate having an m-plane as its principal surface by, e.g., MOCVD.

A Ti/Al layer was formed as an n-side electrode, and an Ag layer was formed as a p-side electrode. Thereafter, the back surface of the n-type GaN substrate is polished to reduce the thickness of the n-type GaN substrate to a thickness of 100 μm.

Subsequently, grooves having a depth of about several tens of μm from the surface of the wafer were formed in the wafer including light-emitting structures along the c-axis, i.e., the [0001] direction, and the a-axis, i.e., the [11-20] direction, with laser beams. Thereafter, the wafer was broken into semiconductor light-emitting chips 100 made of an m-plane GaN-based semiconductor and having sides each having a length of 450 μm.

Subsequently, one of the fabricated semiconductor light-emitting chips 100 was mounted on a mounting substrate 101 made of AlN by flip-chip mounting. The thickness of the mounting substrate 101 made of AlN is about 0.7 mm. Interconnect electrodes 102 having a thickness of about 4 μm and made of silver (Ag) were formed on the mounting substrate 101.

As such, a semiconductor light-emitting device including the active layer having a growth surface that is an m-plane was fabricated. In this state, no reflector 120 is provided. The measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68. Such a semiconductor light-emitting device that does not include a reflector 120 corresponds to a semiconductor light-emitting device according to a first comparative example.

Separately from the semiconductor light-emitting chip, a square reflector S1 made of aluminum and having a plurality of reflective surfaces 125 arranged such that a shape formed by the reflective surfaces 125 when viewed in plan is square was fabricated by press molding. The azimuth angle χ of light reflected off the reflective surfaces 125 of the square reflector S1 was within the range from 42.5° to 78.7°. The angle θ1 between each of the reflective surfaces 125 and the normal line direction was 28.6°. The fabricated square reflector S1 had the reflective surfaces 125 having a height of 100 μm or less from the top surface of the mounting substrate 101 and forming an angle θ1 of 0°.

Figure 24:
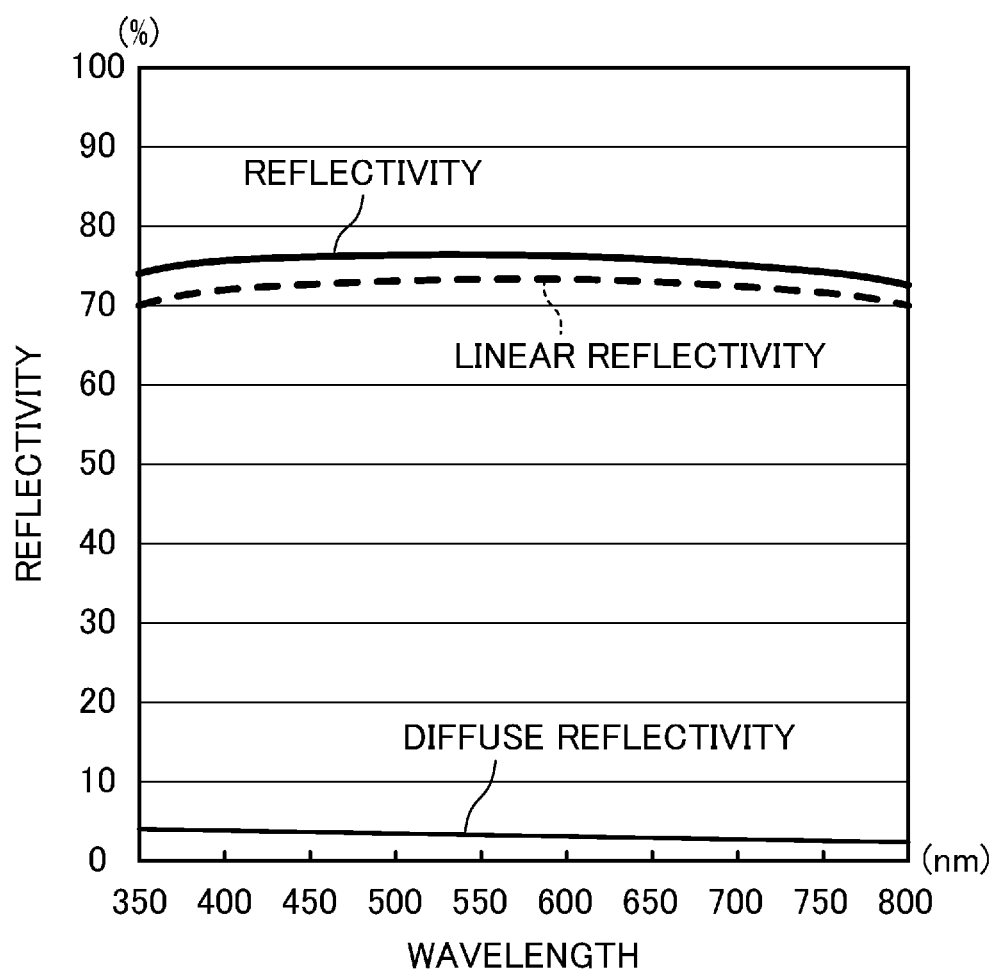
FIG. 24 is a graph illustrating the reflectivities of a reflective surface of the reflector made of aluminum according to the first example.

FIG. 24 illustrates results of measuring the reflectivities of one of the reflective surfaces 125 of the square reflector S1. In the measurement of the reflectivities, light beams having wavelengths within the range from 350 nm to 800 nm were measured using a spectrophotometer (UV-VIS) made by JASCO Corporation. In the measurement, the linear reflectivity and the diffuse reflectivity of each of the light beams were measured, and the sum of the linear reflectivity and the diffuse reflectivity was defined as the total reflectivity. FIG. 24 shows that the total reflectivity of a reflective surface of the fabricated reflector 120 made of aluminum is not less than 73%, and the proportion of the linear reflectivity to the total reflectivity is not less than 95%. This shows that the square reflector S1 is a reflector having high linear reflectivity.

The square reflector S1 made of aluminum and fabricated separately from a mounting substrate 101 as described above was bonded onto the mounting substrate 101 on which the semiconductor light-emitting chip 100 is mounted. Thus, the semiconductor light-emitting device including the square reflector S1 made of aluminum according to the first example was fabricated. A plurality of semiconductor light-emitting devices in which the angles θ2 are 0°, 6°, 8°, 12°, 13°, 18°, 25°, 30°, 40°, and 45° were fabricated, where θ2 represents an angle between the polarization direction of light from the semiconductor light-emitting chip 100 and a side of the square formed by the reflective surfaces 125 when viewed in plan.

Here, when the reflective surfaces 125 are arranged such that a shape formed by the reflective surfaces 125 when viewed in plan is square, the square has high symmetry when viewed in plan; therefore, when the angle θ2 is greater than 45°, the properties of such a semiconductor light-emitting device are equivalent to those obtained when the angle θ2 is equal to the angle θ2 subtracted from 90°. For this reason, the properties of semiconductor light-emitting devices in which the angles θ2 are within the range from 0° to 45° merely needs to be examined.

Figure 25A:
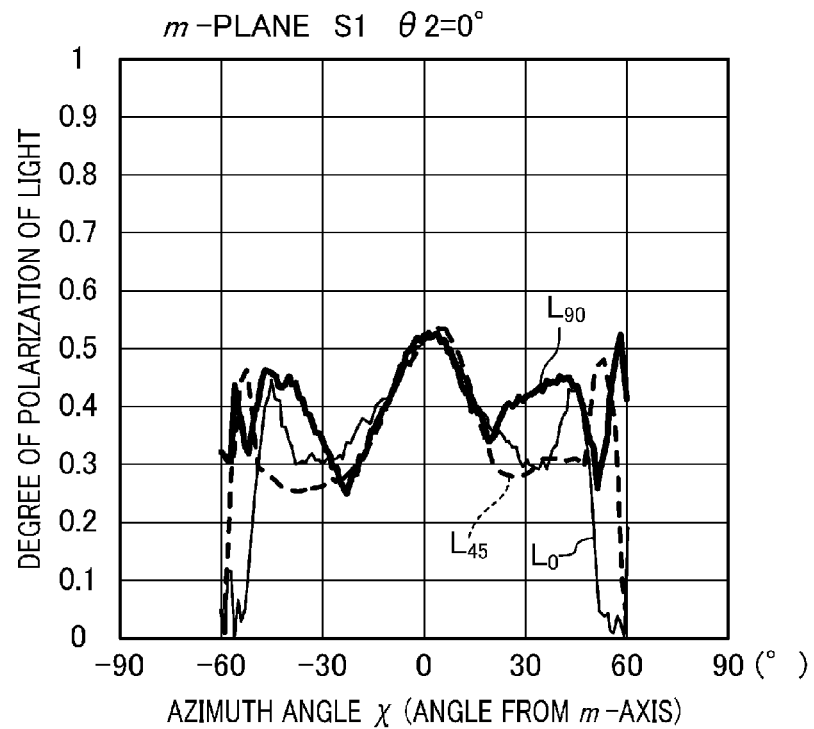
FIG. 25A is a graph illustrating the degree of polarization of light from a semiconductor light-emitting device including a square reflector S1 forming an angle θ2 of 0°.
Figure 25B:
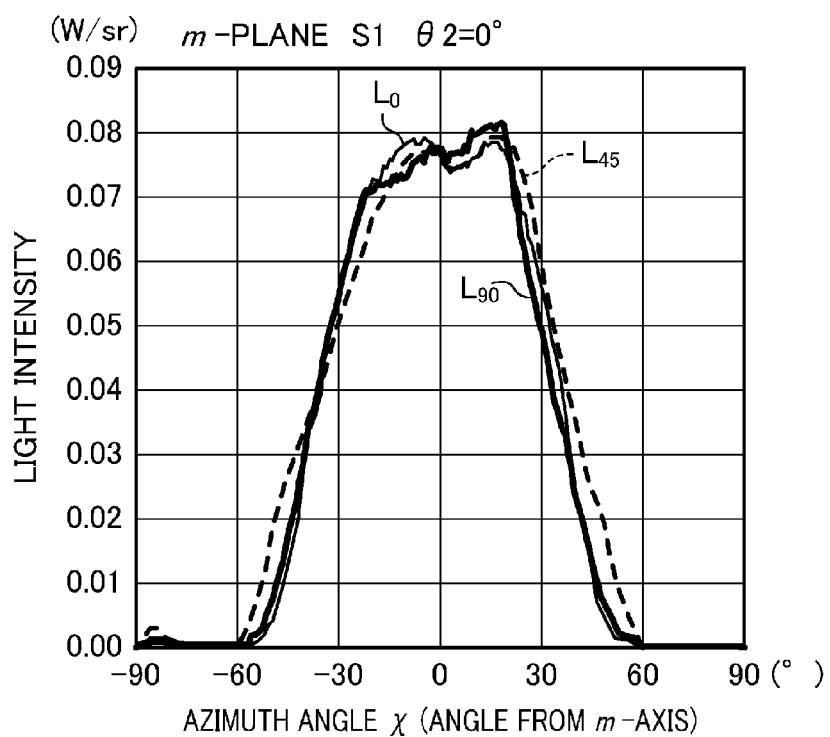
FIG. 25B is a graph illustrating the luminous intensity distribution of the semiconductor light-emitting device including the square reflector S1 in which an angle θ2 is 0°.

FIGS. 25A and 25B illustrate the degree of polarization of light from a semiconductor light-emitting device including a square reflector S1 in which the angle between the polarization direction of polarized light and a side of the square formed by reflective surfaces 125 of the square reflector S1 when viewed in plan is set at 0°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 25A, the degree of polarization of light in the normal line direction ($\chi=0°$) is 0.53, and the degree of polarization of light in the normal line direction is kept higher than when any one of circular reflectors illustrated in Table 1 listed below is used. The luminous intensity distribution illustrated in FIG. 25B shows that the light distribution angle in the plane $L_0$ is 73.0°, and the light distribution angle in the plane $L_{90}$ is 69.1°. Here, the light distribution angle is a full width at half maximum, and corresponds to the range between the angles at which when the light intensity in the normal line direction is 100, the light intensity is 50. The light distribution angle is referred to also as the angle of beam spread or the divergence angle of light.

Figure 26A:
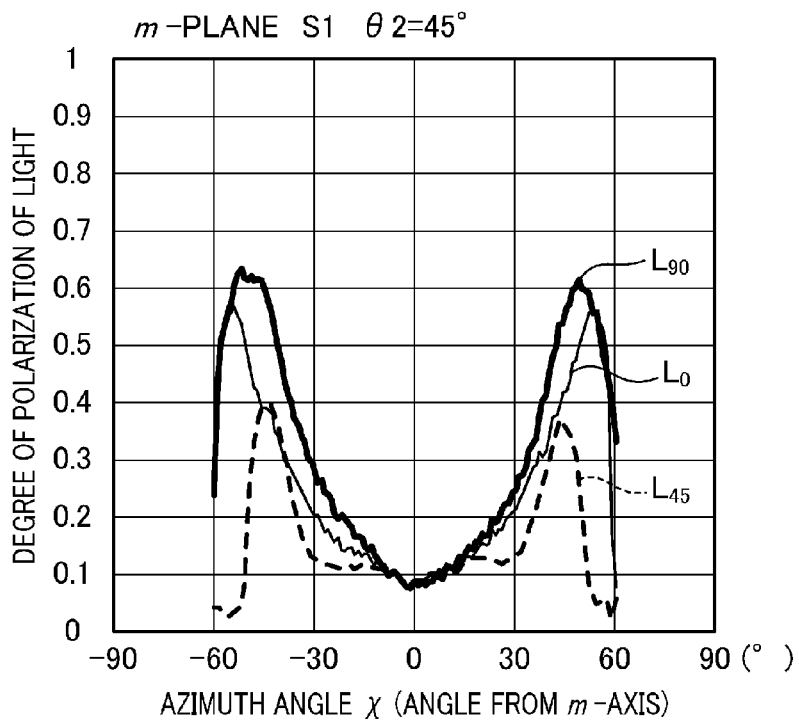
FIG. 26A is a graph illustrating the degree of polarization of light from the semiconductor light-emitting device including the square reflector S1 forming an angle θ2 of 45°.
Figure 26B:
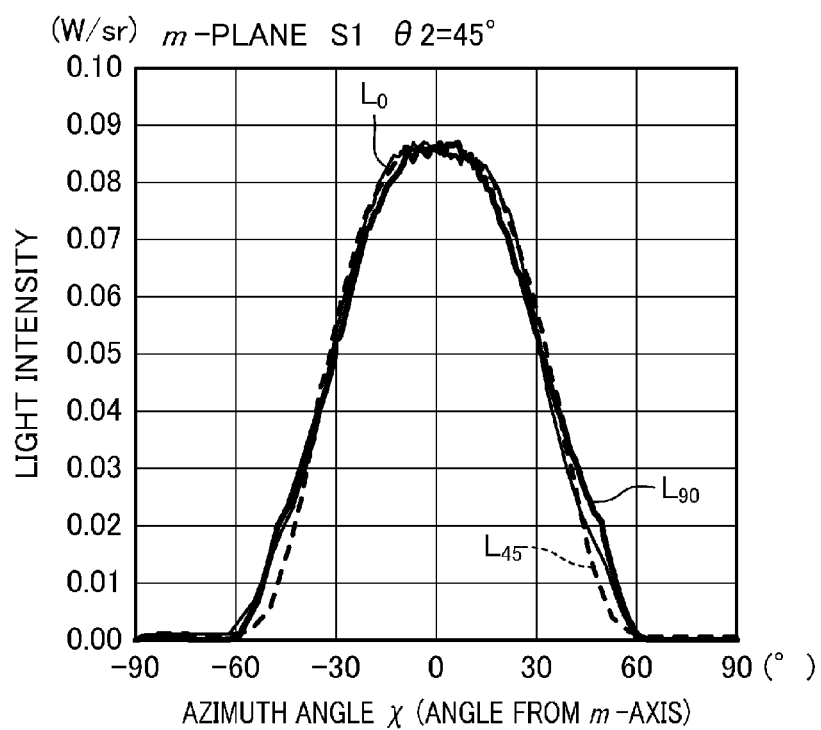
FIG. 26B is a graph illustrating the luminous intensity distribution of the semiconductor light-emitting device including the square reflector S1 forming an angle θ2 of 45°.

FIGS. 26A and 26B illustrate the degree of polarization of light from a semiconductor light-emitting device including a square reflector S1 in which the angle θ2 is set at 45°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 26A, the degree of polarization of light in the normal line direction ($\chi=0°$) is 0.07, which is much lower than when the angle θ2 is 0°. Furthermore, the degree of polarization of light in the normal line direction is lower than when any one of the circular reflectors is used. The luminous intensity distribution illustrated in FIG. 26B shows that the light distribution angle in the plane $L_0$ is 70.6°, and the light distribution angle in the plane $L_{90}$ is 71.4°.

Figure 27:
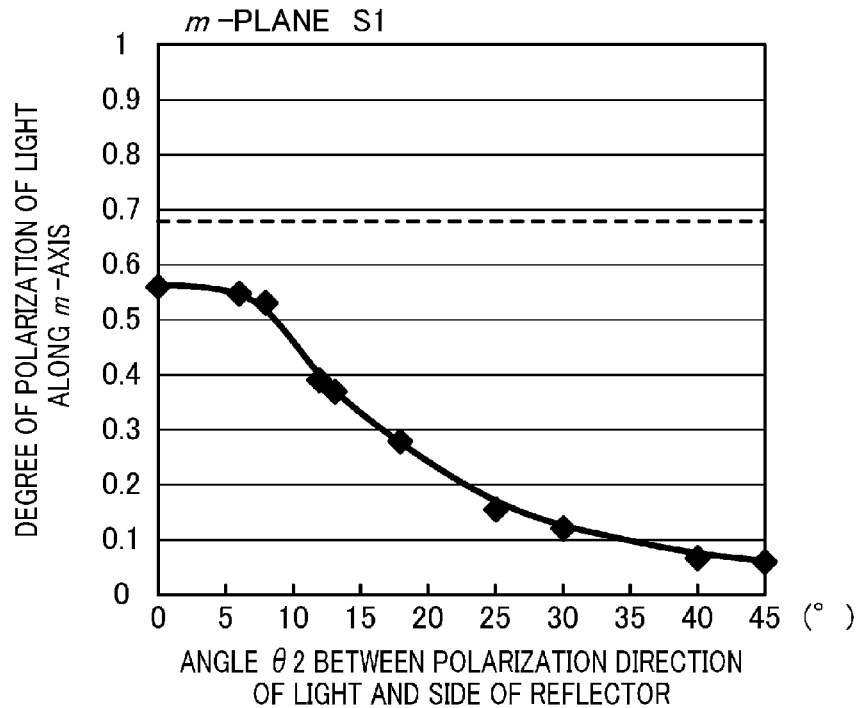
FIG. 27 is a graph illustrating the relationship between the angle θ2 and the degree of polarization of light in the normal line direction according to the first example.

FIG. 27 illustrates the relationship between the angle θ2 and the degree of polarization of light in the normal line direction. The broken line in this figure illustrates 0.68, i.e., the degree of polarization of light from the semiconductor light-emitting device that does not include a reflector according to the first comparative example in the normal line direction. When the angle θ2 is greater than 10°, the degree of polarization of light in the normal line direction sharply decreases.

Figure 28:
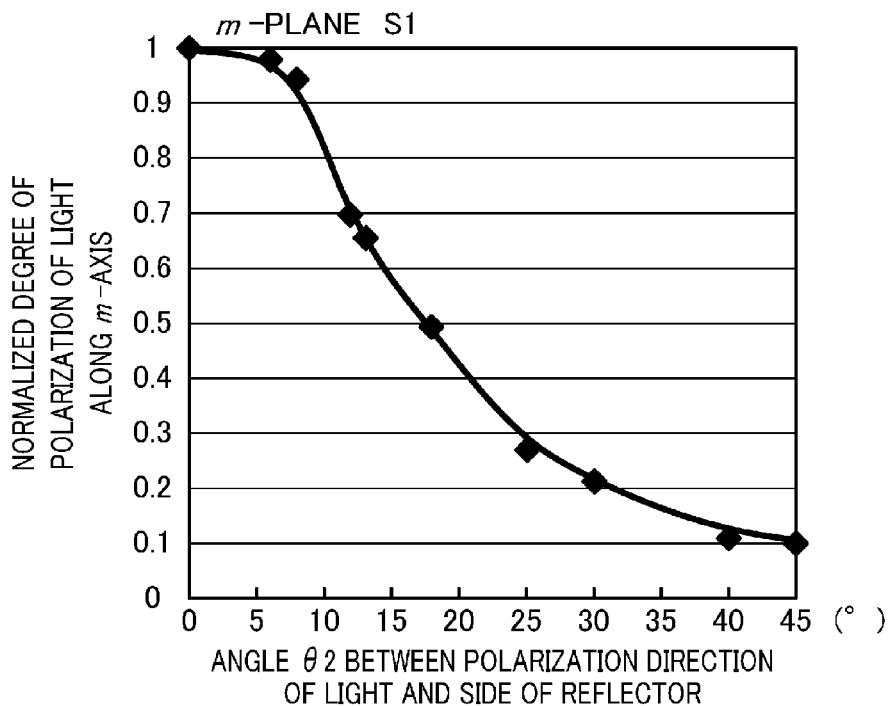
FIG. 28 is a graph illustrating the relationship between the angle θ2 and the normalized degree of polarization of light in the normal line direction according to the first example.

FIG. 28 illustrates the relationship between the angle θ2 and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle θ2 is 0°. FIG. 28 shows that an angle θ2 of not less than 0° and not more than 10° reduces the rate of reduction in the normalized degree of polarization of light to 10% or less.

Second Example

A semiconductor light-emitting device according to a second example will be described hereinafter.

In the second example, a growth surface of an active layer of a semiconductor light-emitting chip 100 is a semipolar (20-2-1) plane. A wafer-level n-type GaN substrate having a (20-2-1) plane as its principal surface was used as a substrate of the semiconductor light-emitting chip 100. In a process of singulating the substrate into semiconductor light-emitting chips 100, grooves having a depth of about several tens of μm from the surface of the wafer were formed in the wafer along the [10-14] direction and the [1-210] direction with laser beams. Thereafter, the wafer was broken into semiconductor light-emitting chips 100 having sides each having a length of 450 μm. Other processes are similar to those in the first example. As such, a semiconductor light-emitting device including an active layer having a growth surface that is a semipolar (20-2-1) plane was fabricated. In this state, no reflector 120 is provided. The measured wavelength of light emitted from the semiconductor light-emitting device at an operating current of 10 mA was 441 nm. The polarization direction of the emitted light is along the [1-210] direction, and the degree of polarization of light measured along the [20-2-1] direction corresponding to the normal line direction was 0.65. Such a semiconductor light-emitting device that does not include a reflector 120 corresponds to a semiconductor light-emitting device according to a second comparative example.

Similarly to the first example, a square reflector S1 was bonded onto a mounting substrate 101 on which the semiconductor light-emitting chip 100 was previously mounted. The azimuth angle χ of light reflected off reflective surfaces 125 of the square reflector S1 was within the range from 42.5° to 78.7°, and the angle θ1 between each of the reflective surfaces 125 and the normal line direction was 28.6°. A plurality of semiconductor light-emitting devices in which the angles θ2 are 0°, 9°, 12°, 15°, 16°, 21°, 30°, 41°, and 45° were fabricated, where θ2 represents an angle between the polarization direction of light from the semiconductor light-emitting chip 100 and a side of the square formed by the reflective surfaces 125 when viewed in plan.

Here, when the reflective surfaces 125 are arranged such that a shape formed by the reflective surfaces 125 when viewed in plan is square, the square has high symmetry when viewed in plan; therefore, the properties of semiconductor light-emitting devices in which the angles θ2 are within the range from 0° to 45° merely needs to be examined.

Figure 29:
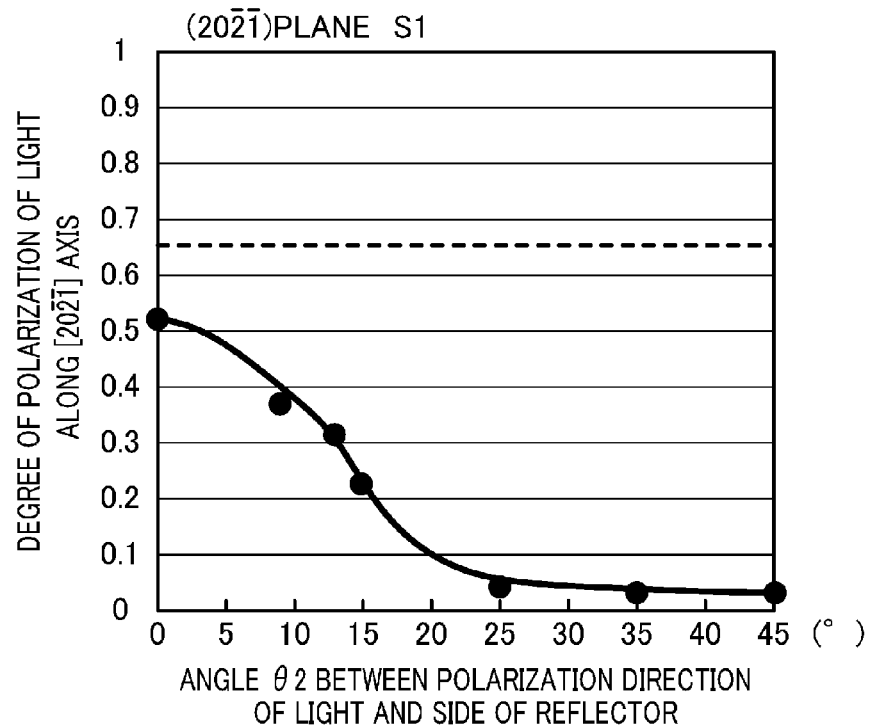
FIG. 29 is a graph illustrating the relationship between the angle θ2 and the degree of polarization of light in the normal line direction according to a second example.

FIG. 29 illustrates the relationship between the angle θ2 and the degree of polarization of light in the normal line direction. The broken line in this figure illustrates 0.65, i.e., the degree of polarization of light in the normal line direction from the semiconductor light-emitting device that does not include a reflector according to the second comparative example.

Figure 30:
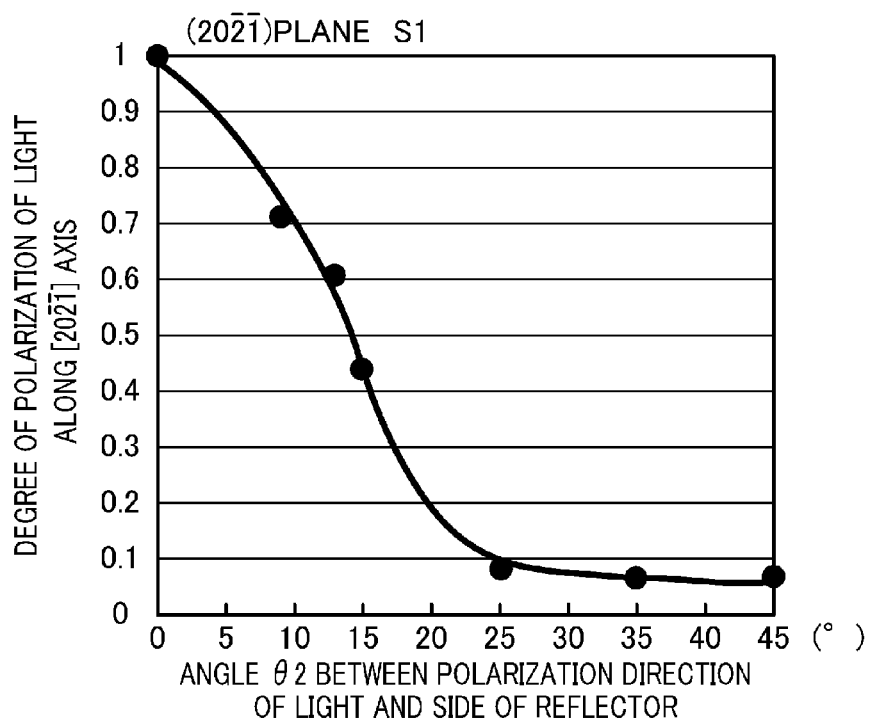
FIG. 30 is a graph illustrating the relationship between the angle θ2 and the normalized degree of polarization of light in the normal line direction according to the second example.

FIG. 30 illustrates the relationship between the angle θ2 and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle θ2 is 0°. A comparison between FIGS. 28 and 30 shows that these graphs have substantially the same shape.

FIG. 30 shows that an angle θ2 of not less than 0° and not more than 10° reduces the rate of reduction in the normalized degree of polarization of light to about 30%.

Third Example

A semiconductor light-emitting device according to a third example will be described hereinafter with reference to FIG.

Figure 31:
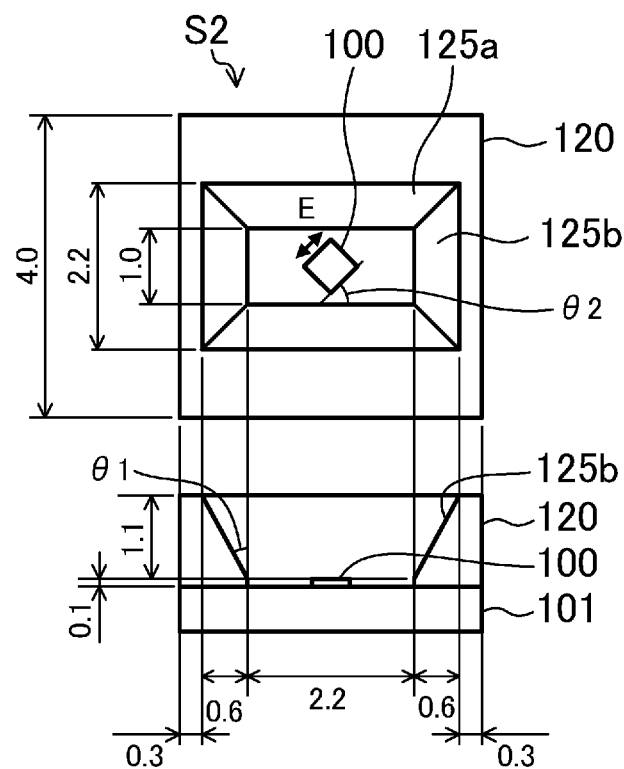
FIG. 31 provides a plan view and a cross-sectional view illustrating a semiconductor light-emitting device including a rectangular reflector S2 according to a third example.

31. As illustrated in FIG. 31, a semiconductor light-emitting chip 100 including an active layer having a growth surface that is an m-plane was fabricated in a manner similar to that in the first example, and was mounted on a mounting substrate 101. In this state, the measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68. Such a semiconductor light-emitting device that does not include a reflector 120 corresponds to the semiconductor light-emitting device according to the first comparative example.

Similarly to the first example, a rectangular reflector S2 made of aluminum and having a plurality of reflective surfaces 125 arranged such that a shape formed by the reflective surfaces 125 when viewed in plan is rectangular was fabricated by press molding. The azimuth angle $\chi$ of light reflected off reflective surfaces 125a corresponding to the long sides of the rectangle among the reflective surfaces 125 of the rectangular reflector S2 is within the range from 42.5° to 78.7°, and the azimuth angle $\chi$ of light reflected off reflective surfaces 125b corresponding to the short sides of the rectangle is within the angle range from 57.1° to 84.8°. The angle $\theta1$ between each of the reflective surfaces 125a and 125b and the normal line direction is 28.6°. The rectangular reflector S2 was bonded onto a mounting substrate 101 on which the semiconductor light-emitting chip 100 was previously mounted. A plurality of semiconductor light-emitting devices in which the angles $\theta2$ are 0°, 10°, 28°, 30°, 34°, 45°, 49°, 52°, 60°, 68°, 79°, 84°, and 90° were fabricated, where $\theta2$ represents an angle between the polarization direction of light from the semiconductor light-emitting chip 100 and each of the long sides of the rectangle formed by the reflective surfaces 125 when viewed in plan.

FIGS. 32A and 32B illustrate the degree of polarization of light from a semiconductor light-emitting device including a rectangular reflector S2 in which the angle $\theta2$ is set at 0°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 32A, the degree of polarization of light in the normal line direction ($\chi=0°$) is 0.50, and the degree of polarization of light in the normal line direction is kept higher than when any one of the circular reflectors is used.

Figure 33A:
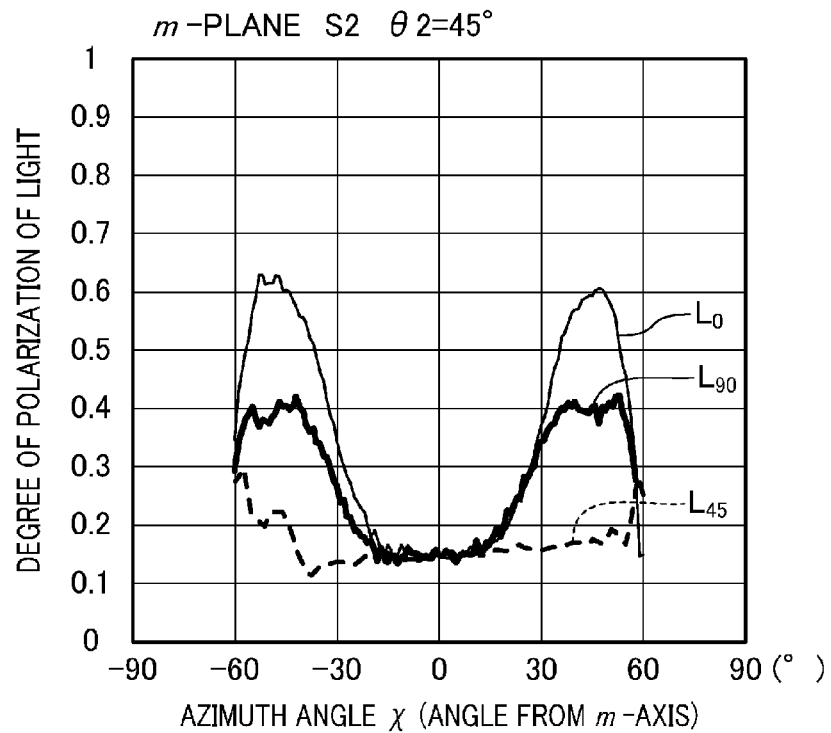
FIG. 33A is a graph illustrating the degree of polarization of light from the semiconductor light-emitting device including the rectangular reflector S2 in which the angle θ2 is 45°.
Figure 33B:
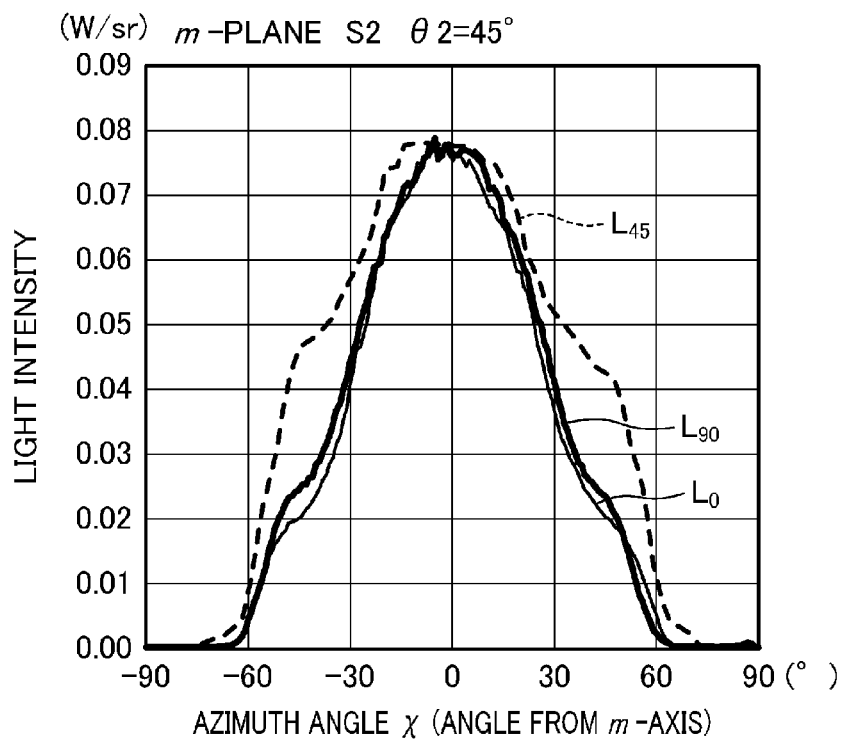
FIG. 33B is a graph illustrating the luminous intensity distribution of the semiconductor light-emitting device including the rectangular reflector S2 in which the angle θ2 is 45°.

FIGS. 33A and 33B illustrate the degree of polarization of light from a semiconductor light-emitting device including a rectangular reflector S2 in which the angle $\theta2$ is set at 45°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 33A, the degree of polarization of light in the normal line direction ($\chi=0°$) is 0.16, which is much lower than when the angle $\theta2$ is 0°. Furthermore, the degree of polarization of light in the normal line direction is lower than when any one of the circular reflectors is used.

Figure 34A:
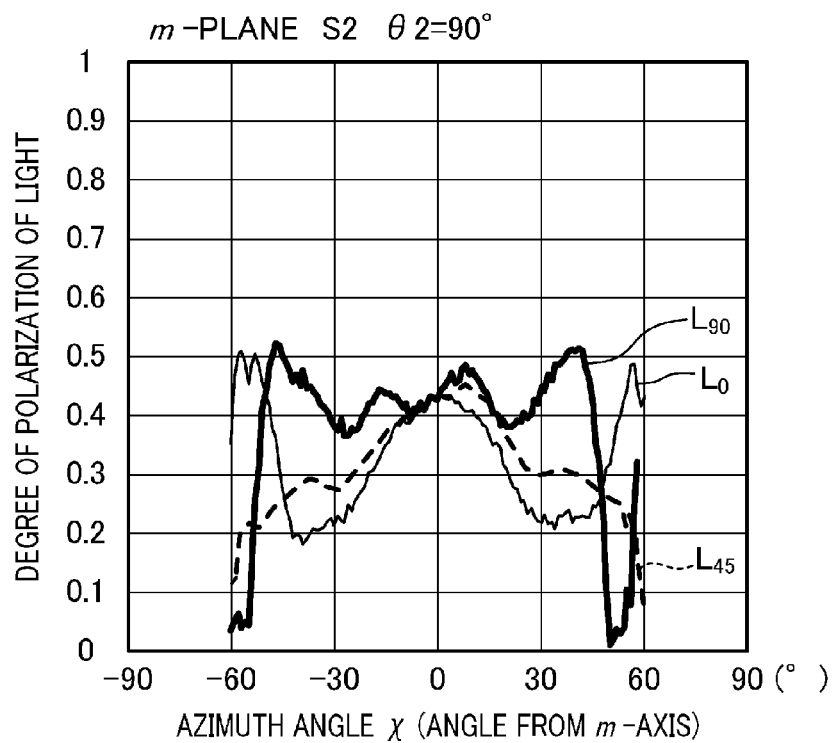
FIG. 34A is a graph illustrating the degree of polarization of light from the semiconductor light-emitting device including the rectangular reflector S2 in which the angle θ2 is 90°.
Figure 34B:
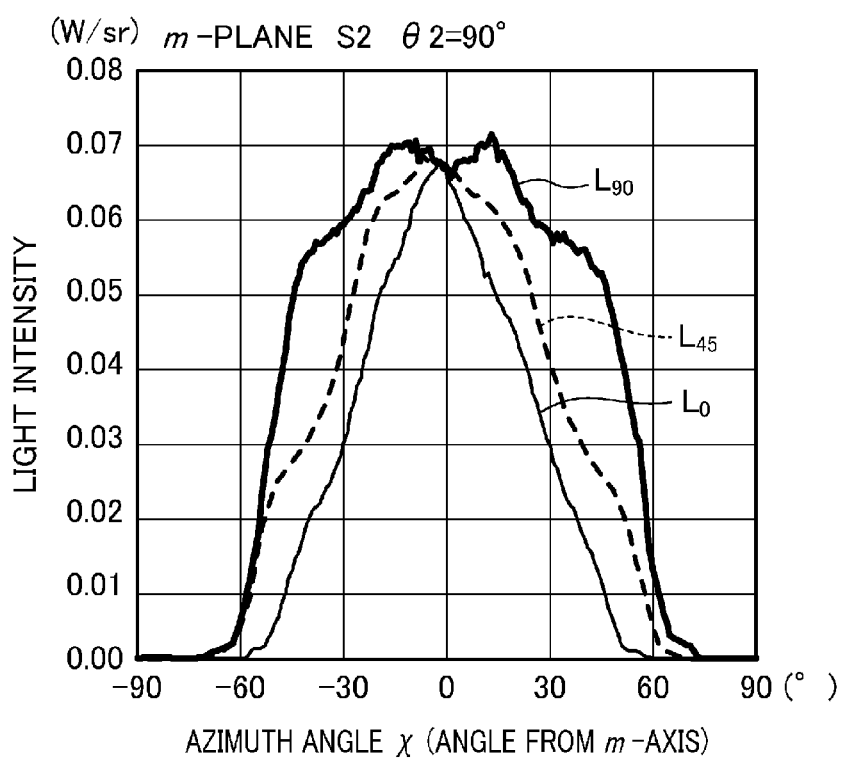
FIG. 34B is a graph illustrating the luminous intensity distribution of the semiconductor light-emitting device including the rectangular reflector S2 in which the angle θ2 is 90°.

FIGS. 34A and 34B illustrate the degree of polarization of light from a semiconductor light-emitting device including a rectangular reflector S2 in which the angle $\theta2$ is set at 90°, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 34A, the degree of polarization of light in the normal line direction ($\chi=0°$) is 0.44, and the degree of polarization of light in the normal line direction is kept higher than when any one of the circular reflectors is used.

Figure 35:
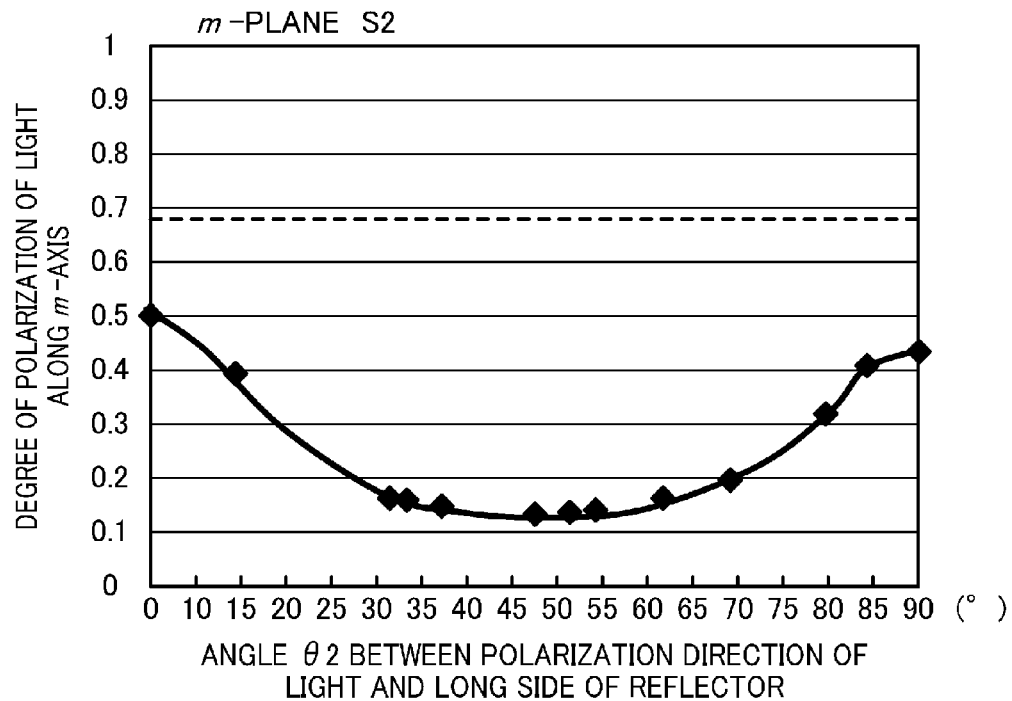
FIG. 35 is a graph illustrating the relationship between the angle θ2 and the degree of polarization of light in the normal line direction according to the third example.

FIG. 35 illustrates the relationship between the angle $\theta2$ and the degree of polarization of light in the normal line direction. The broken line in this figure illustrates 0.68, i.e., the degree of polarization of light in the normal line direction from the semiconductor light-emitting device that does not include a reflector according to the first comparative example. When the angle $\theta2$ is 45°, the degree of polarization of light is lowest. Unlike the square reflector S1 according to the first example, the rectangular reflector S2 has low symmetry when viewed in plan. Thus, the degree of polarization of light varies between when the angle $\theta2$ is 0°, and when the angle $\theta2$ is 90°. When the angle $\theta2$ is 0°, i.e., when the angle between the polarization direction of light from the semiconductor light-emitting chip 100 and the long side of the rectangle formed by the reflective surfaces 125 is 0°, the degree of polarization of light is kept higher than when the angle $\theta2$ is 90°.

Figure 36:
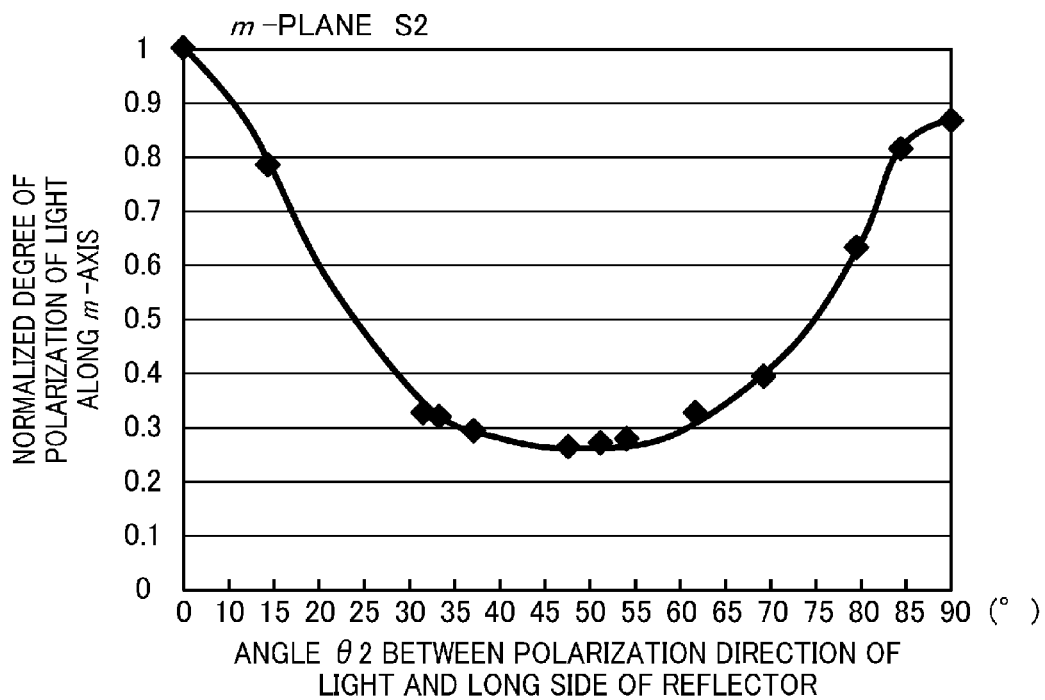
FIG. 36 is a graph illustrating the relationship between the angle θ2 and the normalized degree of polarization of light in the normal line direction according to the third example.

FIG. 36 illustrates the relationship between the angle $\theta2$ and the normalized degree of polarization of light in the normal line direction. Here, the normalized degree of polarization of light is a value obtained by normalizing the degree of polarization of light relative to the degree of polarization of light in the normal line direction from a semiconductor light-emitting device in which the angle $\theta2$ is 0°. FIG. 36 shows that when the angle $\theta2$ is not less than 0° and not more than 10°, the rate of reduction in the normalized degree of polarization of light can be reduced to substantially 20% or less. Furthermore, when the angle $\theta2$ is not less than 85° and not more than 90°, the rate of reduction in the normalized degree of polarization of light can be 20% or less.

Fourth Example

Figure 37:
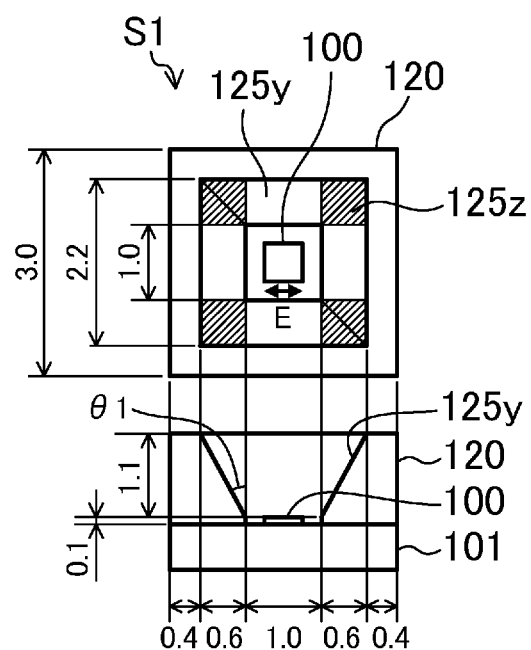
FIG. 37 provides a plan view and a cross-sectional view illustrating a semiconductor light-emitting device according to a fourth example.

A semiconductor light-emitting device according to a fourth example will be described hereinafter with reference to FIG. 37. As illustrated in FIG. 37, a semiconductor light-emitting chip 100 including an active layer having a growth surface that is an m-plane was fabricated in a manner similar to that in the first example, and was mounted on a mounting substrate 101. In this state, the measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68. Such a semiconductor light-emitting device that does not include a reflector 120 corresponds to the semiconductor light-emitting device according to the first comparative example.

Similarly to the first example, a square reflector S1 made of aluminum and having a plurality of reflective surfaces 125 arranged such that a shape formed by the reflective surfaces 125 when viewed in plan is square was fabricated by press molding. Furthermore, corner portions of the square formed by the reflective surfaces 125 when viewed in plan, i.e., portions of reflective surfaces 125z, were coated with a carbon black coating. The reflectivity of each of the reflective surfaces 125z is 5% or less, and is sufficiently lower than that of a typical reflective surface 125y, i.e., 73%.

The square reflector S1 fabricated as above was bonded onto the mounting substrate 101 on which the semiconductor light-emitting chip 100 was previously mounted. In this case, the square reflector S1 is located such that the angle θ2 is 0°, where θ2 represents the angle between the polarization direction of light from the semiconductor light-emitting chip 100 and a side of the square formed by the reflective surfaces 125 when viewed in plan.

Figure 38A:
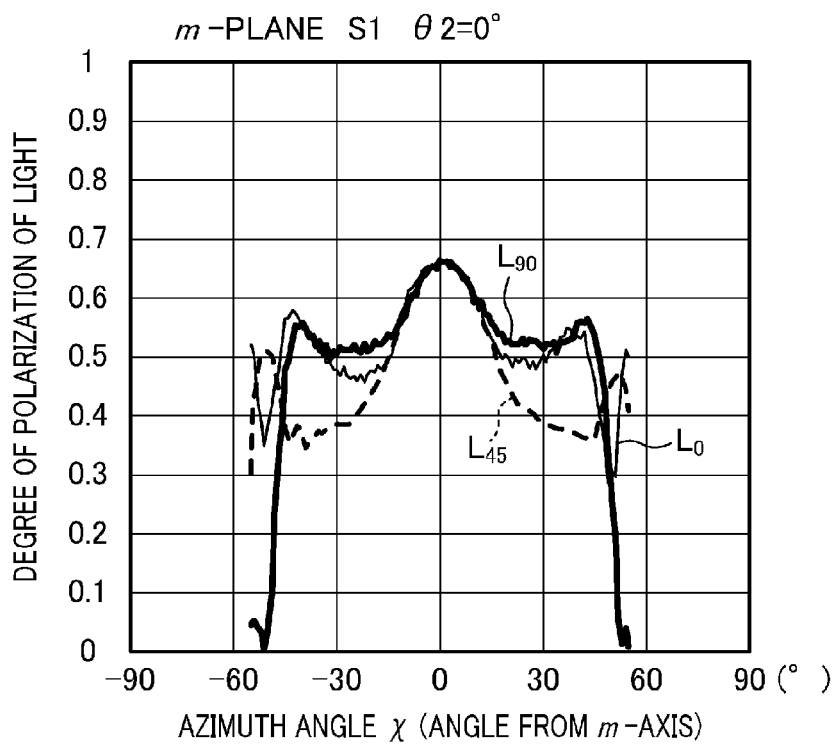
FIG. 38A is a graph illustrating the degree of polarization of light from the semiconductor light-emitting device of the fourth example including a square reflector S1 in which the angle θ2 is 0°.
Figure 38B:
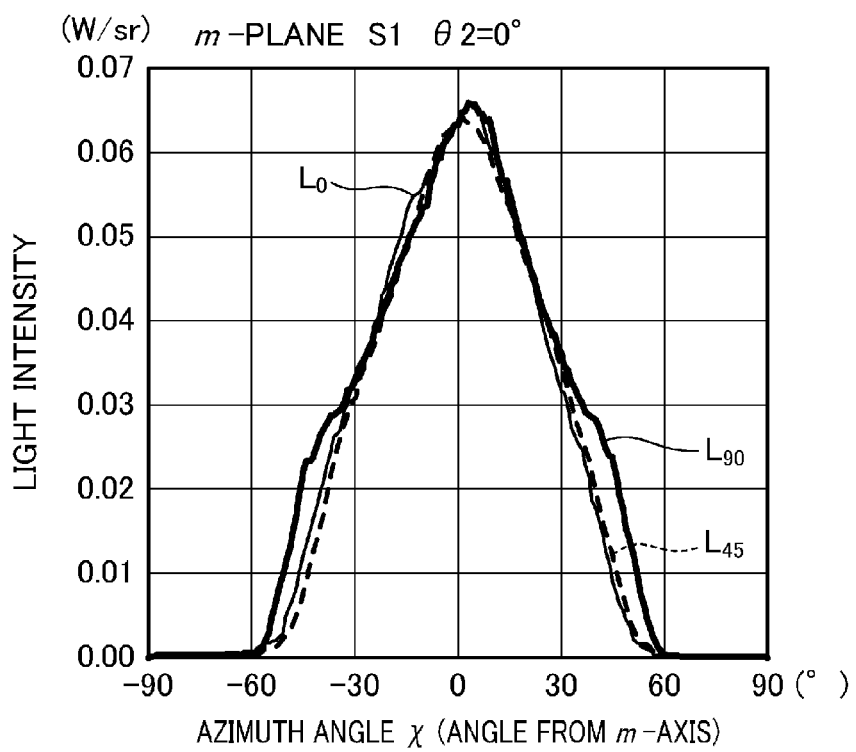
FIG. 38B is a graph illustrating the luminous intensity distribution of the semiconductor light-emitting device of the fourth example including the square reflector S1 in which the angle θ2 is 0°.

FIGS. 38A and 38B illustrate the degree of polarization of light from a semiconductor light-emitting device which includes a square reflector S1 having reflective surfaces arranged such that a shape formed by the reflective surfaces when viewed in plan is square and in which corner portions of the square when viewed in plan have low reflectivity, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 38A, the degree of polarization of light in the normal line direction ($\chi=0°$) is 0.66, and is substantially equal to that in the first comparative example. The degree of polarization of light in the fourth example is higher than that in each of the first and second examples. Specifically, it can be seen that when the degree of polarization of light in the plane $L_{45}$ is low, and the concentration of light with high intensity in the normal line direction is reduced, the degree of polarization of light in the normal line direction can be kept high.

Fifth Example

Figure 39:
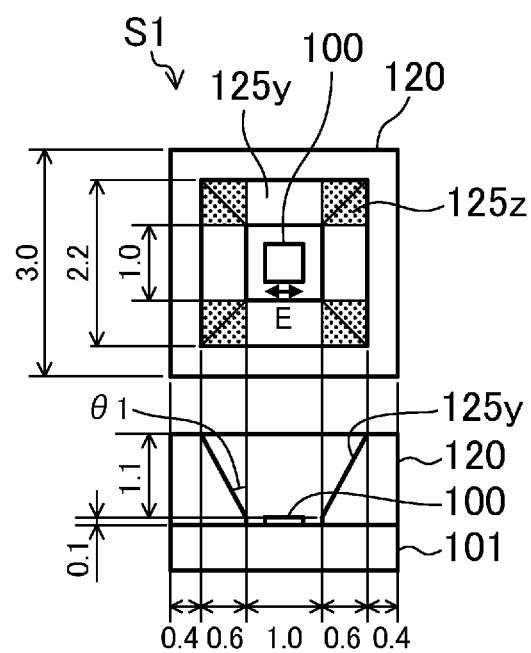
FIG. 39 provides a plan view and a cross-sectional view illustrating a semiconductor light-emitting device according to a fifth example.

A semiconductor light-emitting device according to a fifth example will be described hereinafter with reference to FIG. 39. As illustrated in FIG. 39, a semiconductor light-emitting chip 100 including an active layer having a growth surface that is an m-plane was fabricated in a manner similar to that in the first example, and was mounted on a mounting substrate 101. In this state, the measured wavelength of light emitted from the semiconductor light-emitting device at an operating current of 10 mA was 445 nm. The polarization direction of the emitted light is along the a-axis, and the degree of polarization of light measured along the m-axis corresponding to the normal line direction was 0.68. Such a semiconductor light-emitting device that does not include a reflector 120 corresponds to the semiconductor light-emitting device according to the first comparative example.

Similarly to the first example, a square reflector S1 made of aluminum and having a plurality of reflective surfaces 125 arranged such that a shape formed by the reflective surfaces 125 when viewed in plan is square was fabricated by press molding. Furthermore, corner portions of the square formed by the reflective surfaces 125 when viewed in plan, i.e., portions of reflective surfaces 125z, were coated with a white resin containing silicon oxide. The diffuse reflectivity of each of the portions of the reflective surfaces 125z coated with a white resin is about 90%, and the linear reflectivity thereof is about 3%. As such, the diffuse reflectivity of each of the portions of the reflective surfaces 125z coated with a white resin is sufficiently high.

The square reflector S1 fabricated as above was bonded onto the mounting substrate 101 on which the semiconductor light-emitting chip 100 was previously mounted. In this case, the square reflector S1 is located such that the angle θ2 is 0°, where θ2 represents the angle between the polarization direction of light from the semiconductor light-emitting chip 100 and a side of the square formed by the reflective surfaces 125 when viewed in plan.

Figure 40A:
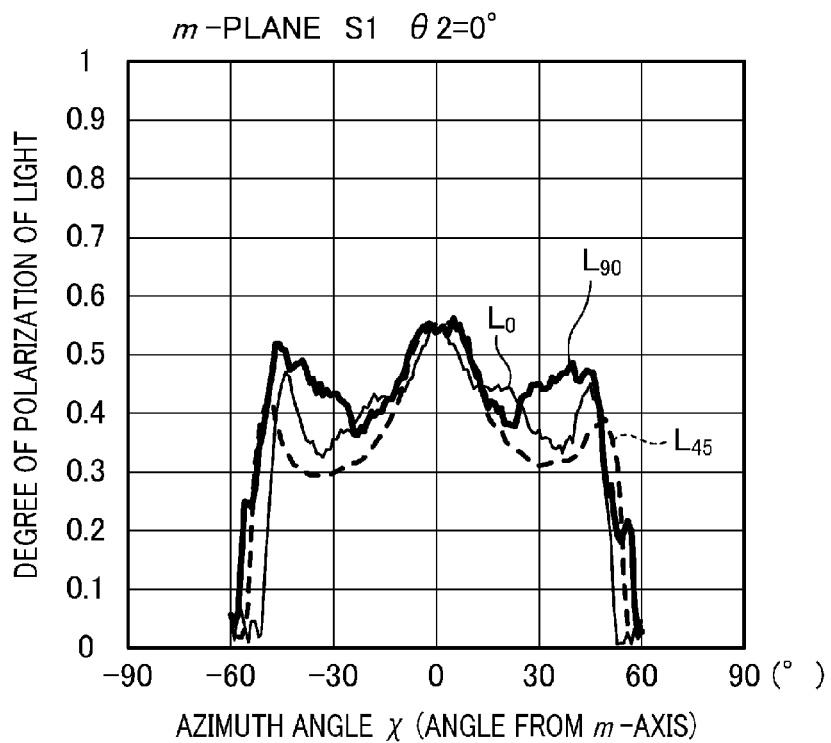
FIG. 40A is a graph illustrating the degree of polarization of light from the semiconductor light-emitting device of the fifth example including the square reflector S1 in which the angle θ2 is 0°.
Figure 40B:
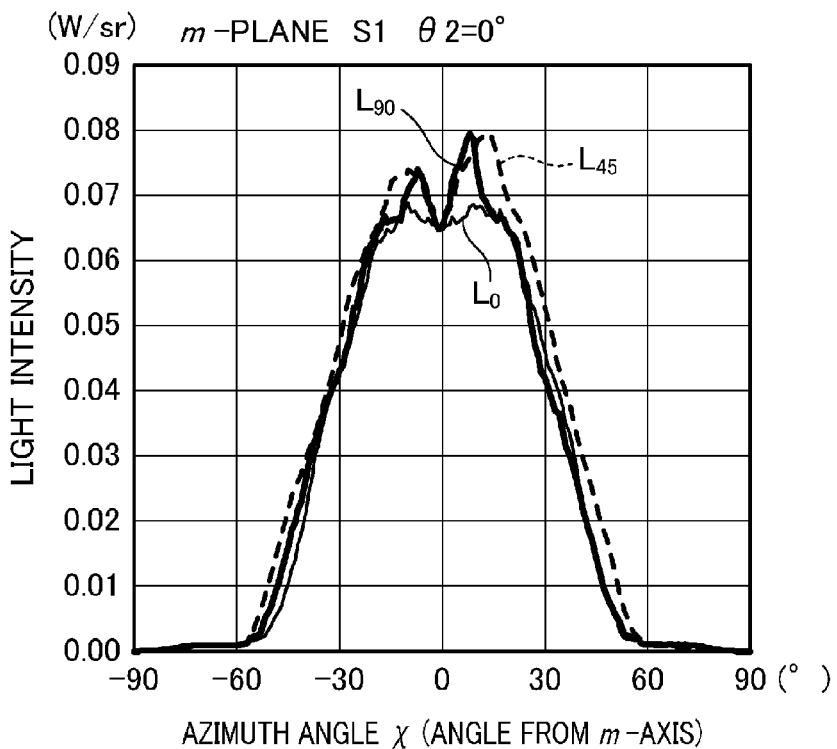
FIG. 40B is a graph illustrating the luminous intensity distribution of the semiconductor light-emitting device of the fifth example including the square reflector S1 in which the angle θ2 is 0°.

FIGS. 40A and 40B illustrate the degree of polarization of light from a semiconductor light-emitting device which includes a square reflector S1 having reflective surfaces arranged such that a shape formed by the reflective surfaces when viewed in plan is square and in which corner portions of the square when viewed in plan have high diffuse reflectivity, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$. As illustrated in FIG. 40A, the degree of polarization of light in the normal line direction ($\chi=0°$) was 0.55, which is greater than the degree of polarization of light in the normal line direction in the first example illustrated in FIG. 25A, i.e., 0.53.

A comparison between FIG. 40B and FIG. 25B of the first example shows that in FIG. 40B, the intensity of light in the plane $L_{45}$ and along the normal line direction is depressed. The reason for this is that light was diffusely reflected off the portions of the reflective surfaces 125z coated with a white resin, and the amount of light concentrated in the normal line direction in the plane $L_{45}$ decreased. Specifically, the concentration of light having a low degree of polarization in the plane $L_{45}$ in the normal line direction was reduced, and consequently, the degree of polarization of light in the normal line direction is higher than that in the first example.

First Comparative Example

A semiconductor light-emitting device according to a first comparative example will be described hereinafter with reference to FIGS. 41A and 41B.

Figure 41A:
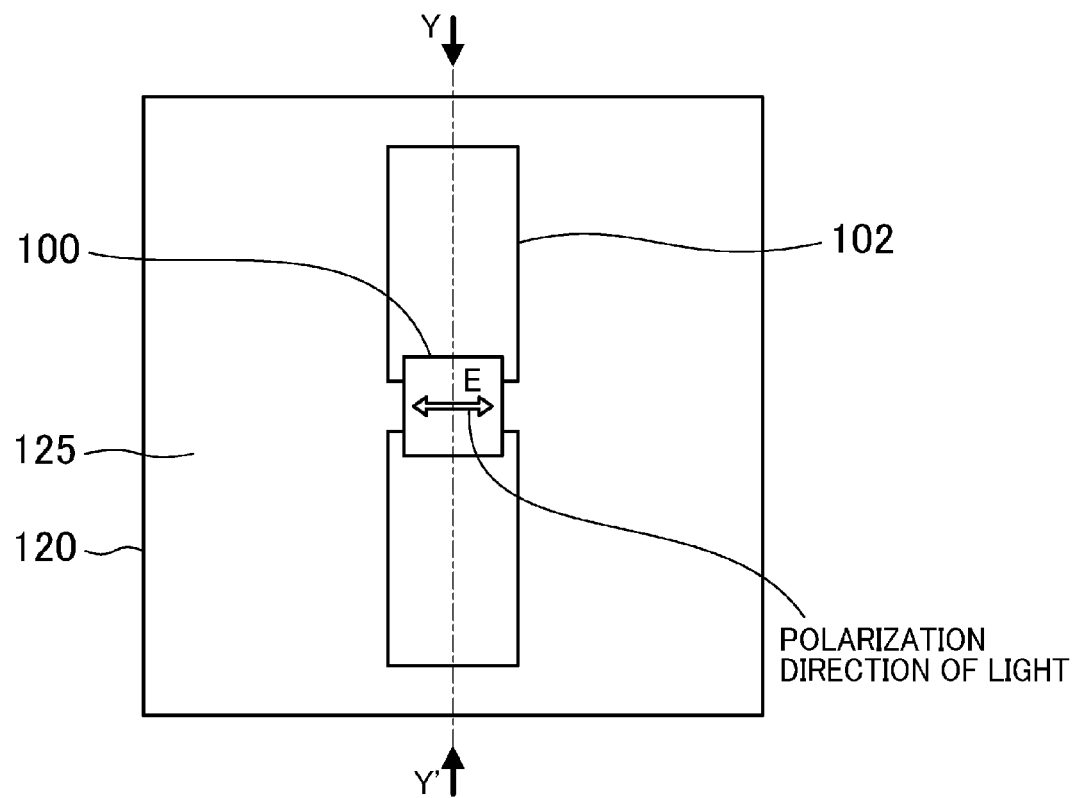
FIG. 41A is a schematic plan view illustrating a semiconductor light-emitting device according to a first comparative example.
Figure 41B:
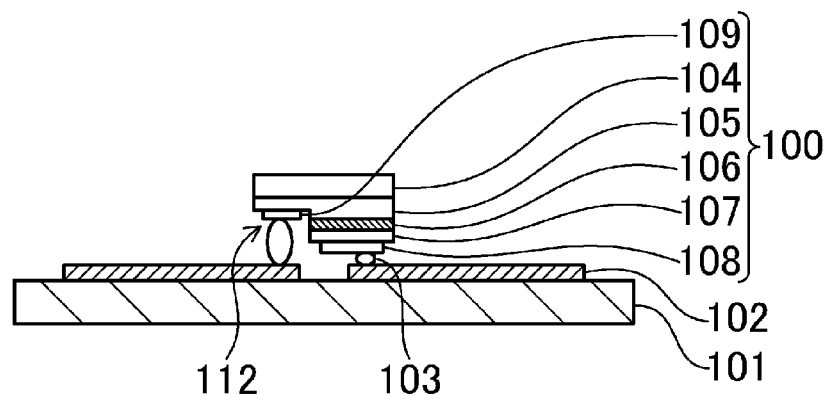
FIG. 41B is a cross-sectional view taken along the line Y-Y' in FIG. 41A.

As illustrated in FIGS. 41A and 41B, the semiconductor light-emitting device according to the first comparative example includes a semiconductor light-emitting chip 100 including an active layer having a growth surface that is an m-plane, and does not include a reflector 120.

A semiconductor light-emitting chip 100 fabricated in a manner similar to that in the first example was mounted on a mounting substrate 101. In this state, the measured wavelength of light emitted from the semiconductor light-emitting device at an operating current of 10 mA was 445 nm. The degree of polarization of light emitted along the normal line direction was 0.68.

Figure 42A:
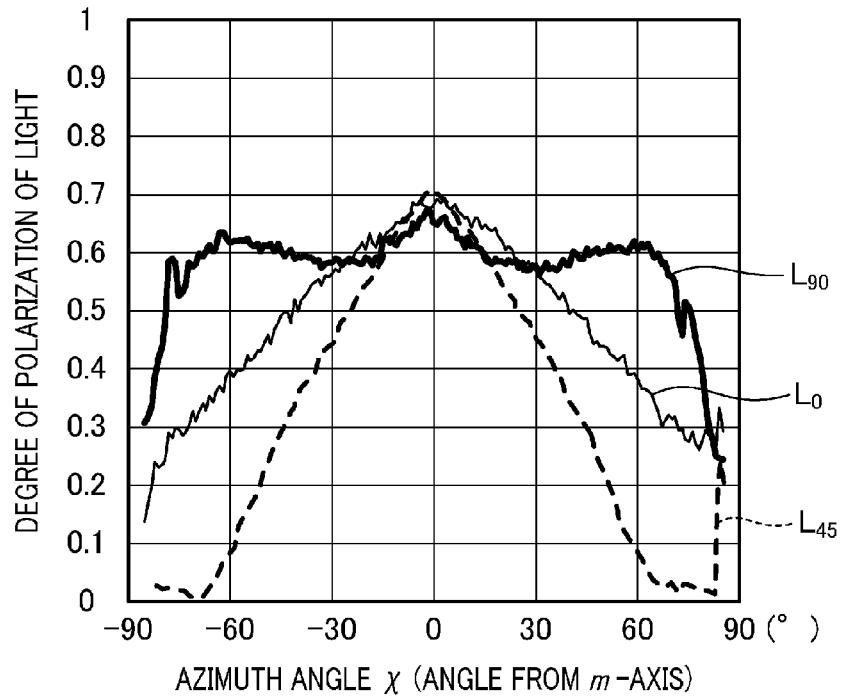
FIG. 42A is a graph illustrating the degree of polarization of light from the semiconductor light-emitting device according to the first comparative example.
Figure 42B:
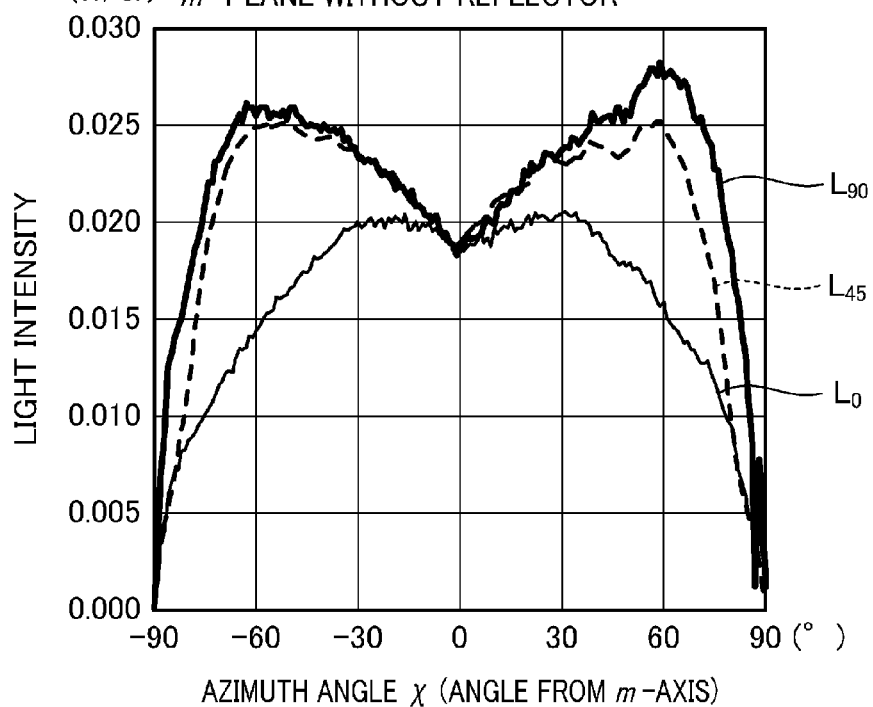
FIG. 42B is a graph illustrating the luminous intensity distribution of the semiconductor light-emitting device according to the first comparative example.

FIGS. 42A and 42B illustrate the degree of polarization of light from the semiconductor light-emitting device according to the first comparative example, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle $\chi$ is within the range from −80° to +80°, the degree of polarization of light in the plane $L_{90}$ is kept high as illustrated in FIG. 42A. When the azimuth angle $\chi$ is 0°, the degree of polarization of light in the plane $L_0$ is highest, and with increasing absolute value of the azimuth angle $\chi$, the degree of polarization of light in the plane $L_0$ gently decreases. The degree of polarization of light in the plane $L_{45}$ is similar to that in the plane $L_0$ in that when the azimuth angle $\chi$ is 0°, the degree of polarization of light is highest; however, with increasing absolute value of the azimuth angle $\chi$, the degree of polarization of light significantly decreases. Specifically, when the azimuth angle $\chi$ is not less than 40°, the degree of polarization of light is reduced to one half or less of the degree of polarization of light obtained when the azimuth angle $\chi$ is 0°. Furthermore, when the azimuth angle $\chi$ is not less than 50°, the degree of polarization of light is reduced to one third or less of the degree of polarization of light obtained when the azimuth angle $\chi$ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 42B, and when the azimuth angle $\chi$ is about ±60°, both of the luminous intensity distributions characteristically have a peak. When the azimuth angle $\chi$ is within the range from 10° to 80°, the light intensity is higher than that obtained when the azimuth angle $\chi$ is equal to 0°, i.e., that in the normal line direction. In the luminous intensity distribution in the plane $L_0$, when the azimuth angle $\chi$ is within the range from −30° to +30°, the light intensity is high, and when the absolute value of the azimuth angle $\chi$ is greater than 30, the light intensity monotonously decreases. As such, the luminous intensity distribution of a semiconductor light-emitting chip emitting polarized light in the plane $L_0$ is different from the luminous intensity distribution in each of the planes $L_{45}$ and $L_{90}$.

Second Comparative Example

A semiconductor light-emitting device according to a second comparative example will be described hereinafter.

The semiconductor light-emitting device according to the second comparative example is a semiconductor light-emitting device that includes an active layer having a growth surface that is a semipolar (20-2-1) plane, and that does not include a reflector.

A semiconductor light-emitting chip 100 including an active layer having a growth surface that is a (20-2-1) plane was fabricated in a manner similar to that in the second example, and was mounted on a mounting substrate 101. This provides a semiconductor light-emitting device having a configuration similar to that of the semiconductor light-emitting device illustrated in FIGS. 41A and 41B. In this state, the measured wavelength of light emitted from the semiconductor light-emitting device at an operating current of 10 mA was 441 nm. The degree of polarization of light emitted along the normal line direction was 0.68.

Figure 43A:
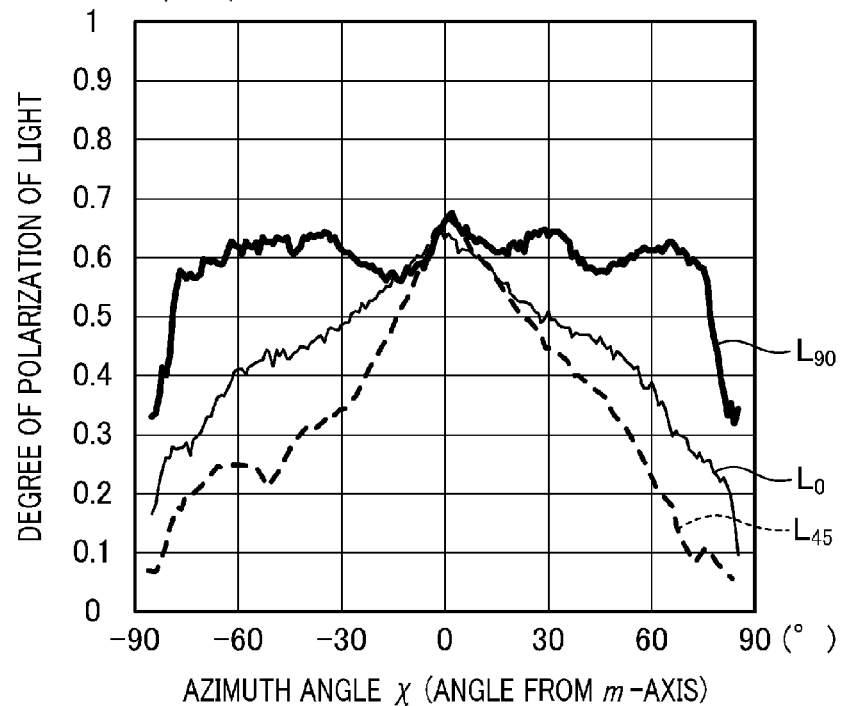
FIG. 43A is a graph illustrating the degree of polarization of light from a semiconductor light-emitting device according to a second comparative example.
Figure 43B:
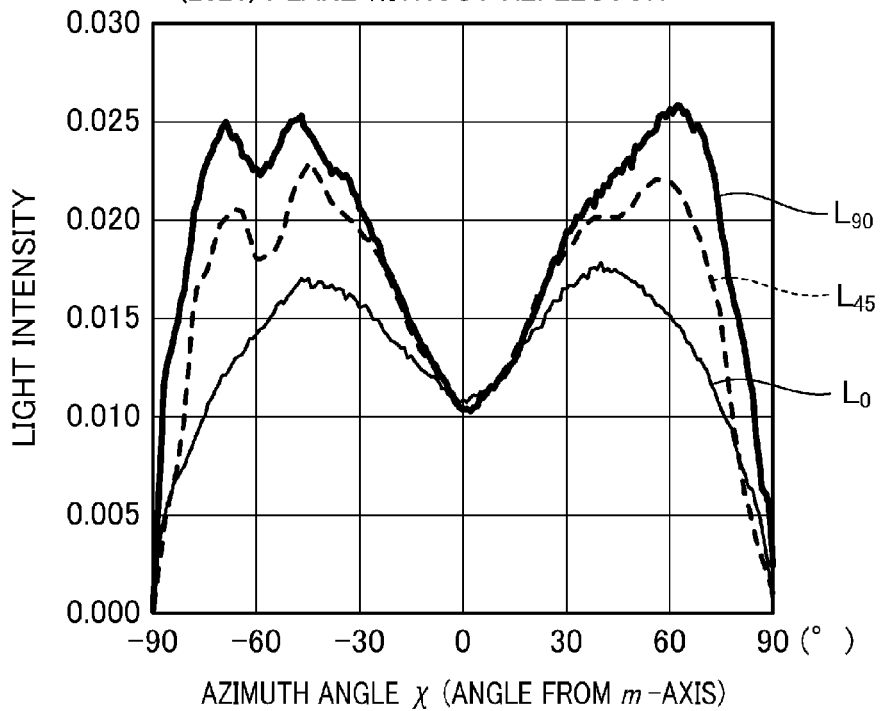
FIG. 43B is a graph illustrating the luminous intensity distribution of the semiconductor light-emitting device according to the second comparative example.
Figure 44A:
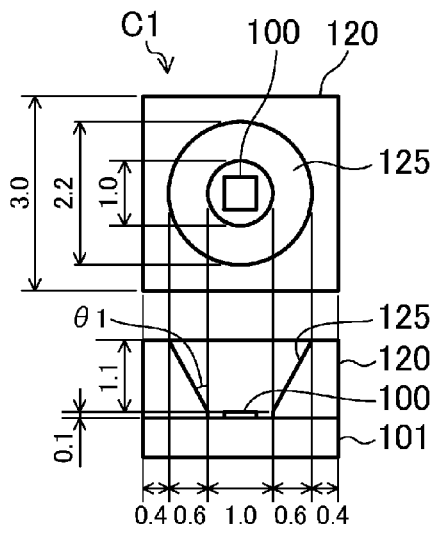
FIGS. 44A-44D provide plan views and cross-sectional views illustrating semiconductor light-emitting devices according to a third comparative example.
Figure 44B:
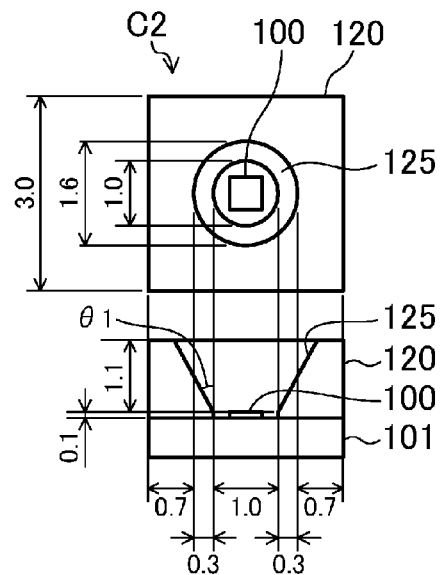
Figure 44C:
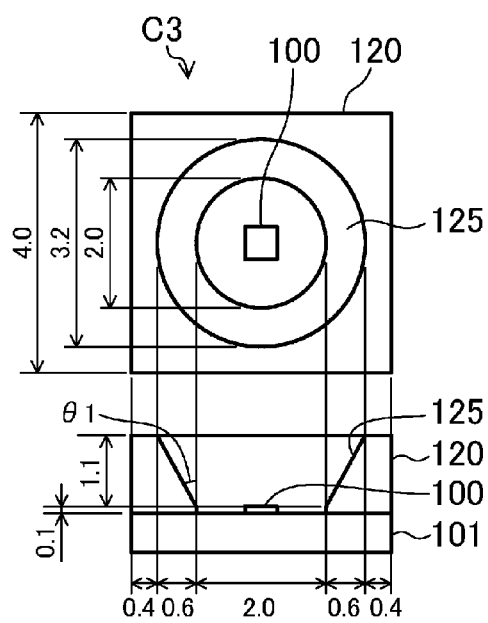
Figure 44D:
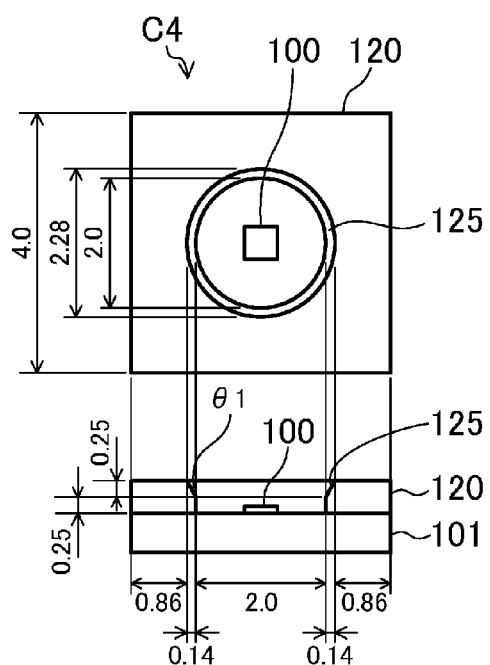

FIGS. 43A and 43B illustrate the degree of polarization of light from the semiconductor light-emitting device according to the second comparative example, and the luminous intensity distribution of the semiconductor light-emitting device, respectively. The thin solid line in each of these figures illustrates the corresponding property in the plane $L_0$, the broken line therein illustrates the corresponding property in the plane $L_{45}$, and the thick solid line therein illustrates the corresponding property in the plane $L_{90}$.

First, also when the azimuth angle $\chi$ is within the range from −80° to +80°, the degree of polarization of light in the plane $L_{90}$ is kept high as illustrated in FIG. 43A. When the azimuth angle $\chi$ is 0°, the degree of polarization of light in the plane $L_0$ is highest, and with increasing absolute value of the azimuth angle $\chi$, the degree of polarization of light in the plane $L_0$ gently decreases. The degree of polarization of light in the plane $L_{45}$ is similar to that in the plane $L_0$ in that when the azimuth angle $\chi$ is 0°, the degree of polarization of light is highest; however, with increasing absolute value of the azimuth angle $\chi$, the degree of polarization of light in the plane $L_{45}$ significantly decreases. Specifically, when the azimuth angle $\chi$ is not less than 40°, the degree of polarization of light is reduced to one half or less of the degree of polarization of light obtained when the azimuth angle $\chi$ is 0°. Furthermore, when the azimuth angle $\chi$ is not less than 60°, the degree of polarization of light is reduced to one third or less of the degree of polarization of light obtained when the azimuth angle $\chi$ is 0°. As such, the degree of polarization of light from a semiconductor light-emitting chip emitting polarized light varies among the planes $L_0$, $L_{45}$, and $L_{90}$.

In contrast, the luminous intensity distribution in the plane $L_{45}$ is similar to that in the plane $L_{90}$ as illustrated in FIG. 43B, and when the azimuth angle $\chi$ is about ±60°, both of the luminous intensity distributions characteristically have a peak. When the azimuth angle $\chi$ is within the range from 10° to 80°, the light intensity is higher than that obtained when the azimuth angle $\chi$ is equal to 0°, i.e., that in the normal line direction. Meanwhile, when the azimuth angle $\chi$ is about ±40°, the luminous intensity distribution in the plane $L_0$ characteristically has a peak. As such, the luminous intensity distribution of a semiconductor light-emitting chip emitting polarized light in the plane $L_0$ is different from the luminous intensity distribution in each of the planes $L_{45}$ and $L_{90}$.

Third Comparative Example

Semiconductor light-emitting devices according to a third comparative example will be described hereinafter with reference to FIGS. 44A-44D. The semiconductor light-emitting devices according to the third comparative example are semiconductor light-emitting devices each including a corresponding one of circular reflectors C1-C4.

Semiconductor light-emitting chips 100 illustrated in FIGS. 44A-44D and including an active layer having a growth surface that is an m-plane were fabricated in a manner similar to that in the first example, and were each mounted on a mounting substrate 101. In this state, the measured wavelength of light emitted from each of the semiconductor light-emitting devices at an operating current of 10 mA was 445 nm. The degree of polarization of light emitted along the normal line direction was 0.68.

Similarly to the first example, four circular reflectors C1, C2, C3, and C4 made of aluminum and each having a circular reflective surface 125 when viewed in plan was fabricated by press molding. The fabricated circular reflectors C1-C4 each have the reflective surface 125 having a height of 100 μm from the top surface of the mounting substrate 101 and forming an angle θ1 of 0°.

As such, the circular reflectors C1-C4 made of aluminum and fabricated separately from the mounting substrate 101 were each adhered to the mounting substrate 101 on which a semiconductor light-emitting chip 100 was mounted. Thus, semiconductor light-emitting devices each including one of the four circular reflectors made of aluminum were fabricated.

Table 1 provides the range of azimuth angles $\chi$ of light reflected off the reflective surface 125 of each of the circular reflectors C1-C4, the angle θ1 between the reflective surface 125 and the normal line direction, the normalized degree of polarization of the light in the normal line direction, and the normalized intensity of the light in the normal line direction. Furthermore, Table 1 also provides the properties of the semiconductor light-emitting device that does not include a reflector 120 according to the first comparative example. Here, the range of azimuth angles $\chi$ of light reflected off the reflective surface 125 of each of the circular reflectors C1-C4 and the angle θ1 between the reflective surface 125 and the normal line direction are designed values for the reflectors 120. The normalized degree of polarization of the light in the normal line direction, and the normalized intensity of the light in the normal line direction are values obtained by measuring the actually fabricated semiconductor light-emitting devices, and are values obtained by normalizing the values relative to the properties of the semiconductor light-emitting device that does not include a reflector 125 according to the first comparative example.

TABLE 1

| Circular Reflector | Range [°] of Azimuth Angles χ of Light Reflected Off Reflective Surface | Angle θ1 [°] Between Reflective Surface And Normal Line Direction | Degree of Polarization of Light In Normal Line Direction | Normalized Degree of Polarization of Light In Normal Line Direction | Normalized Light Intensity In Normal Line Direction |
|---|---|---|---|---|---|
| C1 | 42.5-78.7 | 28.6 | 0.25 | 0.37 | 8.9 |
| C2 | 33.7-78.7 | 15.3 | 0.31 | 0.46 | 6.8 |
| C3 | 53.1-84.3 | 28.6 | 0.18 | 0.26 | 12.5 |
| C4 | 66.3-76.0 | 29.2 | 0.45 | 0.66 | 2.4 |
| Without Reflector (1st compar. ex.) | — | — | 0.68 | 1 | 1 |

The normalized degrees of polarization of light reflected off all of the fabricated circular reflectors C1-C4 in the normal line direction were below 70%. As such, the degrees of polarization of light reflected off the circular reflectors C1-C4 in the plane $L_{45}$ are low, and the light with high intensity tends to be concentrated in the normal line direction; thus, the degree of polarization of light in the normal line direction tends to decrease.

The above-described embodiments and variations can be appropriately combined with another one of the embodiments and its variations. In the above-described embodiments and variations, a specific shape is used as an example shape formed by the reflective surfaces of the reflector when viewed in plan. However, the shape formed by the reflective surfaces of the reflector is not limited to the specific shape. For example, the shape formed by the reflective surfaces when viewed in plan may be another polygonal shape or another shape except polygonal shapes. The shape of each of the reflective surfaces when viewed in plan is also not limited to the shapes illustrated in the embodiments and variations, and may be another polygonal shape or a shape except polygonal shapes.

The semiconductor light-emitting device according to the present disclosure can be utilized for, e.g., lighting devices, automobile headlamps, or spotlights.

What is claimed is:

1. A semiconductor light emitting device comprising:
    a semiconductor light emitting chip having a growth surface that is a nonpolar or semipolar plane, and emitting polarized light; and
    a reflection member having a plurality of reflective surfaces off which the polarized light is reflected, wherein
    at least part of light in a plane $L_{90}$ is reflected off the reflective surfaces in a direction of a normal line to the growth surface, and an amount of light reflected off the reflective surfaces in the plane $L_{90}$ in the direction of the normal line to the growth surface is larger than an amount of light reflected off the reflective surfaces in a plane $L_{45}$ in the direction of the normal line to the growth surface, where the plane $L_{90}$ represents a plane including the normal line to the growth surface of the semiconductor light emitting chip and oriented at an angle of 90° to a polarization direction of the polarized light, and the plane $L_{45}$ represents a plane including the normal line, and oriented at an angle of 45° to the polarization direction of the polarized light,
    the reflective surfaces are arranged such that a shape formed by the reflective surfaces when viewed in plan is square, and
    an angle θ2 is either not less than 0° and not more than 10° or not less than 80° and not more than 90°, where θ2 represents an angle between a polarization direction of the polarized light and a side of the shape formed by the reflective surfaces when viewed in plan.

2. The semiconductor light emitting device of claim 1, wherein
    an arithmetic average inclination angle Δθ1z is larger than an arithmetic average inclination angle Δθ1y, where the arithmetic average inclination angle Δθ1y represents an angle between each of the reflective surfaces and the direction of the normal line to the growth surface of the semiconductor light emitting chip when viewed in cross section take along the plane $L_{90}$, and the arithmetic average inclination angle Δθ1z represents an angle between each of the reflective surfaces and the direction of the normal line to the growth surface of the semiconductor light emitting chip when viewed in cross section take along the plane $L_{45}$.

3. The semiconductor light emitting device of claim 2, wherein
    the arithmetic average inclination angle θ1y is not less than 20° and not more than 40°.

4. The semiconductor light emitting device of claim 2, wherein
    the arithmetic average inclination angle θy1 is not less than 25° and not more than 40°.

5. The semiconductor light emitting device of claim 1, wherein
    corner portions of the shape formed by the reflective surfaces when viewed in plan have a curved surface, and
    a curvature R of the curved surface is less than a length of a shortest side of the semiconductor light emitting chip.

6. The semiconductor light emitting device of claim 1, wherein
    the semiconductor light emitting chip includes at least two semiconductor light emitting chips, and
    the at least two semiconductor light emitting chips are arranged such that directions of polarization of light from the at least two semiconductor light emitting chips are identical.

7. The semiconductor light emitting device of claim 1, wherein the semiconductor light emitting chip includes at least four semiconductor light emitting chips, the at least four semiconductor light emitting chips are arranged in a matrix such that directions of polarization of light from the at least four semiconductor light emitting chips are identical, and D2 is less than D1, where D1 represents a distance between adjacent two of the at least four semiconductor light emitting chips arranged in a direction perpendicular to the directions of polarization of the light, and D2 represents a distance between adjacent two of the at least four semiconductor light emitting chips arranged in a direction parallel to the directions of polarization of the light.

8. The semiconductor light emitting device of claim 1 further comprising:

a wavelength conversion member covering the semiconductor light emitting chip.

9. The semiconductor light emitting device of claim 1, wherein a linear reflectivity of each of the reflective surfaces is higher than a diffuse reflectivity of the reflective surface.

10. The semiconductor light emitting device of claim 1, wherein a surface roughness of each of the reflective surfaces is not more than 100 nm.

11. A semiconductor light emitting device comprising:

a semiconductor light emitting chip having a growth surface that is a nonpolar or semipolar plane, and emitting polarized light; and a reflection member having a plurality of reflective surfaces off which the polarized light is reflected, wherein at least part of light in a plane $L_{90}$ is reflected off the reflective surfaces in a direction of a normal line to the growth surface, and an amount of light reflected off the reflective surfaces in the plane $L_{90}$ in the direction of the normal line to the growth surface is larger than an amount of light reflected off the reflective surfaces in a plane $L_{45}$ in the direction of the normal line to the growth surface, where the plane $L_{90}$ represents a plane including the normal line to the growth surface of the semiconductor light emitting chip and oriented at an angle of 90° to a polarization direction of the polarized light, and the plane $L_{45}$ represents a plane including the normal line, and oriented at an angle of 45° to the polarization direction of the polarized light, the reflective surfaces are arranged such that a shape formed by the reflective surfaces when viewed in plan is rectangular, and an angle $\theta 2$ is either not less than 0° and not more than 10° or not less than 85° and not more than 90°, where $\theta 2$ represents an angle between a polarization direction of the polarized light and a long side of the shape formed by the reflective surfaces when viewed in plan.

12. The semiconductor light emitting device of claim 11, wherein an arithmetic average inclination angle $\Delta\theta 1z$ is larger than an arithmetic average inclination angle $\Delta\theta 1y$, where the arithmetic average inclination angle $\Delta\theta 1y$ represents an angle between each of the reflective surfaces and the direction of the normal line to the growth surface of the semiconductor light emitting chip when viewed in cross section take along the plane $L_{90}$, and the arithmetic average inclination angle $\Delta\theta 1z$ represents an angle between each of the reflective surfaces and the direction of the normal line to the growth surface of the semiconductor light emitting chip when viewed in cross section take along the plane $L_{45}$.

13. The semiconductor light emitting device of claim 12, wherein the arithmetic average inclination angle $\theta 1y$ is not less than 20° and not more than 40°.

14. The semiconductor light emitting device of claim 12, wherein the arithmetic average inclination angle $\theta y1$ is not less than 25° and not more than 40°.

15. The semiconductor light emitting device of claim 11, wherein corner portions of the shape formed by the reflective surfaces when viewed in plan have a curved surface, and a curvature R of the curved surface is less than a length of a shortest side of the semiconductor light emitting chip.

16. The semiconductor light emitting device of claim 11, wherein the semiconductor light emitting chip includes at least two semiconductor light emitting chips, and the at least two semiconductor light emitting chips are arranged such that directions of polarization of light from the at least two semiconductor light emitting chips are identical.

17. The semiconductor light emitting device of claim 11, wherein the semiconductor light emitting chip includes at least four semiconductor light emitting chips, the at least four semiconductor light emitting chips are arranged in a matrix such that directions of polarization of light from the at least four semiconductor light emitting chips are identical, and D2 is less than D1, where D1 represents a distance between adjacent two of the at least four semiconductor light emitting chips arranged in a direction perpendicular to the directions of polarization of the light, and D2 represents a distance between adjacent two of the at least four semiconductor light emitting chips arranged in a direction parallel to the directions of polarization of the light.

18. The semiconductor light emitting device of claim 11 further comprising:

a wavelength conversion member covering the semiconductor light emitting chip.

19. The semiconductor light emitting device of claim 11, wherein a linear reflectivity of each of the reflective surfaces is higher than a diffuse reflectivity of the reflective surface.

20. The semiconductor light emitting device of claim 11, wherein a surface roughness of each of the reflective surfaces is not more than 100 nm.

* * * * *